(12) United States Patent
Mukherjee et al.

(10) Patent No.: US 11,769,790 B2
(45) Date of Patent: Sep. 26, 2023

(54) RAPID THERMAL ANNEALING (RTA) METHODOLOGIES FOR INTEGRATION OF PEROVSKITE-MATERIAL BASED TRENCH CAPACITORS

(71) Applicant: Kepler Computing Inc., San Francisco, CA (US)

(72) Inventors: Niloy Mukherjee, San Ramon, CA (US); Somilkumar J. Rathi, San Jose, CA (US); Jason Y. Wu, Albany, CA (US); Pratyush Pandey, Kensington, CA (US); Zeying Ren, Albany, CA (US); Fnu Atiquzzaman, Orinda, CA (US); Gabriel Antonio Paulius Velarde, San Leandro, CA (US); Noriyuki Sato, Hillsboro, OR (US); Mauricio Manfrini, Heverlee (BE); Tanay Gosavi, Portland, OR (US); Rajeev Kumar Dokania, Beaverton, OR (US); Amrita Mathuriya, Portland, OR (US); Ramamoorthy Ramesh, Moraga, CA (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 0 days.

(21) Appl. No.: 17/649,665

(22) Filed: Feb. 1, 2022

(65) Prior Publication Data

US 2023/0246063 A1 Aug. 3, 2023

Related U.S. Application Data

(63) Continuation of application No. 17/649,534, filed on Jan. 31, 2022.

(51) Int. Cl.
*H01L 23/522* (2006.01)
*H01L 23/532* (2006.01)
(Continued)

(52) U.S. Cl.
CPC ............ *H01L 28/57* (2013.01); *H01L 21/324* (2013.01); *H01L 21/76832* (2013.01);
(Continued)

(58) Field of Classification Search
CPC ......... H01L 28/55; H01L 28/60; H01L 28/65; H01L 28/40; H01L 28/75; H01L 28/57;
(Continued)

(56) References Cited

U.S. PATENT DOCUMENTS

| 5,796,079 A | 8/1998 | Kim et al. |
| 2003/0021079 A1* | 1/2003 | Natori ................. H10B 53/00 |
| | | 257/E21.664 |

(Continued)

OTHER PUBLICATIONS

Li et al., "Effect of Annealing on Ferroelectric Properties of Nanometre baTiO3 Ceramics Prepared by High Pressure Sintering Method," Chins. Phys. Lett. Vol. 24, No. 1 (2007), pp. 244 247.
(Continued)

*Primary Examiner* — Omar F Mojaddedi
(74) *Attorney, Agent, or Firm* — MUGHAL GAUDRY & FRANKLIN PC

(57) ABSTRACT

A memory device includes a first electrode comprising a first conductive nonlinear polar material, where the first conductive nonlinear polar material comprises a first average grain length. The memory device further includes a dielectric layer comprising a perovskite material on the first electrode, where the perovskite material includes a second average grain length. A second electrode comprising a second conductive nonlinear polar material is on the dielectric layer, where the second conductive nonlinear polar material
(Continued)

includes a third grain average length that is less than or equal to the first average grain length or the second average grain length.

21 Claims, 28 Drawing Sheets

(51) Int. Cl.
| | |
|---|---|
| *H01L 23/535* | (2006.01) |
| *H01L 23/538* | (2006.01) |
| *H01L 49/02* | (2006.01) |
| *H01L 21/324* | (2006.01) |
| *H01L 21/768* | (2006.01) |
| *H10B 53/30* | (2023.01) |
| *H10N 70/00* | (2023.01) |

(52) U.S. Cl.
CPC .............. *H01L 28/65* (2013.01); *H01L 28/75* (2013.01); *H10B 53/30* (2023.02); *H10N 70/8836* (2023.02)

(58) Field of Classification Search
CPC ........... H01L 23/5226; H01L 23/53209; H01L 23/53228; H01L 23/53242; H01L 23/53257; H01L 23/535; H01L 23/5381; H01L 23/5386; H10N 70/8836
See application file for complete search history.

(56) References Cited

U.S. PATENT DOCUMENTS

| | | | |
|---|---|---|---|
| 2010/0176427 | A1 | 7/2010 | Celii |
| 2010/0320518 | A1* | 12/2010 | Ozaki ................. H10B 53/40 257/295 |
| 2015/0221658 | A1 | 8/2015 | Wang |
| 2015/0221659 | A1 | 8/2015 | Wang |
| 2017/0162250 | A1* | 6/2017 | Slesazeck ............. H01L 28/40 |
| 2019/0378755 | A1* | 12/2019 | Murray ............ H01L 23/53238 |
| 2020/0210261 | A1 | 7/2020 | Reddy |
| 2021/0305398 | A1 | 9/2021 | Chang et al. |
| 2021/0408224 | A1* | 12/2021 | Oguz ..................... H01L 28/75 |

OTHER PUBLICATIONS

Juan et al., "Electrical Characterization of Metal-Ferroelectric (Mn-substituted BiFeO3)-lnsulator (HfO2)-Semiconductor Capacitors for Nonvolatile Memory Applications," Microelectronic Engineering 86, 2009. pp. 1845-1848.

Khanal et al. "Grain-Size Dependence of Piezoelectric Properties in Thermally Annealed BaTiO3 Ceramics," Journal of the Ceramic Society of Japan 126 (7) pp. 536-541 2018. http://doi.org/10.2109/jcersj2.17260.

Kossar et al., "Ferroelectric Polarization Induced Memristive Behavior in Bismugh Ferrite (BiFeO3) Based Memory Devices," Superlatticesand Microstructures 148 (2020) 106726. 14 pages.

Lin et al., "Metal-Ferroelectric (BiFeO3)-lnsulator(Y2O3)-Semiconductor Capacitors and Field Effect Transistors for nonvolatile Memory Applications," Appl. Phys. Lett. 64, 142908 (2009); https://doi.org/10.1063/1.3114403.

Machado et al., "Band Gap Tuning of Solution-Processed Ferroelectric Perovskite BiFe1—XCoxO3 Thin Films," Chem. Mater. 2019, 31. pp. 947-954.

McGovern et al., "Grain Size Influences Activation Energy and Migration Pathways in MAPbBr3 Perovskite Solar Dells," Journal Phys. Chem. Kett. 2021, 12. pp. 2423-2428.

Pan et al.,"Giant Energy Density and High Efficiency Achieved in Bismuth Ferrite-Based Film Capacitors Via Domain Engineering," Nature Communications 2018, 9:1813, 8 pages, DOI: 10.1038/s41467-018-04189-6.

Pandey, "Memory Improvement in Lead-Free BiFeO3 Ferroelectric with High-K Al2)e Buffer Layer for Non-Volatile Memory Applications," Applied Physics A (2018) 124:507, 8 pages, https://doi.org/10.1007/s00339-018-1926-5.

Pham "Atomic Layer Deposition Enabled Synthesis of multiferroic Nanostructures," 2015 Thesis/dissertation, University of California, Los Angeles. 238 pages.

Raj et al., "Effect of Annealing Time in the Low-Temperature Growth of BFO Thin Films Spin Coated on Glass Substrates," Journal of Materials Science: materials in Electronics, Oct. 2013, 10 pages, DOI: 10.1007/510854-013-1374-0.

Robertson et al., "High-K Materials and metal Gates for CMOS Applications," Materials Science and Engineering: R: Reports, vol. 88, Feb. 2015, pp. 1-41.

Wang et al., "The Microstructure, Electric, Optical and Photovoltaic Properties of BiFeO3 Thin Films Prepared by Low Temperature Sol-Gel Method," Materials (Basel). May 3, 2019;12(9):1444. 10 pages, doi: 10.3390/ma12091444.

International Search Report & Written Opinion dated May 2, 2023 for PCT Patent Application No. PCT/US22/82583.

* cited by examiner

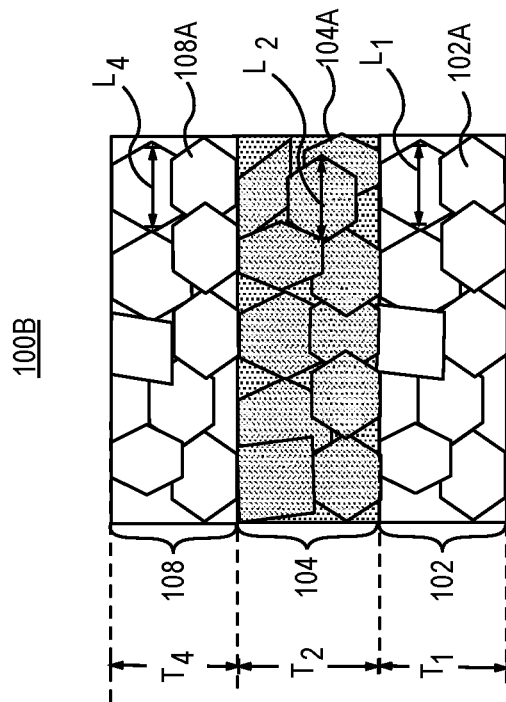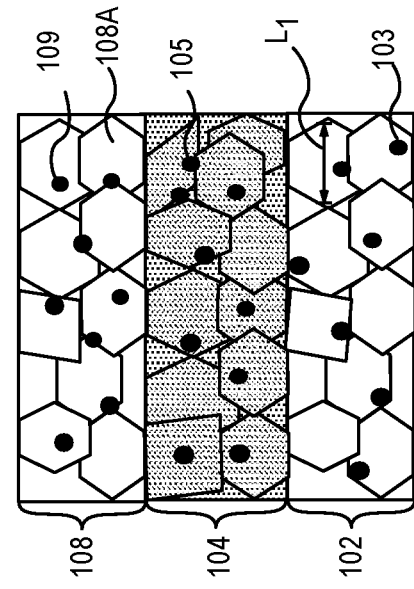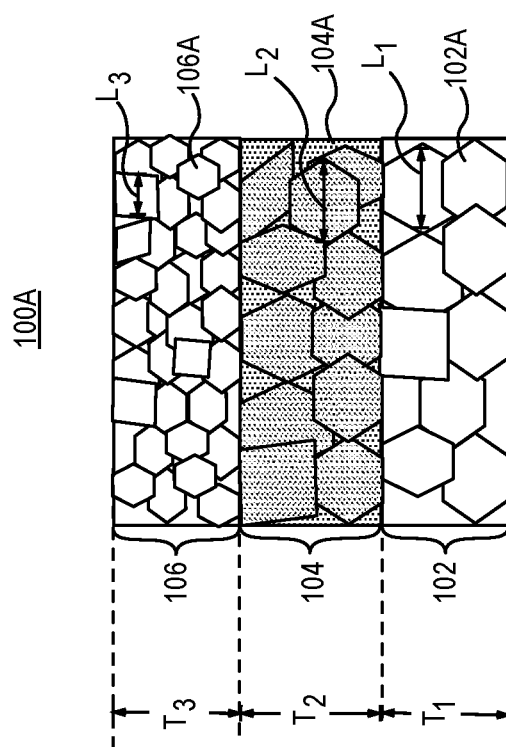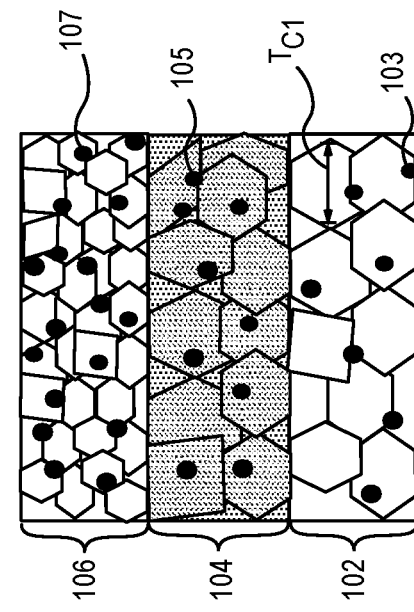

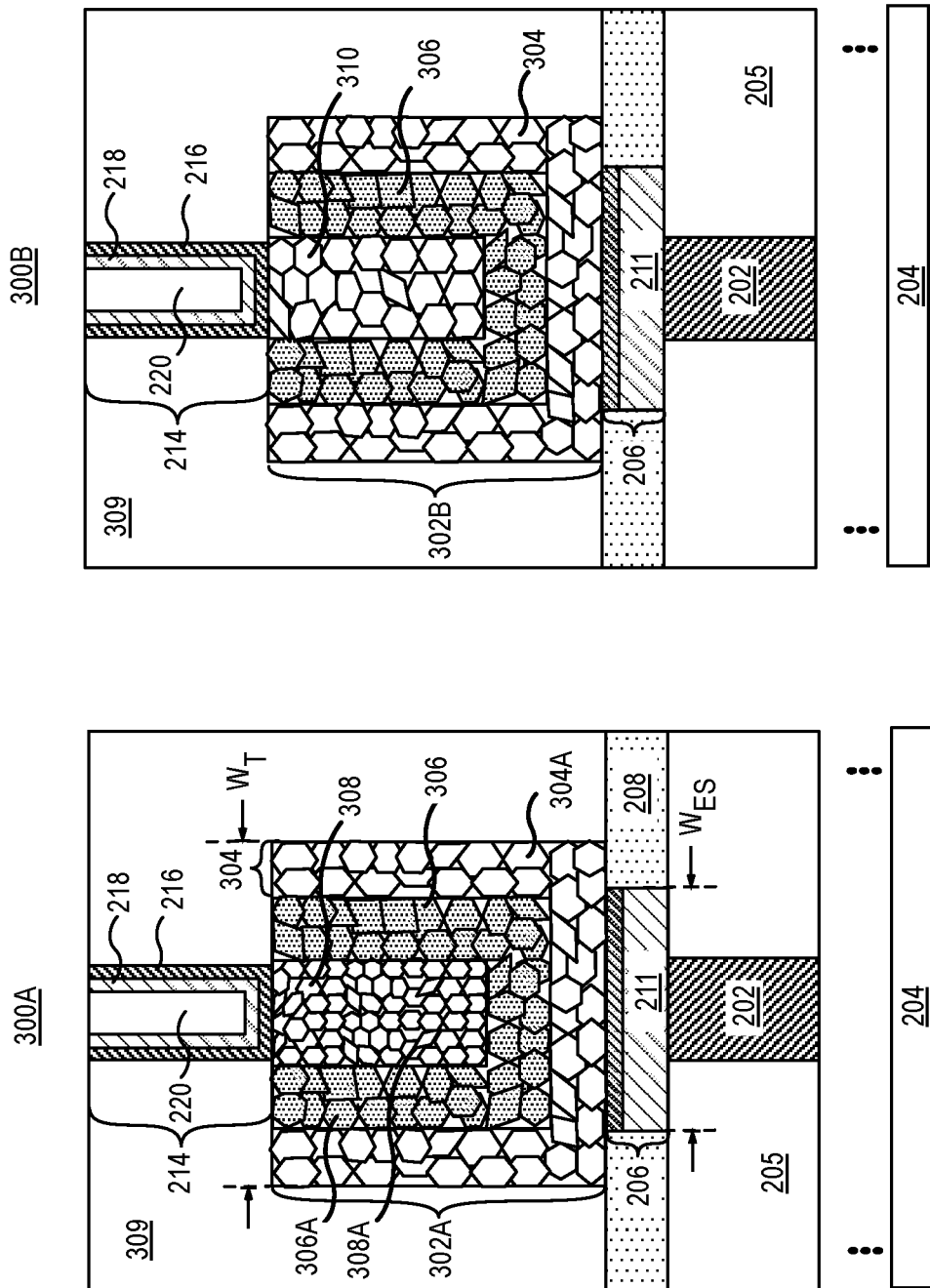

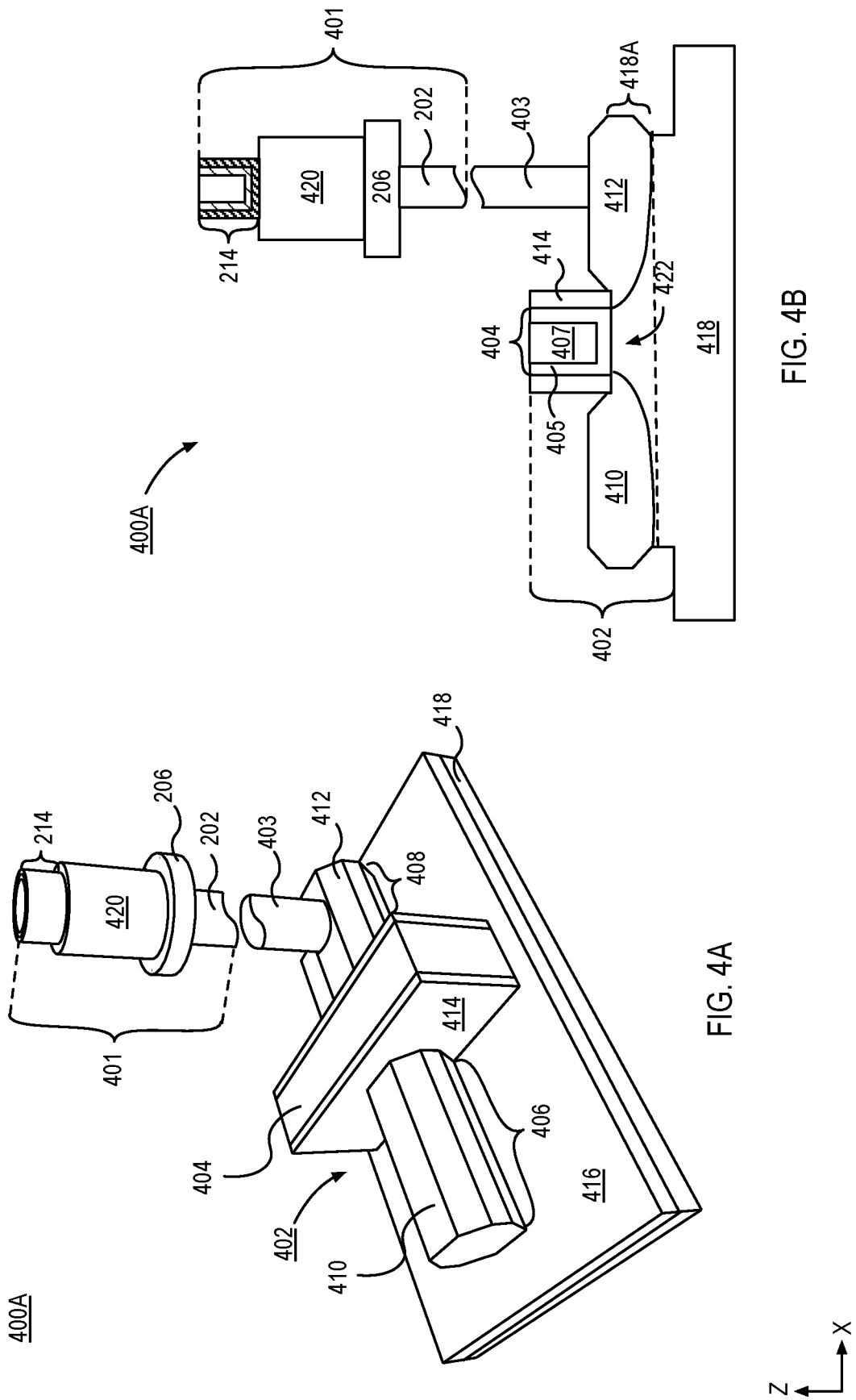

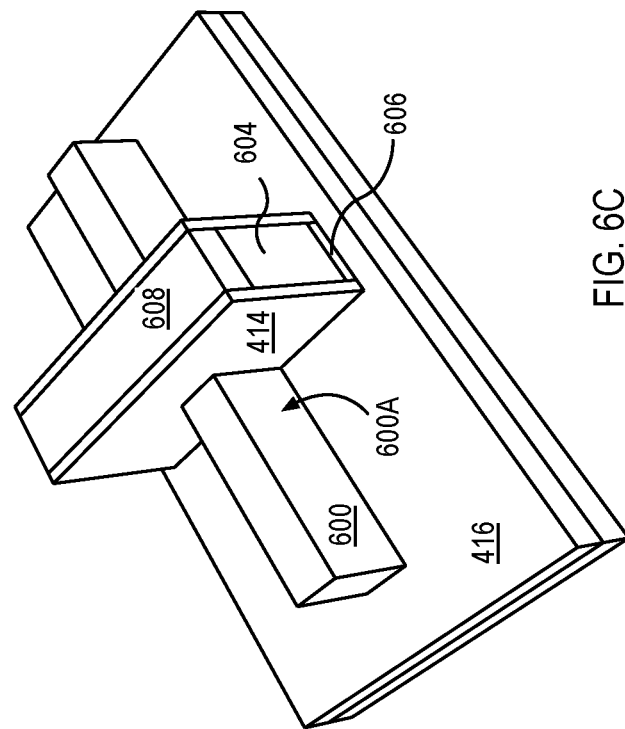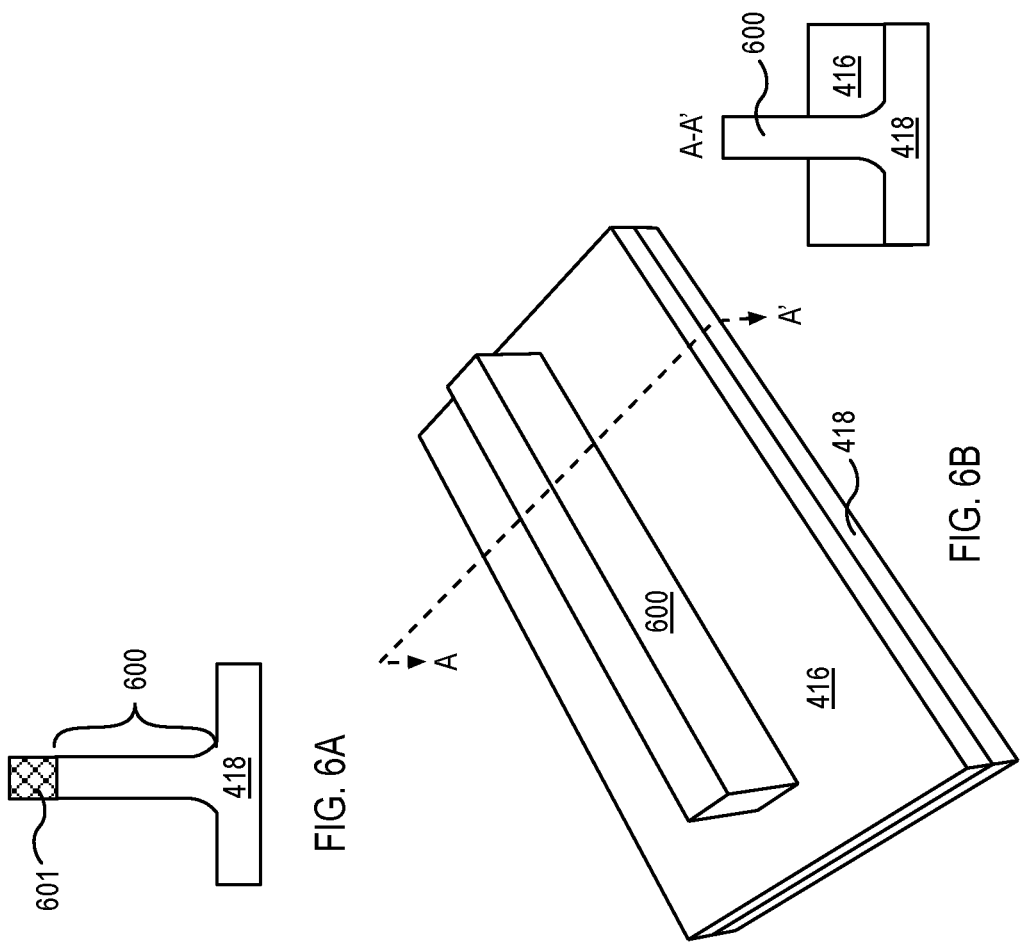

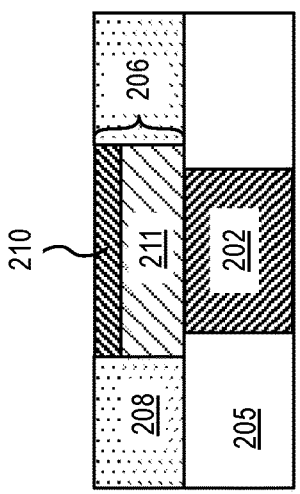
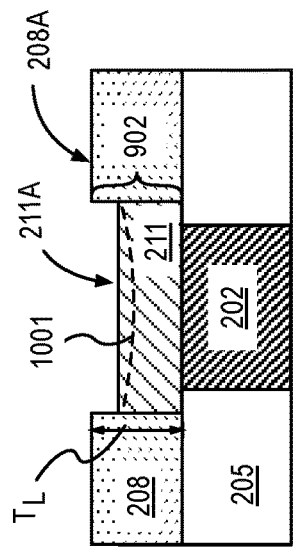
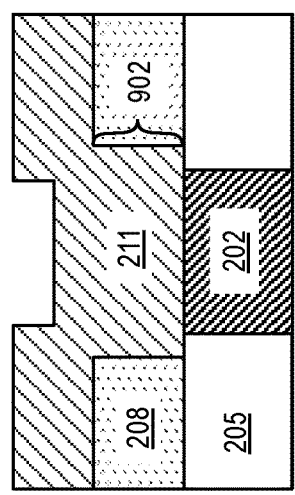
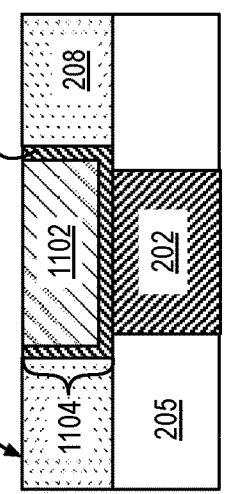
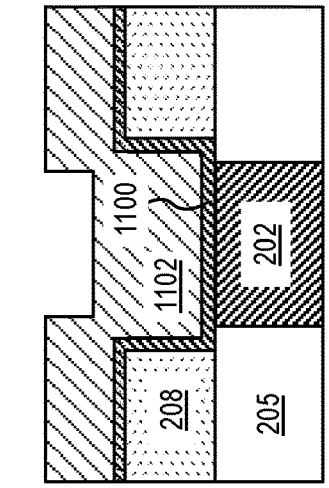
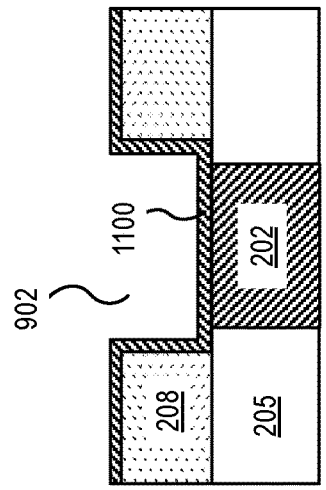

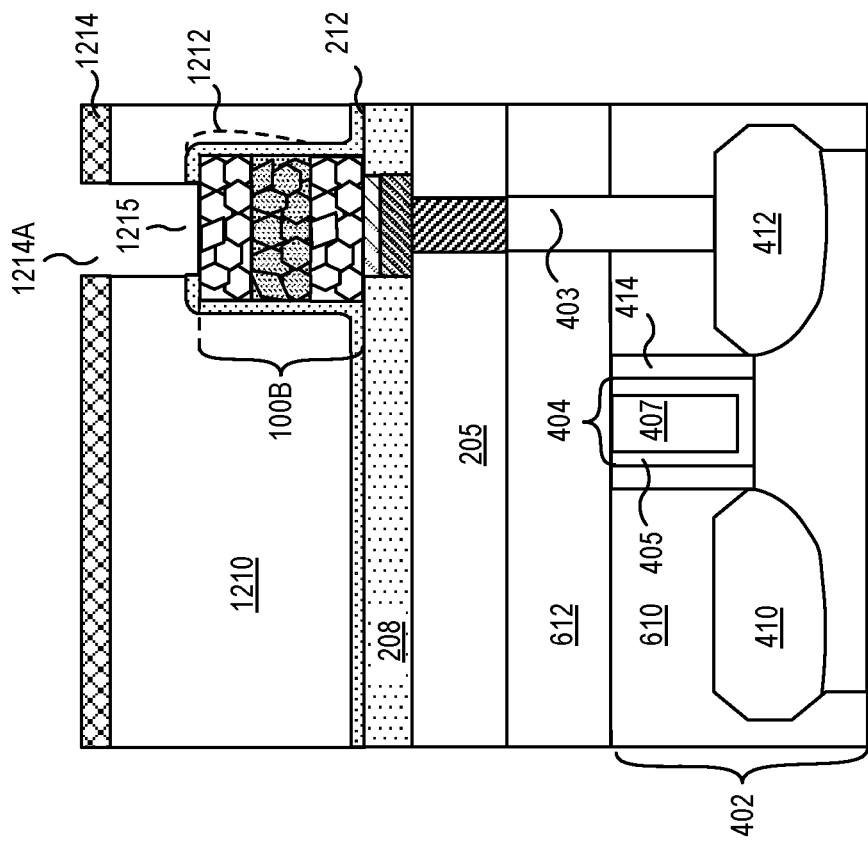
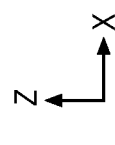
FIG. 12D
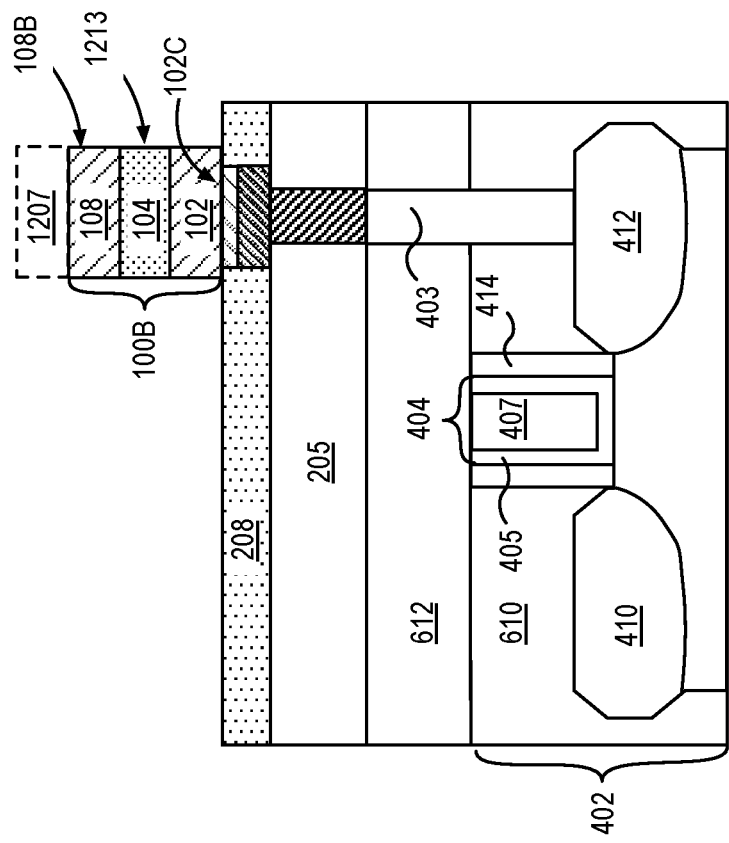
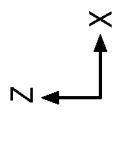
FIG. 12C

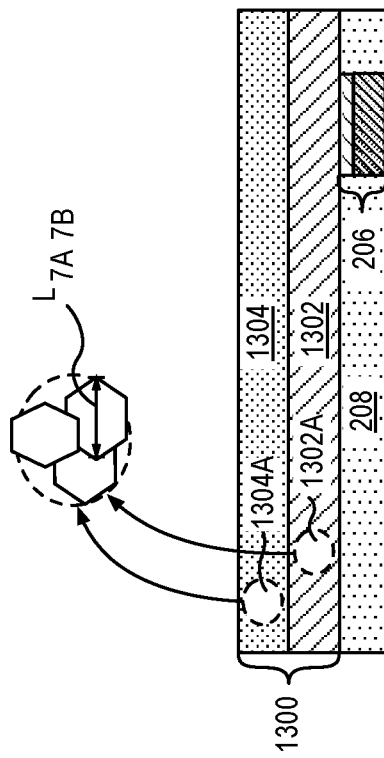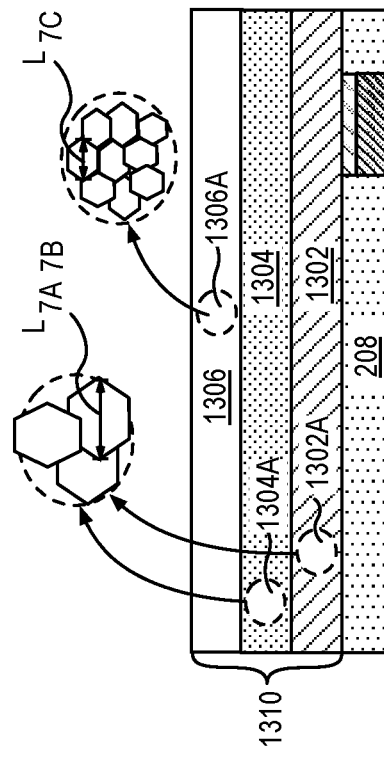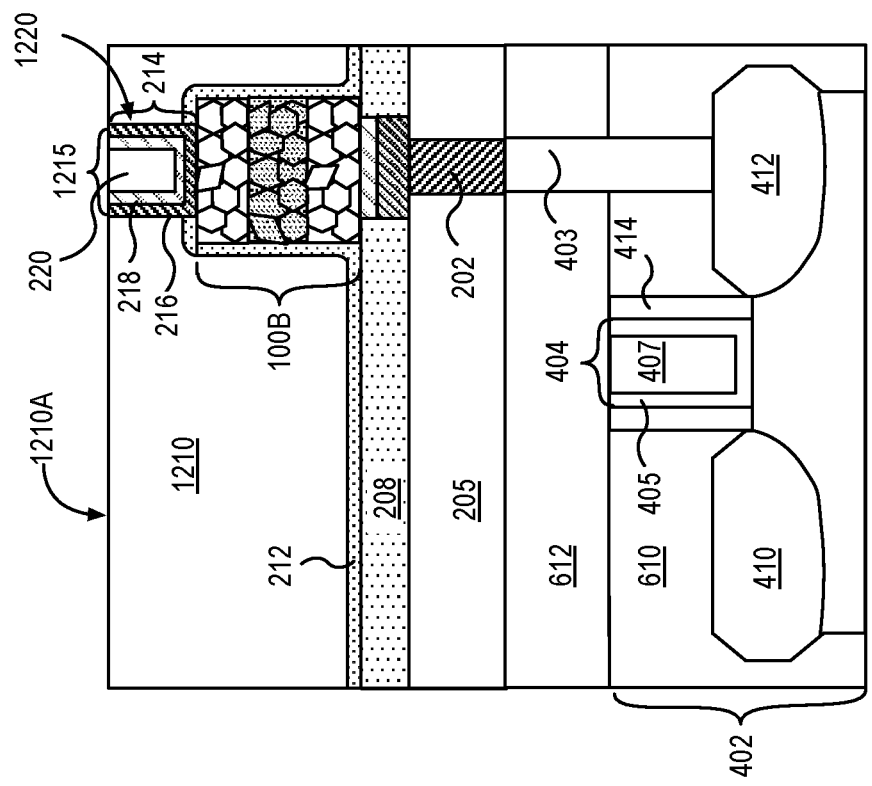

RAPID THERMAL ANNEALING (RTA) METHODOLOGIES FOR INTEGRATION OF PEROVSKITE-MATERIAL BASED TRENCH CAPACITORS

CLAIM OF PRIORITY

This application is a Continuation of and claims the benefit of priority to, U.S. patent application Ser. No. 17/649,534, filed on Jan. 31, 2022, and which is incorporated by reference in its entirety for all purposes.

BACKGROUND

Integration of capacitor devices including (ferroelectric or paraelectric materials) with logic devices can be challenging. Logic devices such as transistors include materials that are prone to damage at high temperature processing. Fabrication of high performance ferroelectric and paraelectric devices necessitates annealing at high temperatures to obtain high performance. High temperature anneals may not be desirable for adjacent logic circuitry. As such, alternate methods to form capacitor devices with high performance are desirable.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A is a cross-sectional illustration of a planar capacitor including upper and lower electrodes that have different grain sizes.

FIG. 1B is a cross-sectional illustration of a planar capacitor including upper and lower electrodes that have substantially the same sized grains.

FIG. 1C is a cross-sectional illustration of a planar capacitor including upper and lower electrodes that have different grain sizes, and different defect densities.

FIG. 1D is a cross-sectional illustration of a planar capacitor including upper and lower electrodes that have substantially the same sized grains, and substantially same number of defects.

FIG. 3A is a cross-sectional illustration of a trench capacitor including first and second electrodes that have different grain sizes.

FIG. 3B is a cross-sectional illustration of a trench capacitor including upper and lower electrodes that have substantially the same sized grains.

FIG. 4A is an isometric illustration of a capacitor coupled with a drain terminal of a transistor, in accordance with an embodiment of the present disclosure.

FIG. 4B is a cross-sectional illustration of the structure in FIG. 4A.

FIG. 6A is a cross-sectional illustration of a fin formed on a substrate.

FIG. 6B is an isometric illustration of the structure in FIG. 6A following the process to form a dielectric adjacent to a portion of the fin structure.

FIG. 6C is an isometric illustration of the structure in FIG. 6B following the formation of a dummy gate on the fin.

FIG. 10A is a cross-sectional illustration of the structure in FIG. 9A following the formation of conductive fill material within opening, in accordance with an embodiment of the present disclosure.

FIG. 10B is a cross-sectional illustration of the structure in FIG. 10A following the process to form the conductive fill material within a portion of the opening on the etch stop layer.

FIG. 10C is a cross-sectional illustration of the structure in FIG. 10B following the process to form a conductive hydrogen barrier on the conductive fill material to form an electrode structure, in accordance with an embodiment of the present disclosure.

FIG. 11A is a cross-sectional illustration of the structure in FIG. 9A following the process to deposit one or more electrode materials on a conductive interconnect and on the etch stop layer.

FIG. 11B is a cross-sectional illustration of the structure in FIG. 11A following the deposition of a fill material in the remaining portions of opening and on the conductive hydrogen barrier material.

FIG. 11C is a cross-sectional illustration of the structure in FIG. 11B following the process to planarize the fill material and the conductive hydrogen barrier material to form an electrode structure, in accordance with an embodiment of the present disclosure.

FIG. 12C is a cross-sectional illustration of the structure in FIG. 12B following the process to pattern the material layer stack.

FIG. 12D is a cross-sectional illustration of the structure in FIG. 12C following the process to form an opening in a dielectric formed above the etch stop layer and extended into an encapsulation layer formed on the memory device.

FIG. 12E is a cross-sectional illustration of the structure in FIG. 12D following the process to deposit materials into the opening to form a via electrode.

FIG. 13A is a cross-sectional illustration of a material layer stack formed above the electrode structure and etch stop layer following a process of post deposition anneal, in accordance with an embodiment of the present disclosure.

FIG. 13B is a cross-sectional illustration of a conductive layer formed on the annealed material layer stack in FIG. 13A, in accordance with an embodiment of the present disclosure.

DETAILED DESCRIPTION

Figures 2A, 2B:
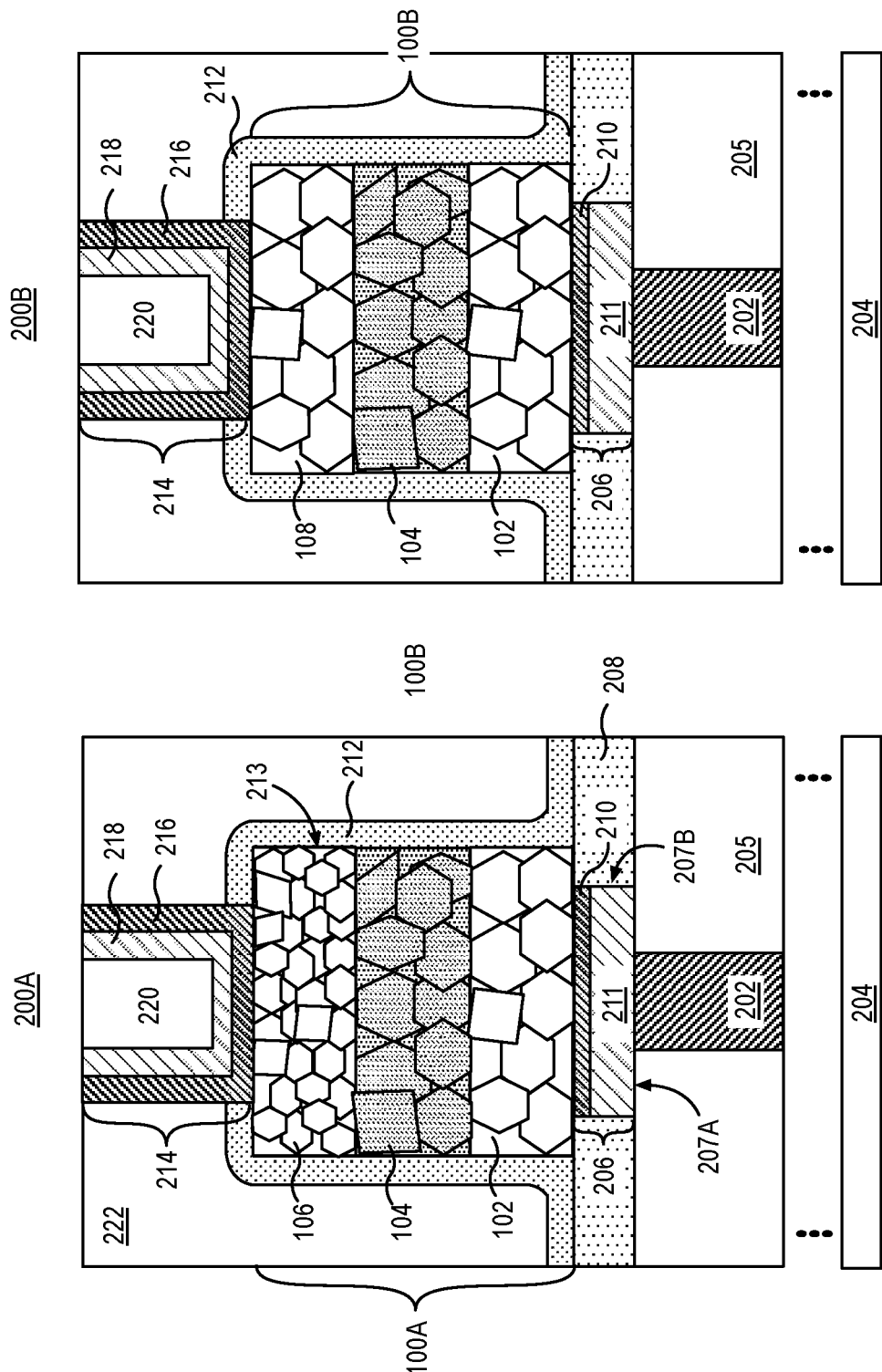
FIG. 2A is a cross-sectional illustration of a planar capacitor including upper and lower electrodes that have different grain sizes, coupled to a conductive interconnect through a transition electrode structure.
FIG. 2B is a cross-sectional illustration of a planar capacitor including upper and lower electrodes that have substantially same grain sizes, coupled to a conductive interconnect through a transition electrode structure.

A method to perform rapid thermal anneal at short durations for fabrication of memory devices and resultant structures are described. While various embodiments are described with reference to FeRAM or paraelectric RAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to current signal, voltage signal, magnetic signal, or data/clock signal.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. Similar distinctions are to be made in the context of component assemblies.

The term "between" may be employed in the context of the z-axis, x-axis or y-axis of a device. A material that is between two other materials may be in contact with one or both of those materials. In another example, a material that is between two or other material may be separated from both of the other two materials by one or more intervening materials. A material "between" two other materials may therefore be in contact with either of the other two materials. In another example, a material "between" two other materials may be coupled to the other two materials through an intervening material. A device that is between two other devices may be directly connected to one or both of those devices. In another example, a device that is between two other devices may be separated from both of the other two devices by one or more intervening devices.

Capacitors with a wide variety of materials have been implemented for memory (random-access memory or RAM) applications. Nonlinear polar materials offer a wide array of technologically important properties, including ferroelectricity, piezoelectricity, metal-like electrical conductivity, semiconduction, pyroelectricity, etc. Perovskites are an example of non-linear polar material (i.e., materials with the chemical formula $ABO3$). Perovskite materials have been implemented in capacitors such for high density FeRAM applications owing to their low power consumption and high on/off ratio. Perovskite FeRAM devices (herein FeRAM devices) may be desirable over other forms of memory such as magnetic tunnel junction (MTJ)-memory device for fabrication advantages. The MTJ can include a stack of 10 or more layers. In contrast, a Perovskite based FeRAM device minimally includes three layers for functionality. The ferroelectric dielectric is typically contained between two electrode layers independent of device geometry. The electrode layers may also include Perovskite materials to enable lattice matching and reduction in electrical resistance. Introduction of lead-free Perovskite materials offer additional environmental benefits without sacrificing device performance.

However, integration of nonlinear polar materials into silicon semiconductor chip fabrication processes can be challenging due to temperature requirements of Perovskite film deposition or formation. Perovskite materials may be deposited/formed at temperatures ≥600 C when using PVD and CVD techniques. However, for most modern silicon semiconductor processes, particularly those used for the fabrication of modern logic and embedded memory chips, deposition temperatures ≤400 C is desirable. Perovskite materials have been implemented in chip fabrication processes that can sustain temperatures ≥600 degrees Celsius for long periods of time (such as above 1 hour). For example, Lead Zirconate Titanate (PZT) based FERAM is typically manufactured using 130 nm or 180 nm Logic transistor technology at temperatures above 600 degrees Celsius. With the current trend of lowering chip fabrication process temperatures, implementing products based on high performance perovskite film necessitates scaling deposition/ formation temperatures. In this disclosure, methods are disclosed where perovskite materials are deposited at less than 400 C using PVD and/or CVD and/or ALD. It is to be appreciated that deposition of perovskite films at temperatures at or below 400 degrees Celsius is only part of a larger solution.

Perovskite film properties needed for high performance devices further necessitate achieving a grain size that is conducive for increasing effective polarization in the dielectric layer. Modulation of grain size may be accomplished by performing an anneal process at high temperatures. In various embodiments, the anneal process includes a rapid thermal treatment processes (herein PD-RTA). PD-RTA may utilize temperatures ≥400 C. However, while temperatures may be higher than 800 degrees C., the duration of most processes is limited to approximately 1 minute or less. It is to be appreciated that a process at high temperature and short time duration maybe compatible with transistors that are embedded within the substrate on which the perovskite material is formed. Such a method is particularly advantageous when transistors are fabricated using a gate last process to prevent threshold voltage shifts arising from high temperature operations lasting substantially greater than 1 minute.

In some embodiments, the anneal process may be performed after all layers in a FeRAM stack, for example, are deposited. In a second embodiment, the anneal process can be performed following a patterning process utilized to fabricate a FeRAM device. In a third embodiment, following the deposition of a first electrode layer and a dielectric layer the anneal process can be performed prior to deposition of a second electrode layer on the dielectric layer. In the third embodiment, the grain size of the second electrode may be different from a grain size of the first electrode.

While controlling grain sizes of electrodes and dielectric layer can modulate intrinsic behavior, it is equally important for long term device performance to mitigate damage from extrinsic processes. FeRAM devices including lead-free Perovskite materials are prone to damage from reaction with hydrogen during processing. Specifically, the damage may be a result of hydrogen traveling along grain boundaries between or along electrodes coupled with two terminals of an FeRAM device. Hydrogen can cause reduction when it reacts with the one or more materials of the FeRAM device, such as the electrodes or the ferroelectric material itself. During fabrication anneal operations carried to tie up dangling bonds can be sources of hydrogen. FeRAM devices can lose their polarization hysteresis characteristics as a result of hydrogen reduction.

In some embodiments, the capacitor devices have a planar structure where the individual layers are sequentially layered, one on top of another, where the layers are patterning into cylinder or rectangular shapes. Thus, it is highly desirable to protect capacitor sidewalls, top and bottom surfaces from reacting with hydrogen. In some embodiments, solutions against hydrogen diffusion include forming an insulating barrier layer, such as for example, silicon nitride, to protect sidewalls and top surfaces. A contact electrode may be formed on a top of the FeRAM device by etching through the insulating barrier layer and exposing one or more top electrode materials. The barrier layer may be further surrounded by additional insulating material such as an interlayer dielectric (ILD). However, the contact electrode formed may be wider than a width of an FeRAM device. In such examples, the fabrication process can result in erosion of spacer and exposure of sidewall of the FeRAM device to downstream processing.

In other examples, hydrogen may diffuse through one or more materials of the contact electrode towards the FeRAM device stack through a top electrode. To protect against hydrogen diffusion through a top surface of the top electrode noble metals can be implemented as part of the contact electrode structure. But noble metals can be difficult to pattern and have crystalline phase that may not be conducive as a hydrogen barrier.

Furthermore, it is to be appreciated that hydrogen can also diffuse from layers below a bottom electrode of the FeRAM device. Typically, the bottom electrode is physically isolated from a conductive interconnect by transition electrode. The transition electrode may be laterally surrounded by an insulator layer that can act as a barrier against hydrogen diffusion as well as provide etch stop capability while patterning the ReRAM stack.

The conductive interconnect may be laterally surrounded by an ILD. The insulator layer is typically formed above the ILD and the conductive interconnect. The interface between the transition electrode and the conductive interconnect, can be a pathway for hydrogen diffusion. Depending on a width of the transition electrode relative to the conductive interconnect, the transition electrode may be in contact with the ILD adjacent to the conductive interconnect and adversely facilitate hydrogen diffusion.

The inventors have devised a scheme to implement a dual hydrogen barrier that includes an insulative hydrogen barrier material directly adjacent to the memory device and a conductive hydrogen barrier that is integrated as part of the contact electrode. In some embodiments, the contact electrode may have a shape of a via that include a conductive hydrogen barrier having a first portion directly in contact with the memory device and a second portion that laterally surrounds a conductive (contact) material. The conductive contact material may further include one or more layers. The contact electrode may extend over a portion of the memory device.

To provide a barrier against hydrogen diffusion towards a bottom electrode, the transition electrode may also include a conductive hydrogen barrier material. The structure of the transition electrode may depend on the size of the memory device relative to the transition electrode. In embodiments, the transition electrode may include a conductive hydrogen barrier laterally surrounding a conductive material. In other embodiments, the transition electrode may include conductive hydrogen barrier directly across a top portion and in direct contact with the memory device.

To provide a barrier against hydrogen diffusion directly into sidewalls of the memory device, a dielectric that is amorphous, having a high film density (a film density above 90% of theoretical material density or film density) and is electrically insulating, may be directly in contact with the sidewalls of the memory device. Furthermore, when memory devices are integrated in a high density array, the space between the devices may not be large enough to deposit a barrier liner (spacer) as well as an ILD. In some such instances the high film density-dielectric is present over the entire memory region. FeRAM devices in the memory region may be directly adjacent to a logic region within a memory level, for system functionality. In particular, the ferroelectric devices may be directly adjacent to routing interconnects in the logic region. To minimize line capacitance, the routing interconnects are embedded within a low dielectric constant interlayer dielectric (ILD), where the ILD has a low film density (less than 90% film density) or a high porosity material.

In other embodiments, providing a barrier against hydrogen diffusion directly into sidewalls of the memory device, a spacer including a material that is amorphous, having a high film density (a film density above 90% of theoretical material density or film density) may be directly in contact with the sidewalls of the memory device. The spacer may be covered by an interlayer dielectric (ILD). The ILD has a low film density (a film density below 90% of theoretical material density or film density).

While the dual hydrogen barrier can be implemented in FeRAM devices (memory devices) having planar capacitor structures, to enable greater charge storage per unit area it is advantageous for capacitors to be non-planar. An example of a non-planar capacitor is a trench capacitor. A trench capacitor offers an advantage that sidewalls of the trench can offer an additional surface area for charge storage. Depending on a plan view design of the trench capacitor, for example, rectangular, circular or elliptical, the total charge storage can be effectively doubled per unit area of the footprint of the capacitor. However, to accomplish greater charge storage, the trench capacitor has a vertical thickness that can be at least twice the height of a planar capacitor. The dual hydrogen barrier concept can be further extended to trench capacitors.

Trench capacitors in general have a first conductive electrode (bottom electrode) that wraps around a base and sidewalls of a trench. A layer of dielectric charge storage material is conformal to an inner sidewall of the bottom electrode, and a second conductive electrode (top electrode) is lined against the layer of dielectric charge storage material. The dielectric charge storage material separates the first and the second conductive electrodes. The bottom electrode is exposed to the transition electrode and or the etch stop layer below, and to the dielectric surrounding the trench capacitor. In some embodiments the top surface of the trench capacitor include exposed portions of the bottom electrode, the dielectric charge storage material and the top electrode. To protect against hydrogen diffusion, the entire top surface of the trench capacitor needs to be protected by an insulative hydrogen barrier material.

The contact electrode including a conductive hydrogen barrier material can be utilized to contact the top electrode of the trench through the insulative hydrogen barrier material on the top surface of the trench capacitor. However, to prevent shorting between the top and bottom electrodes, the surface area of the contact electrode needs to be at least smaller than a footprint of the trench capacitor, when the trench capacitors are cylindrical or rectangular.

To protect against hydrogen diffusion from lateral directions, sidewalls of the trench can be lined with a spacer including a hydrogen barrier material, or the trench can be formed in a hydrogen barrier material.

Advantages from a greater source of charge storage in trench capacitors are availed when the layers within the trench capacitor can have thicknesses that are substantially uniform on the base of the trench as well as on the sidewalls. While different deposition techniques are available, atomic layer deposition (ALD) process is inherently advantageous as it provides uniform and conformal film coverage on substantially all exposed surfaces, an atomic layer at a time. Other ALD processes such as plasma assisted ALD. (PAALD) or plasma enhanced ALD (PEALD) offer further benefits such as, enhancing reactivity of co-reactants thus enabling higher deposition rates, and reduce carbon based impurities.

In addition to thickness uniformity, uniformity in material composition is also equally important. ALD processes can provide stoichiometric control at an atomic level. This is particularly advantageous when there are 3 or more elements in the film. Extremely tight control of film composition is essential to avail and tune optimal ferroelectric or paraelectric properties. Such uniformity in material composition on a planar and non-planar surfaces can be very challenging to obtain with other deposition techniques. Other inherent advantages of ALD process including depositing films with a discernable dopant profile.

While ALD deposition process has been utilized to deposit ferroelectric or paraelectric materials, the inventors have devised a deposition process that operates at substantially reduced range of temperatures, such as temperature between 160-400 degrees Celsius, compared to conventional ALD processes.

The trench capacitors may be integrated with transistors in a memory region of a substrate. For example, ferroelectric capacitors may be on a memory level above a transistor level. There may be one or more layers of conductive interconnects between the ferroelectric capacitors (herein ferroelectric devices) and transistors in the transistor level.

For manufacturability, ferroelectric devices may be generally formed directly above conductive interconnects that are coupled with transistors on a lower level. When a conductive interconnect includes copper, it is high desirable to not etch a ferroelectric device and expose the copper conductive interconnect. In such instances, an etch stop layer may be inserted between the conductive interconnect and the ferroelectric device. The etch stop layer also acts as a hydrogen barrier layer to prevent diffusion of hydrogen from a dielectric adjacent to the conductive interconnect to one or more memory devices in a layer above. However, to provide electrical conductivity between the ferroelectric device and the conductive interconnect, a transition electrode may be inserted between a ferroelectric device and a conductive interconnect. The transition electrode may be embedded within the etch stop layer. Because the transition electrode is embedded within the etch stop layer, alignment and sizing requirements of the etch stop layer relative to the conductive interconnect (or the ferroelectric device) may be relaxed. Additionally, the shape of the transition electrode may be independent of a shape of the conductive interconnect.

To enable high density FeRAM devices utilization of non-lead-based perovskite materials is desirable for mass production owing to its environmental friendliness. A stack for ferroelectric capacitors can include one or more hardmask material. The one or more hardmask material can include dielectric materials, metallic materials or a combination thereof. Implementation of an etch with high selectivity (such as a reactive ion etching, or plasma etch process) between the hardmask and device layers can advantageously enable patterning.

In some embodiments, the conductive interconnects coupled with a respective ferroelectric device are discrete island structures. In other embodiments, the conductive interconnect may be a continuous trench line, where a plurality of ferroelectric devices may be coupled with the trench line. In some such embodiments, the transition electrode may be continuous between a respective ferroelectric device and extend along a length of the trench line. In other embodiments, the conductive interconnect may be discrete, but the transition electrode (herein electrode structure) may be continuous between two or more adjacent capacitors. In further embodiments, the conductive interconnects are discrete, but a top electrode of individual ferroelectric capacitors are coupled together by a single conductive plate.

FIG. 1A is a cross-sectional illustration of a planar capacitor 100A (herein memory device 100A). In the illustrative embodiment, memory device 100A includes electrode 102, dielectric layer 104 on electrode 102 and electrode 106 on dielectric layer 104. Electrode 102 comprises a first conductive nonlinear polar material where the first conductive nonlinear polar material has a first grain size. Dielectric layer 104 comprises a perovskite material comprising a second grain size. Electrode 106 comprises a second conductive nonlinear polar material, where the second conductive nonlinear polar material has a third grain size that is less than the first grain size or the second grain size. All grain sizes are defined by an "average grain length".

In an embodiment, Electrode 102 includes a perovskite material. In embodiments, the perovskite material includes one of a non-Pb perovskite metal oxides, such as but not limited to, La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO$_3$. In the illustrative embodiment, electrode 102 has a nanocrystalline to polycrystalline grain structure. Grains 102A may be irregular as illustrated. Grains 102A have a size defined by average length Li. In an embodiment, Li ranges between 15 nm and 50 nm.

In an embodiment, dielectric layer 104 is a ferroelectric dielectric layer 104 that includes non-Pb perovskite material in the form ABO$_3$, where A and B are two cations of different sizes and O is Oxygen. A is generally larger than B in size. In some embodiments, non-Pb Perovskites can also be doped, e.g., by La or Lanthanides. Non-Pb Perovskite material can include one or more of La, Sr, Co, Cr, K, Nb, Na, Sr, Ru, Y, Fe, Ba, Hf, Zr, Cu, Ta, Bi, Ca, Ti and Ni. Combination of materials may include Pb$_x$Zr$_{1-x}$Ti$_y$O$_3$, La$_x$Bi$_{1-x}$Fe$_y$O$_3$ or BaTiO$_3$.

In other embodiments, ferroelectric dielectric layer 104 includes low voltage ferroelectric material. These low voltage FE materials can be of the form AA'BB' O$_3$, where A' is a dopant for atomic site A, and can be an element from the Lanthanides series, where B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 2-Volts is sufficiently low to be characterized as low voltage.

In the illustrative embodiment, dielectric layer 104 has a polycrystalline grain structure. Grains 104A may be irregular as illustrated. Grains 104A have a size defined by an average length, L$_2$. In an embodiment, L$_2$ ranges between 15 nm and 50 nm. It is to be appreciated that the multiple polarization domains may exist within grain 104A. The ratio between Li and L$_2$ can range between 1:3-3:1. In some embodiments, the ratio between Li and L$_2$ is substantially equal to 1:1, when dielectric layer 104 includes one or more of the elements of electrode 102.

In an embodiment, electrode 106 includes a perovskite material. In an embodiment, the perovskite material includes one of a non-Pb perovskite metal oxides, such as but not limited to, La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3. In the illustrative embodiment, electrode 106 has a nanocrystalline to polycrystalline grain structure. Grains 106A may be irregular as illustrated. Grains 106A have a size defined by average length L$_3$. In an embodiment, L$_3$ ranges between 1 nm and 14 nm. In some embodiments, electrode 106 includes a material that is the same or substantially the same as the material of electrode 102. In some such embodiments, grains 106A and 102A can have sizes that are independent of each other. In the illustrative embodiment, L$_3$ can be smaller than Li by a factor between 1 to 50.

In an embodiment, electrodes 102 and 106 can have thicknesses, T$_1$ and T$_3$, respectively that is between 1 nm and 30 nm. T$_1$ and T$_3$ can be substantially equal to each other or be different. In embodiments, dielectric layer 104 has a thickness T$_2$. T$_2$ can be independent of T$_1$ and T$_3$. A thickness of at least 1 nm ensures that dielectric layer 104 is contiguous over the surface of electrode 102.

While grain size is one attribute of the layers within memory device 100A, there are others such as point defects. Point defects are sites with missing atoms such as oxygen, or missing cations such as Ba, Bi, Fe, Ti, etc. FIG. 1B is a cross-sectional illustration of point defects within various layers in memory device 100A. The point defects can correlate with grain size, where a layer comprising a large grain size may have lower point defects such as is illustrated. In embodiments, electrode 102 has point defects 103 that number less than 1e20 atoms/cm$^3$. Further as illustrated, electrode 102 has a grain size between 15 nm and 50 nm and point defects that number less than 1e20 atoms/cm$^3$. In embodiments, dielectric layer 104 has point defects 105 that number less than 1e20 atoms/cm$^3$. Further as illustrated, dielectric layer 104 has a grain size between 15 nm and 50 nm and point defects 105 that number less than 1e20 atoms/cm$^3$. In the illustrative embodiment, electrode 106 has a grain size between 1 nm and 15 nm and point defects 107 that number less than 1e20 atoms/cm$^3$.

In other embodiments, the grain size of electrode 106 can be substantially the same as the grain size of electrode 102. FIG. 1C is a cross-sectional illustration of a memory device 100B that includes an electrode 108 on the dielectric layer 104. As shown, electrode 108 includes grains 108A that are of comparable magnitude to electrode 102. Grains 108A have a size defined by an average length L$_4$. In an embodiment, L$_4$ ranges between 15 nm and 50 nm. In embodiments, ratio between grain size of electrodes 102 and 108, L$_1$:L$_4$ is substantially 1:1, but can vary by less than 10% percent.

In some embodiments, electrode 106 can further include a same material as the material of electrode 102. Substantially identical materials can provide symmetry and can offer additional advantages such as reliability as devices are cycled billions of times over a lifetime of operation. However, in other embodiments, different electrode materials having substantially the same grain size can be implemented in memory device 100B. This can be advantageous in some operational regimes where at least one of electrodes 102 or 108 is coupled with external circuit element such as a transistor.

As shown, electrode 108 has thickness T$_4$. Thickness of electrode 108 may be between 1 nm and 30 nm. In some embodiments, thicknesses $T_4$ and $T_1$ can also be substantially equal. In other embodiments, $T_4$ can be up to twice as thick as $T_1$ to enable patterning to form memory device 100B.

FIG. 1D is a cross-sectional illustration of point defects within various layers in memory device 100B. The number of point defects 109 in electrode 108 is less compared to number of point defects 107 in electrode 106 (FIG. 1B). The size of grains 108A in electrode 108 is also substantially larger than size of grains 106A of electrode 106 (FIG. 1A), as discussed above. In embodiments, electrode 108 has point defects 109 that number less than 1e20 atoms/cm$^3$. In embodiments, electrode 102 has an average grain length, Li between 15 nm and 50 nm and point defects 103 that number less than 1e20 atoms/cm$^3$.

Memory device 100A and memory device 100B are typically coupled with external circuit elements such as transistors through interconnect structures.

FIG. 2A is a cross-sectional illustration of device structure 200A that includes memory device 100A coupled above conductive interconnect 202. Conductive interconnect 202 is laterally surrounded by dielectric 205 and is above substrate 204. There may be one or more layers of devices such as transistors between substrate 204 and conductive interconnect 202, as will be discussed below. Dielectric 205 includes a material having a low film density, such as for example density less than 90% of theoretical material density. In some embodiments, dielectric 205 includes a material having a dielectric constant that is below 3.5. Dielectric 205 may include $SiO_2$, SiOC, SiC or $SiO_2$ doped with F.

As shown, electrode structure 206 is coupled between a respective memory device 100A and respective conductive interconnect 202. Electrode structure 206 is laterally surrounded by etch stop layer 208. In exemplary embodiments, etch stop layer 208 includes a dielectric material. In exemplary embodiments, the dielectric material of the etch stop layer 208 does not include a metal. Electrode structure 206 may cover an entire top surface or at least a portion of the top surface of conductive interconnect 202, depending on lateral thickness (or width), $W_{ES}$, of electrode structure 206 compared to lateral thickness, $W_{CI}$, of conductive interconnect 202. In the illustrative embodiment, $W_{ES}$, is greater than $W_{CI}$. In embodiments where $W_{ES}$, is greater than $W_{CI}$, electrode structure 206 is also on a portion of dielectric 205. In some such embodiments, hydrogen may diffuse from dielectric 205 to memory device 100A. For example, interface 207A between electrode structure 206 and dielectric 205, and interface 207B between electrode structure 206 and etch stop layer 208 may provide pathways for hydrogen diffusion. To prevent hydrogen diffusion through interfaces 207A and 207B, electrode structure 206 can include a hydrogen barrier layer along interfaces 207A and 207B.

The hydrogen barrier layer may have various structural embodiments. In the illustrative embodiment, electrode structure 206 includes conductive hydrogen barrier 210 on conductive fill material 211. In the illustrative embodiment, where $W_{ES}$, is greater than $W_{CI}$, a portion of memory device 100A is also directly in contact with dielectric 205. Conductive hydrogen barrier 210 and etch stop layer 208 form a dual hydrogen barrier below memory device 100A. Etch stop layer 208 may also act as an oxygen diffusion barrier.

Conductive hydrogen barrier 210 includes a material that is amorphous. Amorphous materials lack defined grain boundaries that can facilitate hydrogen diffusion and are thus desirable. Embodiments of the conductive hydrogen barrier 210 include materials such as, but not limited to, TiAlN, with >30 atomic percent AlN, TaN, with >30 atomic percent $N_2$, TiSiN, with >20 atomic percent SiN, Ta carbide, TaC, Ti carbide, TiC, tungsten carbide, WC, tungsten nitride, WN, carbonitrides of Ta, Ti, W, i.e., TaCN, TiCN, WCN, titanium monoxide, TiO, $Ti_2O$, Tungsten oxide, WO3,Tin oxide, $SnO_2$, indium tin oxide, ITO, Iridium Oxide, Indium Gallium Zinc Oxide, IGZO, Zinc Oxide or METGLAS series of alloys, e.g., $Fe_{40}Ni_{40}P_{14}B_6$. In some embodiments, the conductive hydrogen barrier 210 has a thickness that is less than 5 nm.

Conductive fill material 211 may include material such as tantalum, titanium, ruthenium, tungsten, molybdenum or copper. In some embodiments, when $W_{ES}$ is greater than $W_{MD}$, electrode structure 206 may not include material such as copper to prevent sputtering of the copper during fabrication of memory device 100A. When $W_{ES}$ is less than $W_{MD}$ (as illustrated in FIG. 2A) conductive fill material 211 may include copper. In some embodiments, depending on the material, the conductive fill material 211 can further include an adhesion liner between conductive fill material 211 and etch stop layer 208 and conductive interconnect 202.

To prevent hydrogen from reaching dielectric layer 104, memory device 100A may be at least laterally covered by an encapsulation layer. In an embodiment, sidewall 213 of memory device 100A is laterally surrounded by encapsulation layer 212. As shown, encapsulation layer 212 also extends partially on an uppermost surface of memory device 100A. The encapsulation layer may include a material such as but not limited to silicon nitride, carbon doped silicon nitride, $Al_xO_y$, $HfO_x$, $ZrO_x$, $TaO_x$, $TiO_x$, $AlSiO_x$, $HfSiO_x$, or $TaSiO_x$.

To prevent hydrogen from reaching electrode 106, device structure 200A further includes conductive hydrogen barrier 216. Conductive hydrogen barrier 216 may be an upper most layer of memory device 100A or be separate from memory device 100A. In the illustrative embodiment, conductive hydrogen barrier 216 is part of via electrode 214 (herein contact electrode 214) that is coupled with memory device 100A. However, to be effective, it is desirable for conductive hydrogen barrier 216 to be in contact with electrode 106 and form a contagious layer with encapsulation layer 212, as shown. In the illustrative embodiment, one or more layers within contact electrode 214 are cup shaped. For example, conductive hydrogen barrier 216 includes a lateral portion in contact with electrode 106 and substantially vertical portions, connected to the lateral portion. Liner layer 218 may be cup shaped, as shown, and adjacent to all portions of conductive hydrogen barrier 216. In the illustrative embodiment, conductive fill material 220 fills liner layer 218 that is cup shaped or U-shaped. Liner layer 218 may have a substantially uniform material thickness. In other embodiments, depending on a material of conductive hydrogen barrier 216, conductive fill material 220 may be directly adjacent to conductive hydrogen barrier 216. In some such embodiments, contact electrode does not include liner layer 218.

In some embodiments conductive hydrogen barrier 216 includes materials such as, but not limited to TiAlN with >30 atomic percent AlN, TaN with >30 atomic percent $N_2$, TiSiN with >20 atomic percent SiN, Ta carbide, TaC, Ti carbide, TiC, tungsten carbide, WC, tungsten nitride, WN, carbonitrides of Ta, Ti, W, i.e., TaCN, TiCN, WCN, titanium monoxide, TiO, $Ti_2O$, Tungsten oxide, WO3, Tin oxide, $SnO_2$, indium tin oxide, ITO, Iridium Oxide, Indium Gallium Zinc Oxide, IGZO, Zinc Oxide, or METGLAS series of alloys, e.g., $Fe_{40}Ni_{40}P_{14}B_6$. In some embodiments, conductive hydrogen barrier 216 has a thickness that is less than 5 nm.

Conductive fill material 211 may include a material such as tantalum, titanium, ruthenium, tungsten, molybdenum or copper. Liner layer 218 may include material such as but not limited to nitrides of titanium, tantalum, or ruthenium.

As shown, contact electrode 214 and encapsulation layer 212 are laterally surrounded by dielectric 222. In some embodiments, dielectric 222 includes a low density film such as $SiO_x$, SiC, or SiON. In other embodiments, encapsulation layer 212 may be replaced by dielectric 222 that is a hydrogen barrier material. In some such embodiments, the hydrogen barrier material is amorphous, has a high film density (a film density above 90% of theoretical material density), and is electrically insulating. Amorphous materials prevent diffusion along grain boundary. High film density prevents diffusion through interconnected pores, closing all diffusion pathways. In further such embodiments, dielectric 222 includes a transition metal and oxygen, such as for example $Al_xO_y$, $HfO_x$, $ZrO_x$, $TaO_x$, $TiO_x$, $HfSiO_x$, or $TaSiO_x$. In other embodiments, dielectric 222 includes a nitride of Al, Zr or Hf, for example AlN, ZrN, or HfN. Dielectric 222 may include a high density SiOx, SiN, SiCN, SiC, or SiON.

FIG. 2B is a cross-sectional illustration of device structure 200B that includes one or more properties of device structure 200A, such as conductive interconnect 202, electrode structure 206, encapsulation layer 212 and contact electrode 214. In the illustrative embodiment, device structure 200B includes memory device 100B with electrode 108.

It is to be appreciated that memory devices 100A and 100B illustrated in FIGS. 2A and 2B include one or more features described above.

Figure 2C:
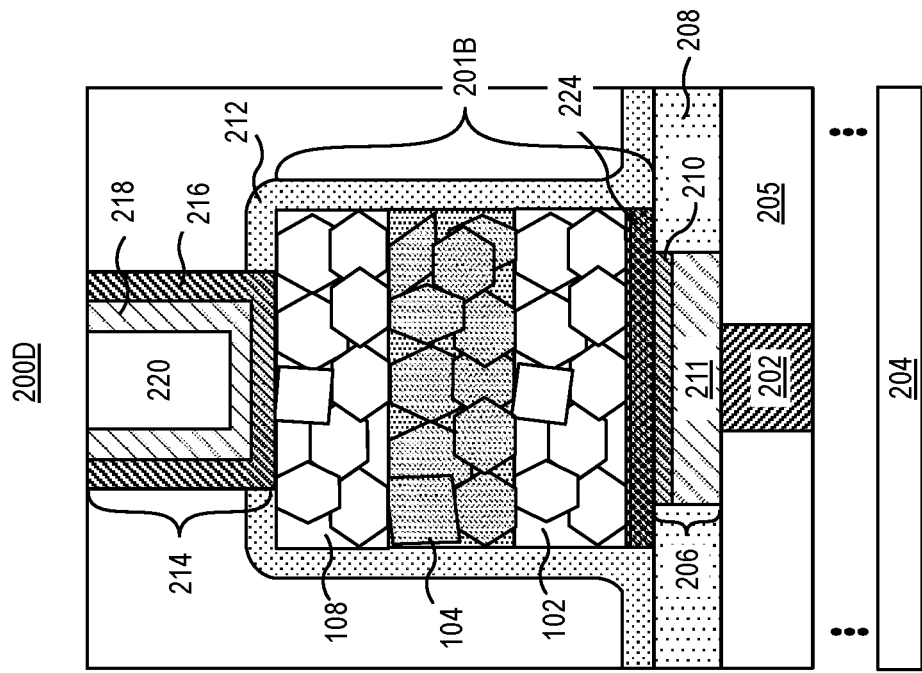
FIG. 2C is a cross-sectional illustration of the planar capacitor in FIG. 2A further including a lower oxygen barrier layer.

FIG. 2C is a cross-sectional illustration of device structure 200C, including memory device 201A that includes conductive oxygen barrier layer 224. In the illustrative embodiment, memory device 201A is an example of a planar capacitor that includes one or more features of memory device 100A. In the illustrative embodiment, the conductive oxygen barrier layer 224 is between electrode 102 and conductive hydrogen barrier 210. As shown, conductive oxygen barrier layer 224 has lateral thickness, $W_{OX}$ that is substantially the same as lateral thickness of electrode 102, $W_{MD}$. In the illustrative embodiment, a portion of conductive oxygen barrier layer 224 is also in contact with etch stop layer 208. In some embodiments, conductive oxygen barrier layer 224 includes one of metal boride, metal carbide, metal nitride, intermetallic, or amorphous metal oxide.

Figure 2D:
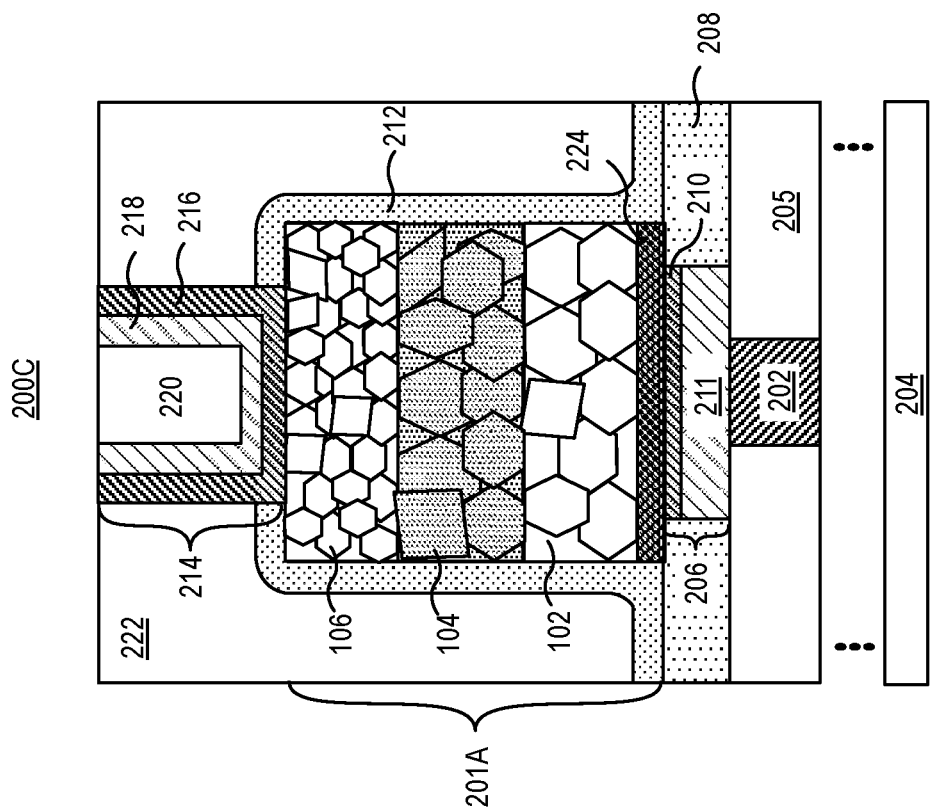
FIG. 2D is a cross-sectional illustration of the planar capacitor in FIG. 2B further including a lower oxygen barrier layer.

FIG. 2D is a cross-sectional illustration of device structure 200D, including memory device 201B that includes conductive oxygen barrier layer 224. In the illustrative embodiment, memory device 201B is an example of a planar capacitor that includes one or more features of memory device 100B. In the illustrative embodiment, conductive oxygen barrier layer 224 is between electrode 102 and conductive hydrogen barrier 210. As shown, conductive oxygen barrier layer 224 has lateral thickness, $W_{OX}$ that is substantially the same as lateral thickness of electrode 102, $W_{MD}$. In the illustrative embodiment, a portion of conductive oxygen barrier layer 224 is also in contact with etch stop layer 208.

FIG. 3A is an example of device structure 300A that includes a memory device that is in a form of a trench capacitor, herein trench capacitor 302A. Trench capacitor 302A is on and coupled with electrode structure 206. Trench capacitor 302A includes one or more ferroelectric materials, or one or more paraelectric materials. Trench capacitor 302A includes a first electrode, herein electrode 304. Electrode 304 includes base portion and substantially vertically sidewall portions. In the illustrative embodiment, electrode 304 is U-shaped with an opening facing contact electrode 214. The base portion and substantially vertical sidewall portions are of substantially a same thickness.

Trench capacitor 302A further includes a ferroelectric or a paraelectric dielectric layer (herein dielectric layer 306) directly adjacent to electrode 304. As shown, dielectric layer 306 is substantially conformal to electrode 304. In the illustrative embodiment, dielectric layer 306 is U-shaped with an opening facing contact electrode 214.

Trench capacitor 302A further includes a second electrode (herein electrode 308) directly in contact with dielectric layer 306. Electrode 308 fills a space between portions of dielectric layer 306 that are conformal with electrode 304. In the illustrative embodiment, electrode 308 is substantially cylindrical in shape. The arrangement of electrode 304, dielectric layer 306 and electrode 308 produce a substantially uniform electric field between electrode 304 and electrode 308, during operation.

In the illustrative embodiment, electrode 304 includes a material that is the same or substantially the same as the material of electrode 102 (described in association with FIG. 1A). Electrode 304 includes grains 304A having an average length between 15 nm and 50 nm. Furthermore, electrode 304 includes point defects with a density of less than 1e12 atoms/cm³. In the illustrative embodiment, dielectric layer 306 includes a material that is the same or substantially the same as the material of dielectric layer 104 (FIG. 1A). Dielectric layer 306 includes grains 306A having an average length between 15 nm and 50 nm. Furthermore, dielectric layer 306 includes point defects with a density of less than 1e12 atoms/cm³. In the illustrative embodiment, electrode 308 includes a material that is the same or substantially the same as the material of electrode 106 (FIG. 1A). In some embodiments, electrode 308 includes grains 308A having an average length that is less than an average length of grains 304A. In some such embodiments, grains 308A have an average length between 1 nm and 14 nm. Furthermore, electrode 308 includes point defects with a density of much greater than 1e12 atoms/cm³. Trench capacitor 302A is laterally surrounded by dielectric 309 having a high film density. In an embodiment, dielectric 309 includes a material that is the same or substantially the same as the material of dielectric 309, where dielectric 309 includes a high film density.

Device structure 300A further includes a contact electrode such as contact electrode 214. In the illustrative embodiment, contact electrode 214 is on at least a portion of a top surface of electrode 308. As shown, contact electrode 214 has a width We that is less than a width of trench capacitor, WM. In some embodiments, contact electrode 214 may extend on to a portion of dielectric layer 306.

Trench capacitor 302A has a width $W_T$, that may be greater than or less than $W_{ES}$. In the illustrative embodiment, $W_T$ is greater than $W_{ES}$. In some such embodiments, the base portion of electrode 304 is in contact with electrode structure 206 and with etch stop layer 208.

FIG. 3B is a cross-sectional illustration of device structure 300B that includes one or more properties of device structure 300A, such as conductive interconnect 202, electrode structure 206, and contact electrode 214. In the illustrative embodiment, device structure 300B includes trench capacitor 302B with electrode 310. Electrode 310 includes one or more features of electrode 108 described in association with FIG. 1B, such as grain size and material.

Figure 3D:
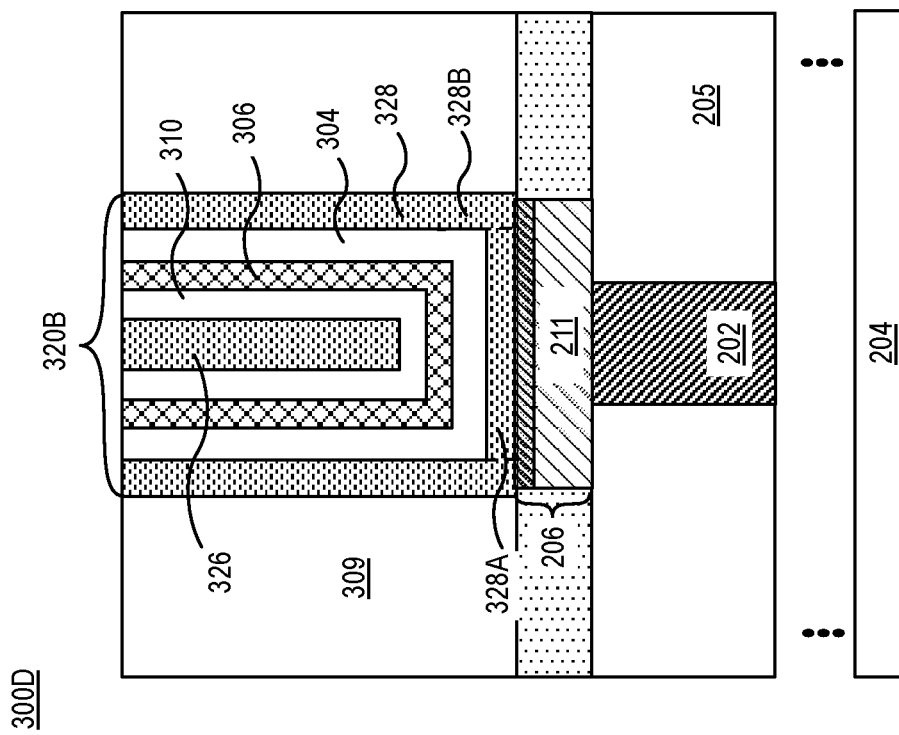
FIG. 3D is a cross-sectional illustration of a trench capacitor including an oxygen barrier layer on an electrode structure including a hydrogen barrier layer in accordance with an embodiment of the present disclosure.
Figure 3C:
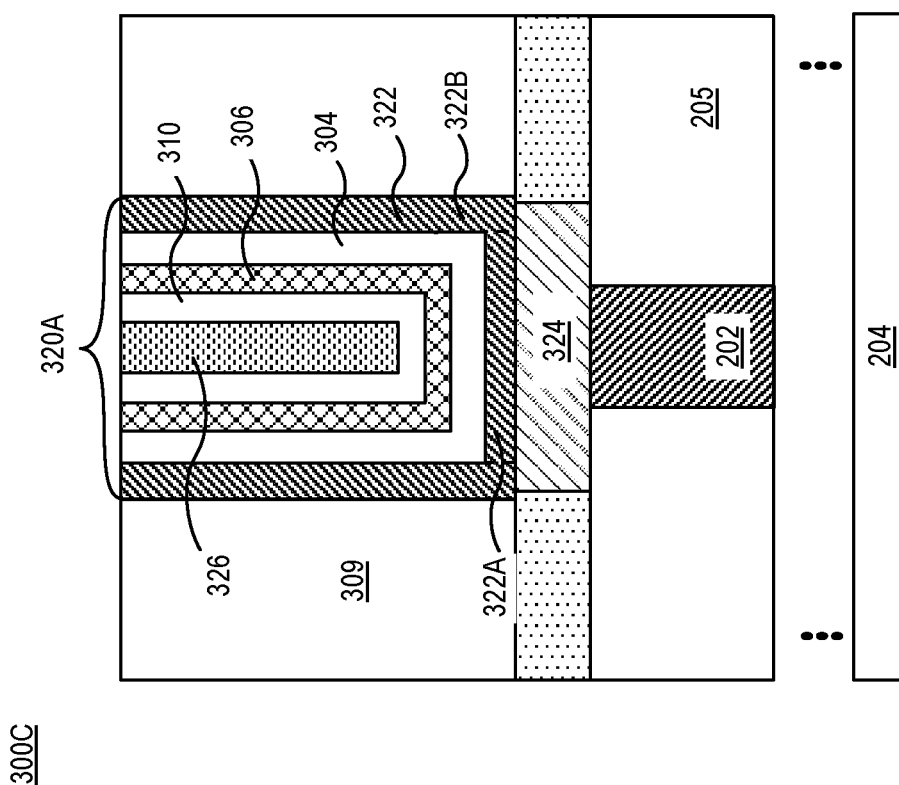
FIG. 3C is a cross-sectional illustration of a trench capacitor including a hydrogen barrier layer in accordance with an embodiment of the present disclosure.

FIG. 3C is a cross-sectional illustration of device structure 300C including trench capacitor 320A where conductive hydrogen barrier 322 is an outer most layer. In the illustrative embodiment, trench capacitor 320A is on an electrode structure 324. In different embodiments, electrode structure 324 includes Ti, Ta, Ru or W, or nitrides of Ti, Ta, Ru, or W. In some embodiments, electrode structure 324 also includes copper.

In the illustrative embodiment, trench capacitor 320A includes conductive hydrogen barrier 322 having base portion 322A and sidewall portions 322B adjacent to dielectric 309. Conductive hydrogen barrier 322 includes a material that is the same or substantially the same as the material of conductive hydrogen barrier 210 (FIG. 2A). Trench capacitor 320A includes electrode 304 on base portion 322A and on sidewall portions 322B of conductive hydrogen barrier 322. Dielectric layer 306 is directly between electrode 310 and electrode 304. In the illustrative embodiment, trench capacitor 320A further includes fill metal 326 adjacent to electrode 308. In other embodiments, where electrodes 304 and 310, dielectric layer 306 and conductive hydrogen barrier 322 have a combined thickness that is comparable to half a width of trench capacitor 320A, fill metal 326 may not be included in trench capacitor 320A.

FIG. 3D is a cross-sectional illustration of device structure 300D including trench capacitor 320B including conductive oxygen barrier layer 328 on electrode structure 206, in accordance with an embodiment of the present disclosure. In the illustrative embodiment, electrode structure 206 includes conductive hydrogen barrier 210 on conductive fill material 211.

In some embodiments, such as is shown, conductive oxygen barrier layer 224 includes base portion 328A and sidewall portions 328B adjacent to dielectric 309. In some embodiments, conductive oxygen barrier layer 328 includes a material that is the same or substantially the same as the material of conductive oxygen barrier layer 224 (FIG. 2C). Trench capacitor 320B includes electrode 304 on base portion 328A and on sidewall portions 328B. Dielectric layer 306 is directly between electrode 310 and electrode 304. In the illustrative embodiment, trench capacitor 320B further includes fill metal 326 adjacent to electrode 308. In other embodiments, where electrodes 304 and 310, dielectric layer 306 and conductive hydrogen barrier 322 have a combined thickness that is comparable to half a width of trench capacitor 320B, fill metal 326 may not be included in trench capacitor 320B. Conductive fill material 211 may include, tungsten, titanium, tantalum, or ruthenium, or a nitride of tungsten, tantalum, titanium, or ruthenium.

Figure 3F:
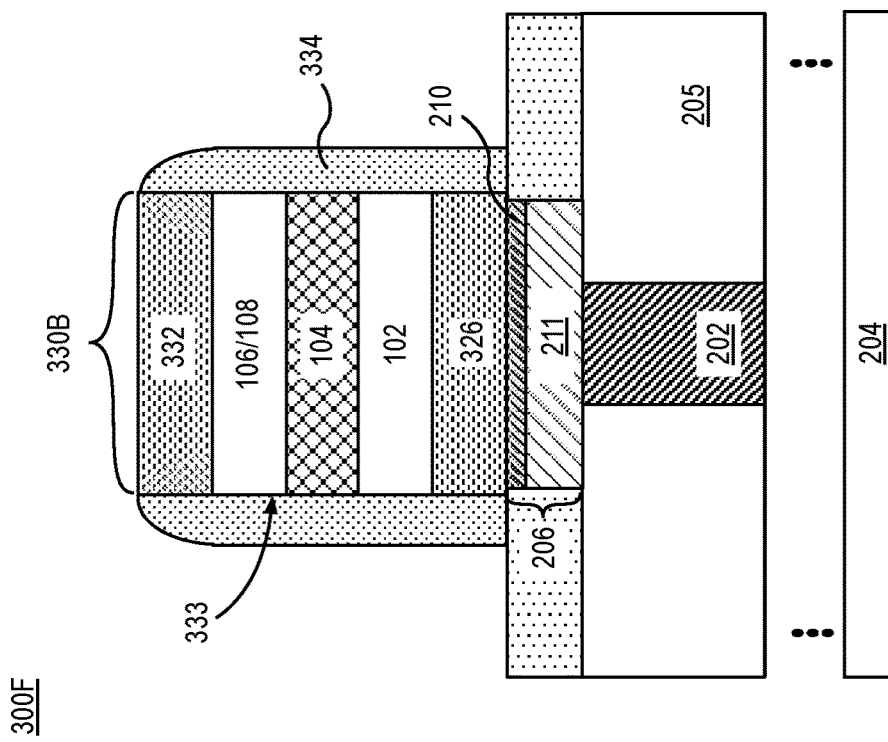
FIG. 3F is a cross-sectional illustration of a planar capacitor including upper and lower hydrogen barrier layers and an oxygen barrier layer, in accordance with an embodiment of the present disclosure.
Figure 3E:
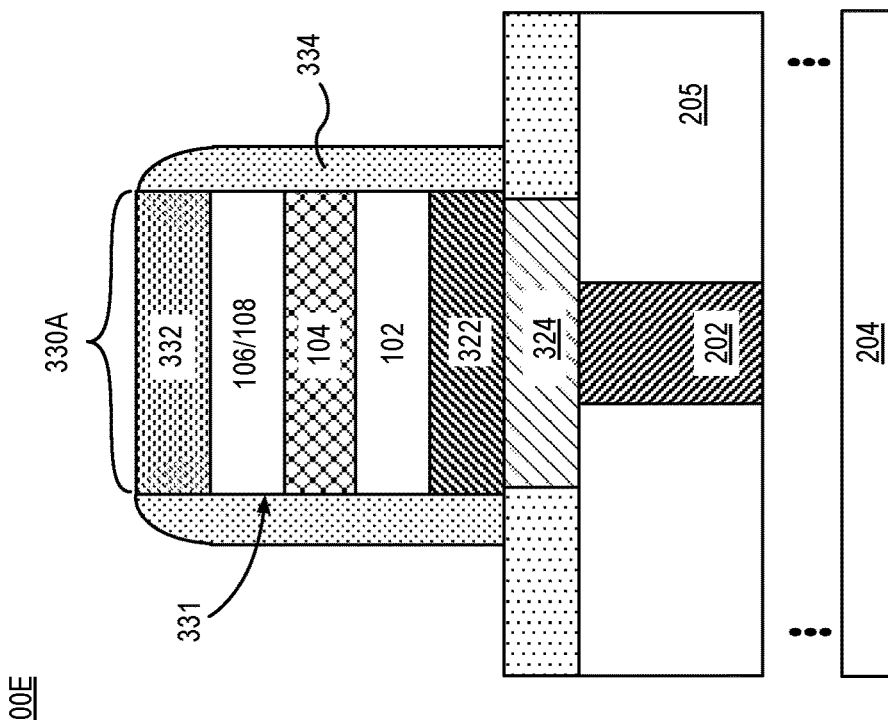
FIG. 3E is a cross-sectional illustration of a planar capacitor including upper and lower hydrogen barrier layers in accordance with an embodiment of the present disclosure.

FIG. 3E is a cross-sectional illustration of device structure 300E, including planar capacitor 330A that includes conductive hydrogen barrier 322 between electrode structure 324 and electrode 102 as part of the capacitor structure. In the illustrative embodiment, planar capacitor 330A includes components of memory device 100A or 100B such as electrode 102, dielectric layer 104 and electrode 106 or 108 and conductive hydrogen barrier 332 on electrode 106 or 108. Conductive hydrogen barrier 332 on electrode 106 or 108 enables utilization of spacer 334 on sidewalls 331 of planar capacitor 330A. In some embodiments, spacer 334 includes a material that is the same or substantially the same as the material of encapsulation layer 212 (FIG. 2A). In other embodiments, a metal hardmask may be present on conductive hydrogen barrier 332 to facilitate fabrication of planar capacitor 330A.

FIG. 3F is a cross-sectional illustration of device structure 300F, including planar capacitor 330B that includes conductive oxygen barrier layer 328 between electrode structure 206 and electrode 102. As shown, conductive oxygen barrier layer 328 extends on an entire surface of conductive hydrogen barrier 210. In the illustrative embodiment, planar capacitor 330B includes components of memory device 100A or 100B such as electrode 102, dielectric layer 104 and electrode 106 or 108 and electrode structure. Conductive hydrogen barrier 332 on electrode 106 or 108 enables utilization of spacer 334 on sidewalls 333 of planar capacitor 330B. In some such embodiments, spacer 334 need not be on conductive hydrogen barrier 332. In some embodiments, spacer 334 includes a material that is the same or substantially the same as the material of encapsulation layer 212 (FIG. 2A). In other embodiments, a metal hardmask may be present on conductive hydrogen barrier 332 to facilitate fabrication of planar capacitor 330B.

FIG. 4A is an isometric illustration of system 400A that includes memory device structure 401 coupled with transistor 402. Memory device structure 401 is coupled to transistor through via 403. In the illustrative embodiment, transistor 402 is an example of non-planar transistor 402. Transistor 402 may be, for example, an NMOS or a PMOS transistor. In an embodiment, transistor 402 includes gate structure 404, between source region 406 and drain region 408. In the illustrative embodiment, source region 406 includes epitaxial source structure 410 (herein source structure 410), and drain region 408 includes epitaxial drain structure 412 (herein drain structure 412). Source structure 410 and drain structure 412 are separated from gate structure 404 by spacer 414 and have faceted sidewall surfaces as shown. In the illustrative embodiment, a portion of gate structure 404 is on dielectric 416 that separates gate structure 404 from substrate 418. In the illustrative embodiment, via 403 is coupled to drain structure 412.

Memory device structure 401 may be, for example, of any device structures 200A, 200B, 300A, 300B, 300C or 300D. Depending on embodiments, memory device 420 can be a planar capacitor such as memory device 100A, 100B, 100C, 100D, 330A or 330B, or a trench capacitor such as trench capacitor 302A or 302B, 320A or 320B. When memory device structure 401 is device structure 300C or 300D, electrode structure 206 may be replaced by electrode structure 324 (as described in FIG. 3A). While memory device structure 401 is electrically coupled with via 403, there may be intervening layers of secondary via electrodes between via 403 and conductive interconnect 202. In some embodiments, conductive interconnect 202 is directly on via 403.

FIG. 4B is a cross-sectional illustration through the line A-A' of the structure in FIG. 4A. Transistor 402 is a further example of a bulk non-planar transistor where channel 422 is below the gate. Channel 422 is part of fin structure 418A that is connected with substrate 418. Source structure 410 and drain structure 412 are epitaxial to fin structure 418A.

As shown, gate structure 404 further includes gate dielectric layer 405 and gate electrode 407. Gate dielectric layer 405 has a base portion on channel 422 and sidewall portions that are adjacent to spacer 414. Gate electrode 407 is confined within gate dielectric layer 405.

In an embodiment, the gate dielectric includes a suitable gate dielectric such as but not limited to an oxide of one or more Si, Hf, Zr, La, Ti, Ta, Ga, or Al, such as, for example, $SiO_2$, $HfO_2$, $ZrO_2$, $HfSiO_x$, $HfZrO_2$, $Ta_2O_5$, $Al_2O_3$, $La_2O_3$, $TaSiO_x$, or $Ga_2O_5$. Gate electrode 407 may include one or more of Ti, Al, W, Pt, Co, Ni, or Pd; nitrogen and one or more of Ti, Ta, Al, Hf, or Zr; carbon, and one or more of Ti, Al, Ta, Hf, or Zr. The epitaxial source structure 410 and epitaxial drain structure 412 may include amorphous Si, SiC, SiGe, or Ge, and doped with As, P, or B, depending on the mobile charge carrier required. In some embodiments, spacer 414 includes silicon nitride or silicon nitride doped with carbon. In some embodiments, via 403 includes a conductive material such as Ru, Ti, Co, Mo, Co, Ni, W or Ta, or nitrides of Ti, W, or Ta. In other embodiments, via 403 includes a liner layer including TiN, TaN, WN, and a fill metal including one or more of Ru, Ti, Co, Mo, Co, Ni, W, or Ta.

Figure 4C:
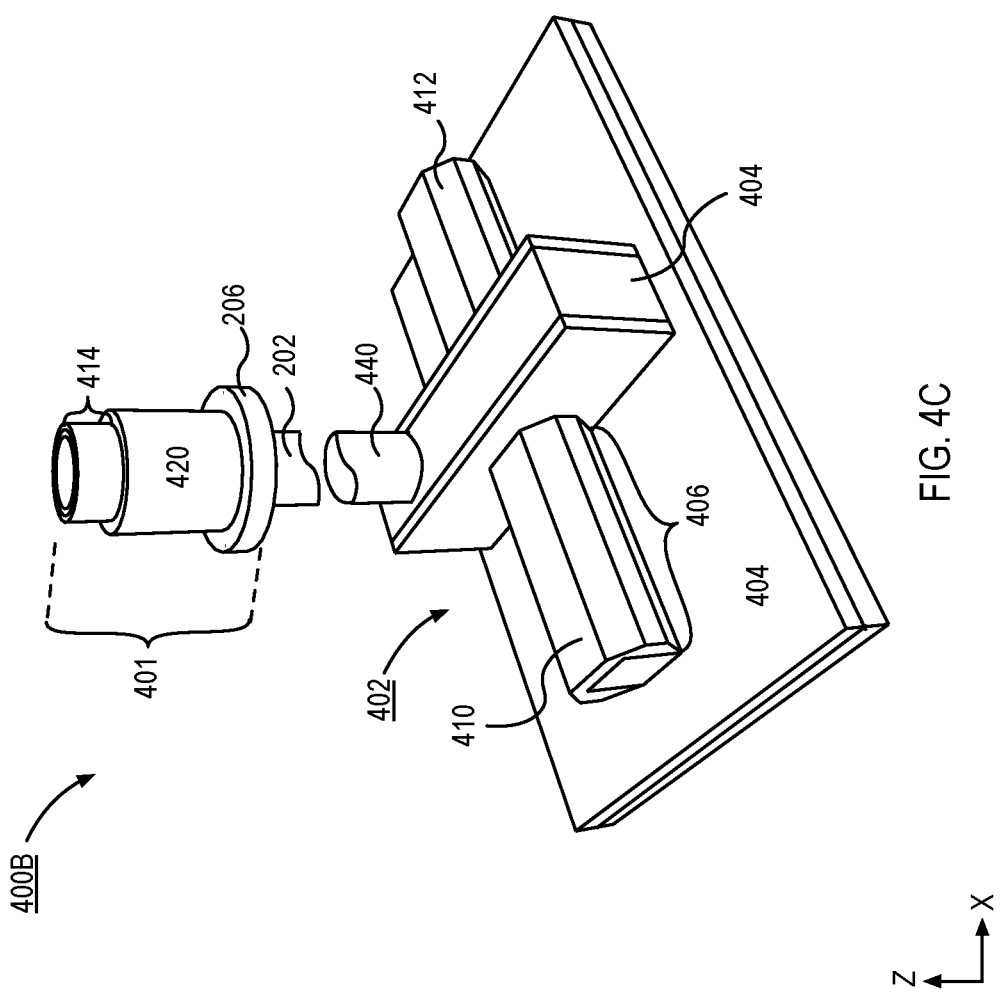
FIG. 4C is an isometric illustration of a capacitor coupled with a gate of a transistor, in accordance with an embodiment of the present disclosure.

In other examples, memory device structure 401 can be coupled with the gate terminal of a transistor. FIG. 4C is a cross-sectional illustration of system 400B that includes memory device structure 401 that is coupled with gate structure 404. In the illustrative embodiment, memory device structure 401 is coupled to the transistor through via 440. As shown, via 440 is coupled with a portion of the gate away from the fin structure (not visible).

In embodiments, via 440 includes a material that is the same or substantially the same as the material of via 403 (FIG. 4A). While memory device structure 401 is electrically coupled with via 440, there may be intervening layers of secondary via electrodes between via 440 and conductive interconnect 202. In some embodiments, conductive interconnect 202 is directly on via 440.

In embodiments where device structure is coupled with the gate structure 404, the memory device 420 includes a dielectric layer that further includes a paraelectric material. Paraelectric materials may include: SrTiO3, Ba(x)Sr(y)TiO3 (where x is −0.05, and y is 0.95), HfZrO2, Hf—Si—O, La-substituted PbTiO3, or a PMN-PT based relaxor ferroelectrics. In some embodiments, dielectric layer including paraelectric materials can range between 1 nm to 30 nm in total thickness.

Figure 5:
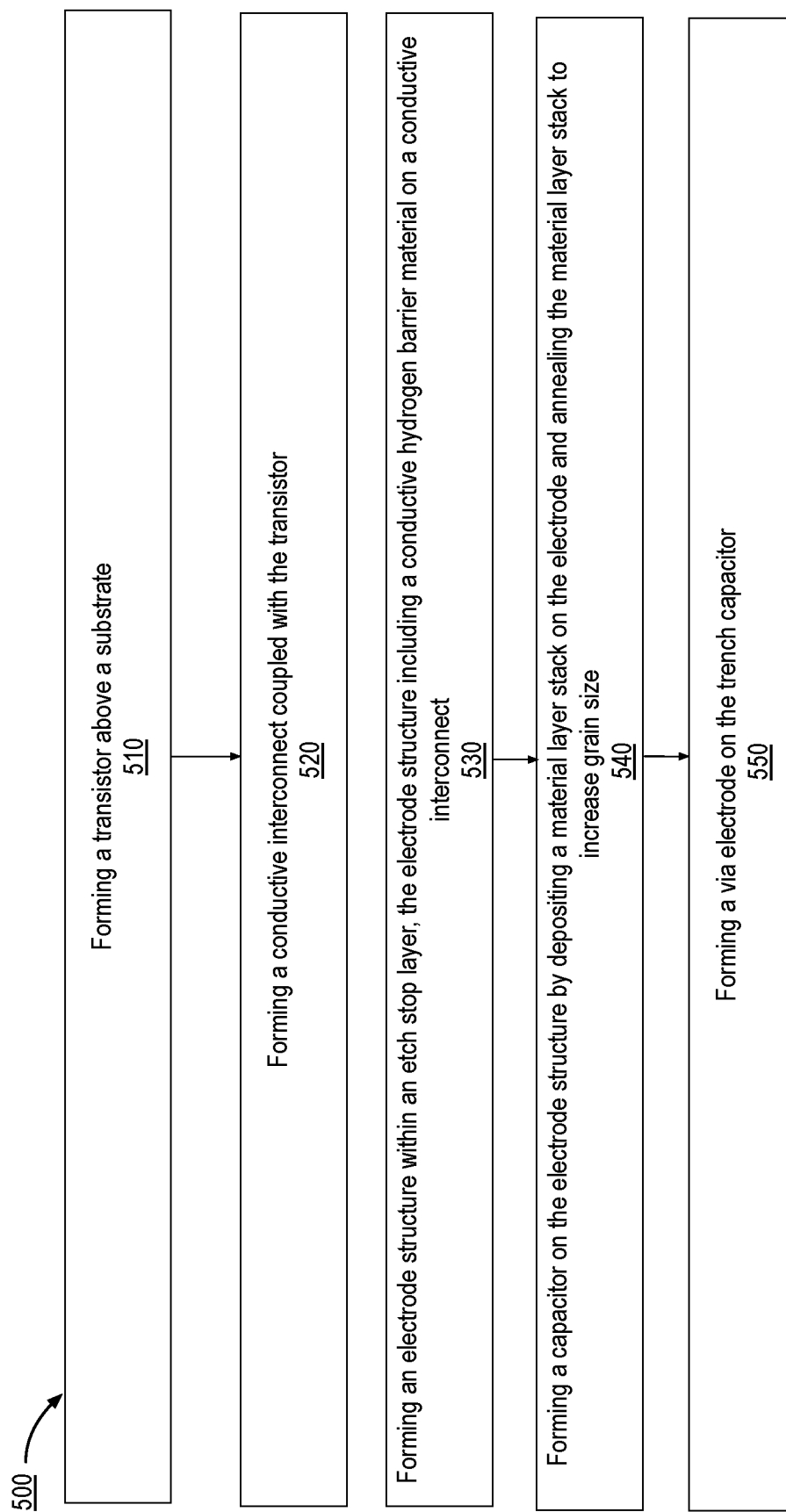
FIG. 5 is a flow diagram of a method of making the structure in FIG. 4A in accordance with an embodiment of the present disclosure.

FIG. 5 is a flow diagram for method 500 to fabricate a capacitor device coupled with a transistor. Method 500 begins at operation 510 with the forming of a transistor above a substrate. The method continues at operation 520 with the formation of a conductive interconnect that is coupled with the transistor. The method continues at operation 530 with the formation of an electrode structure including a conductive hydrogen barrier on the conductive interconnect. The method continues at operation 540 with the formation of a capacitor coupled with the electrode structure by depositing a material layer stack and annealing the material layer stack. Annealing will increase grain size in a perovskite based material. The method concludes at operation 550 with the forming of a via electrode on the trench capacitor.

Method 500 outlines a method to fabricate both planar and non-planar capacitors. Examples of planar capacitors include devices where each layer within the capacitor extends on a single plane. Examples of non-planar capacitor include trench capacitors. Methods to anneal the material layer stack are described below.

FIG. 6A is a cross-sectional illustration of a fin structure, herein fin 600, formed on substrate 418. In an embodiment, mask 601 is formed on substrate 418. An etch process may be utilized to etch the material of substrate 418 to form fin 600. In some embodiments, fin 600 may be substantially vertical as is shown. In an embodiment, mask 601 includes a dielectric material. Mask 601 may be patterned into a plan view shape and size of fin 600 by forming a lithographic pattern on the dielectric material. In an embodiment, substrate 418 includes silicon, silicon germanium, germanium, or a suitable material that can be utilized to pattern and dope to form source and drain structures applicable for a transistor.

FIG. 6B is an isometric illustration of the structure in FIG. 6A following the process to form dielectric 416 adjacent to a portion of fin 600. In an embodiment, dielectric 418 is blanket deposited on mask 601 (not shown), on sidewalls of fin 600 and on substrate 418. Dielectric 416 is planarized post deposition. In some embodiments, the planarization process includes a chemical mechanical planarization process (CMP). The CMP process removes the mask from above fin 600. Dielectric 416 is then recessed to obtain a desired height of fin 600. ielectric 416 provides electrical isolation for portions of a gate electrode to be formed.

FIG. 6C is an isometric illustration of the structure in FIG. 6B following the formation of dummy gate 604 on fin 600. In an embodiment, dummy gate dielectric layer 606 is deposited on fin 600 and on dielectric 416. In an embodiment, dummy gate dielectric layer 606 is grown by a plasma enhanced chemical vapor deposition (PECVD) process. In some embodiments, dummy gate dielectric layer 606 includes silicon dioxide.

A dummy gate material is blanket deposited on dummy gate dielectric layer 606. In an embodiment, the dummy gate material includes a chemical vapor deposition process to deposit a material such as polysilicon, amorphous silicon or silicon germanium. The deposition process may take place at temperatures of approximately 600 degrees C. or less. In some embodiments, such as is shown, a planarization process may be performed to planarize the dummy gate material after deposition.

A mask material is deposited on the dummy gate material. In an embodiment, the mask material includes a silicon nitride or a silicon oxynitride. The mask material is patterned by a lithographic process and etched by a plasma etch process to form hardmask 608. Hardmask 608 is subsequently utilized to etch the dummy gate material to form dummy gate 604. The process to form dummy gate 604 includes removing the dummy gate material from sidewalls of fin 600. Dummy gate dielectric layer 606 protects fin 600 during the etch process. Dummy gate dielectric layer 606 is removed from surfaces of fin 600 after formation of dummy gate 604.

After formation of dummy gate 604, a spacer 414 is formed on sidewalls of dummy gate 604. In an embodiment, an encapsulation layer is blanket deposited on fin 600, and on dummy gate 604. The encapsulation layer is then etched to form spacer 414 on sidewalls of dummy gate 604. The encapsulation layer maybe removed from sidewalls of fin 600 by a masking and etching process so that spacer 414 is substantially formed on sidewalls of dummy gate 604. It is to be appreciated that the encapsulation layer is removed from sidewalls 600A of fin 600.

Figure 6E:
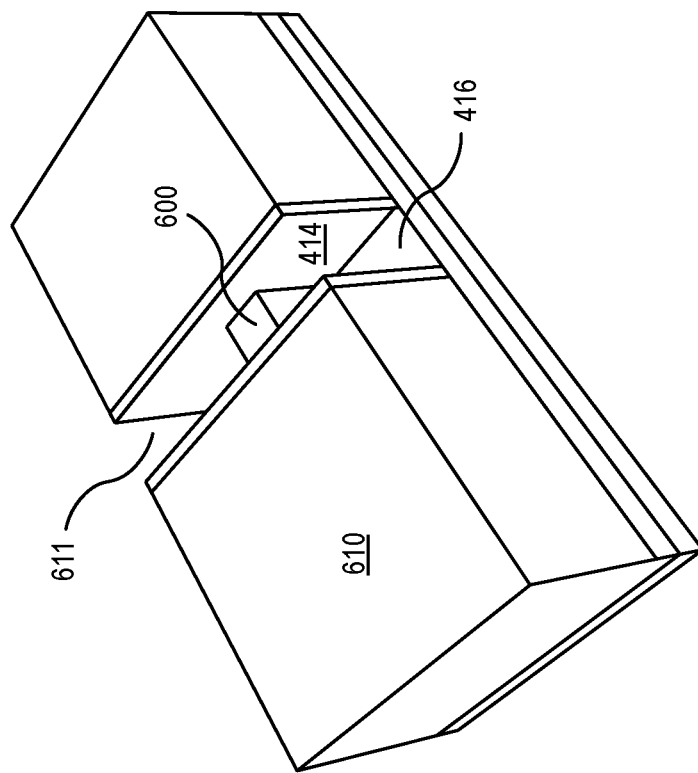
FIG. 6E is an isometric illustration of the structure in FIG. 6D following the process to remove the mask, dummy gate, and dummy gate dielectric to form a gate opening.
Figure 6D:
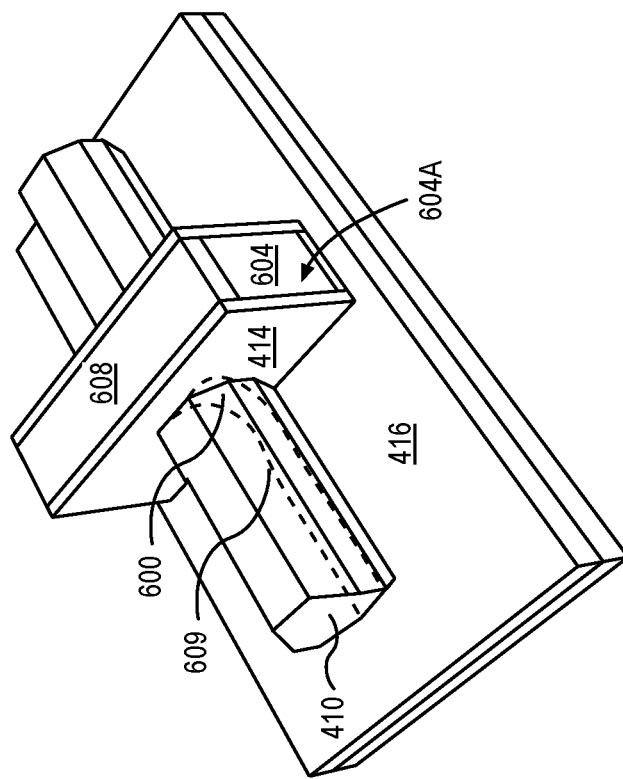
FIG. 6D is an isometric illustration of the structure in FIG. 6C following the process to form an epitaxial source structure and an epitaxial drain structure.

FIG. 6D is an isometric illustration of the structure in FIG. 6C following the process to form epitaxial source structure 410 and epitaxial drain structure 412. In an embodiment, portions of fin 600 are etched and removed. In an embodiment, the shape of fin 600 is indicated by dashed lines 609.

An epitaxial growth process is utilized to selectively grow epitaxial source structure 410 and epitaxial drain structure 412 on fin 600 as shown. In various embodiments, epitaxial source structure 410 and epitaxial drain structure 412 are grown to have faceted sidewalls. Dopants may be inserted during the growth process or implanted at a later operation. Spacer 414 and hardmask 608 prevents any epitaxial growth from taking place on dummy gate 604. It is to be appreciated that while sidewall 604A of dummy gate 604 is exposed for illustrative purposes, spacer 414 encapsulates all vertical sidewalls of dummy gate 604. The epitaxial growth process may be carried out at temperatures between 400-700 degrees Celsius to grow doped Si, amorphous silicon or SiGe-source structure 410 and drain structure 412.

FIG. 6E is an isometric illustration of the structure in FIG. 6D following the process to remove the mask, dummy gate, and dummy gate dielectric. In an embodiment, dielectric 610 is blanket deposited on epitaxial source structure 410 and epitaxial drain structure 412, on dielectric 416, spacer 414 and mask. Dielectric 610 may include a material such as silicon oxide and may be deposited by a PECVD or a PVD process. In an embodiment, dielectric 610 is planarized by a CMP process. In some embodiments, the CMP process may remove the mask. In other process an etch process may be utilized to remove the mask and portions of the dummy gate. In other embodiments, a wet chemical process is utilized to selectively remove the dummy gate, as well as the dummy gate dielectric selective to dielectric 416, spacer 414 and fin 600. The process of removing the dummy gate forms opening 611.

Figure 6F:
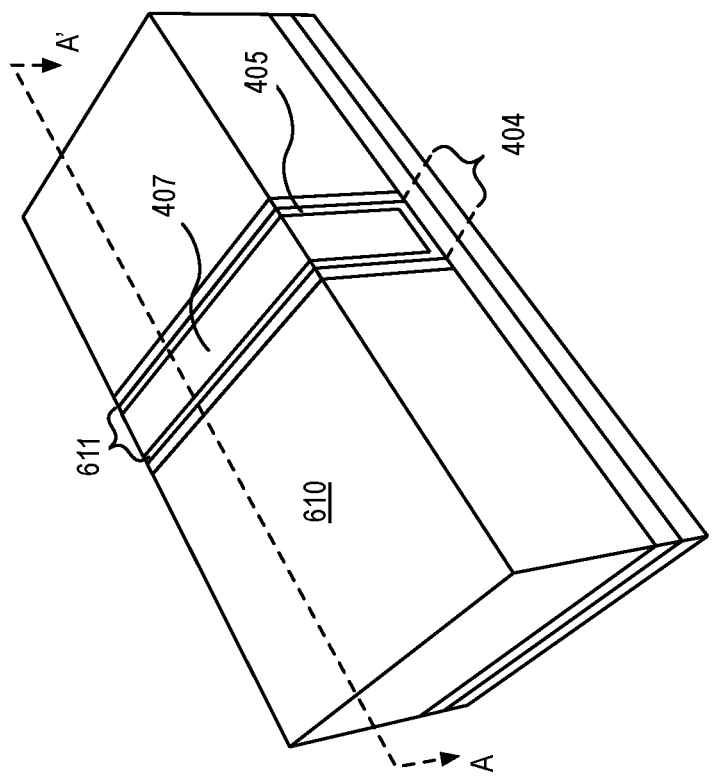
FIG. 6F is a cross-sectional illustration of the structure in FIG. 6E following the process to form a gate structure in the gate opening.

FIG. 6F is a cross-sectional illustration of the structure in FIG. 6E following the process to form gate structure 404 in opening 611. In an embodiment, gate dielectric layer 405 is blanket deposited after a high temperature process to grow epitaxial source structure 410 and epitaxial source structure 412. In an embodiment, an atomic deposition process is utilized to deposit gate dielectric layer 405 on the fin (not shown), on sidewalls of the spacer and on dielectric 416 in opening 611. Depending on a MOS characteristic, a PMOS or an NMOS material to form gate electrode 407 is deposited on gate dielectric layer 405. Depending on material utilized and size of transistor gates desired, a variety of different deposition processes can be utilized. For example, processes may include PVD, CVD or ALD processes. After deposition a planarization process is performed to remove the excess material of gate electrode 407 and gate dielectric layer 405 from above the spacer and dielectric 610.

Figure 7:
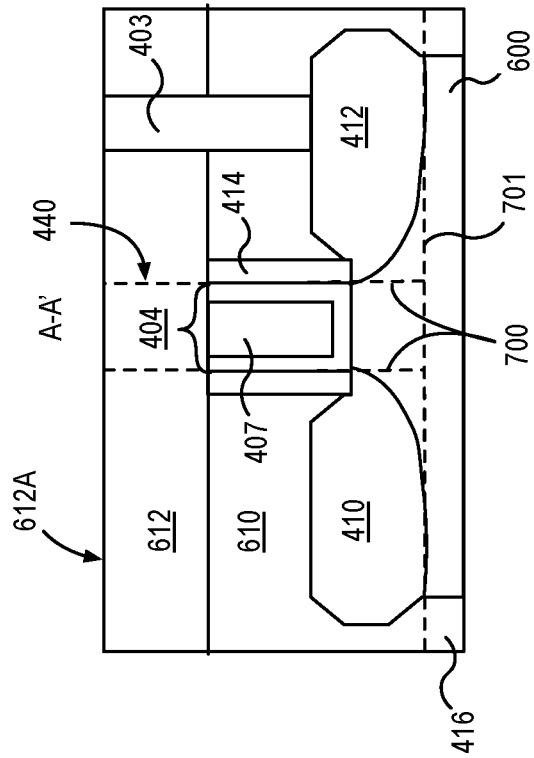
FIG. 7 is a cross-sectional illustration of the structure in FIG. 6F through a line A-A' following the process to form a via electrode on a drain structure.

FIG. 7 is a cross-sectional illustration of the structure in FIG. 6F through a line A-A' following the process to form via 403 on drain structure 412. The line A-A' corresponds to a line through fin 600 and the illustration depicts a portion of gate electrode 407 on fin 600. Dashed lines 700 denote extensions of gate electrode 407 on dielectric 416 (below dashed line 701). In the illustrative embodiment, dielectric 612 is blanket deposited on dielectric 610, on spacer 414 and on gate structure 404. In an embodiment, dielectric 612 includes a material that is the same or substantially the same as the material of dielectric 610. Dielectric 612 may be deposited by a PECVD or a CVD process.

A mask is formed on dielectric 612, and an opening is formed in dielectric 612 and in dielectric 610 to expose epitaxial drain structure 412. A conductive fill material is deposited into the opening and removed via planarization from uppermost surface 612A to fabricate via 403.

In an embodiment, gate contact 440 is formed on the gate as indicated by dashed lines. In some embodiments, gate contact 440 can be formed by etching dielectric 612 and depositing materials that are the same or substantially the same as the material of drain contact 403.

Figure 8:
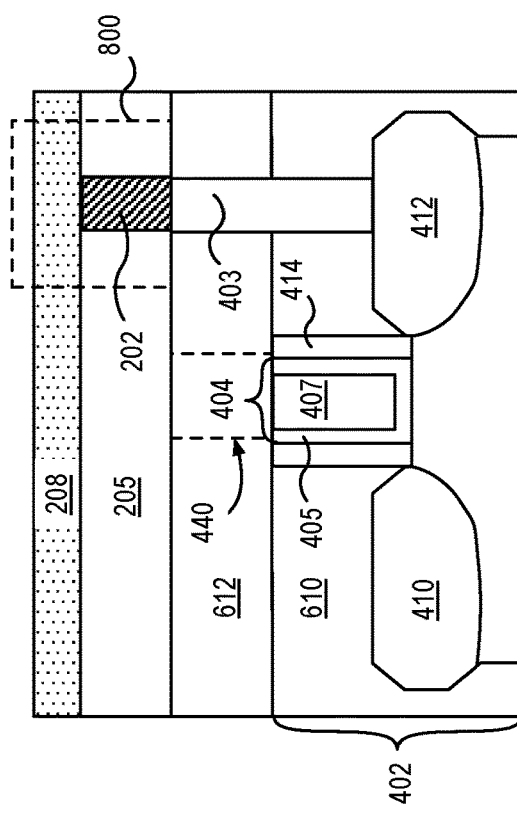
FIG. 8 is a cross-sectional illustration of the structure in FIG. 7 following the process to form a conductive interconnect to couple with the via electrode followed by the process to deposit an etch stop layer.

FIG. 8 is a cross-sectional illustration of the structure in FIG. 7 following the process to form conductive interconnect 202 to couple with via 403 followed by the process to deposit etch stop layer 208. In an embodiment, dielectric 205 is deposited on dielectric 612 by a PECVD, PVD, or a CVD process. An opening is formed in dielectric 205 by masking and etching dielectric 205. Material of conductive interconnect 202 is deposited into dielectric 205 and on uppermost surface 205A of dielectric 205. The material of conductive interconnect 202 is removed from uppermost surface 205A by a planarization process. The process is further continued with deposition of an etch stop layer 208 on dielectric 205 and on conductive interconnect 202.

In some embodiments, conductive interconnect 202 is formed on gate contact 440.

An electrode structure is then formed above conductive interconnect 202. The process of forming an electrode structure within portion 800 is described below.

Figure 9A:
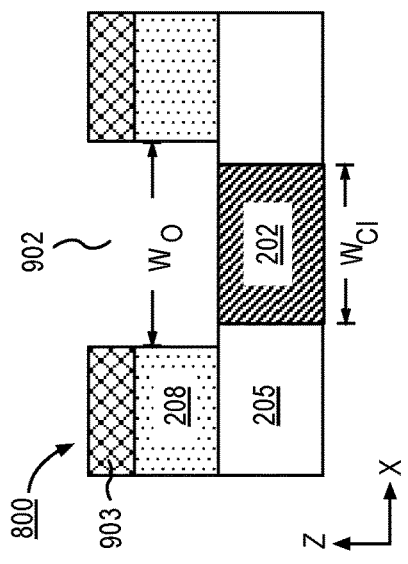
FIG. 9A is a cross-sectional illustration of a portion of the structure in FIG. 8 following the process to etch openings in etch stop layer to form an electrode structure.

FIG. 9A is a cross-sectional illustration of a portion 800 of the structure in FIG. 8 following the process to etch opening 902 in etch stop layer 208 to form an electrode structure. In an embodiment, photoresist mask 903 is formed by a lithographic process on etch stop layer 208. Exposed portions of etch stop layer 208 may be etched by a plasma etch process through opening in photoresist mask 903. In the illustrative embodiment, opening 902 has lateral thickness $W_O$. $W_O$ may be narrower, equal to, or wider than $W_{CI}$ of conductive interconnect 202. In the illustrative embodiment, $W_O$ is greater than $W_{CI}$.

Figure 9C:
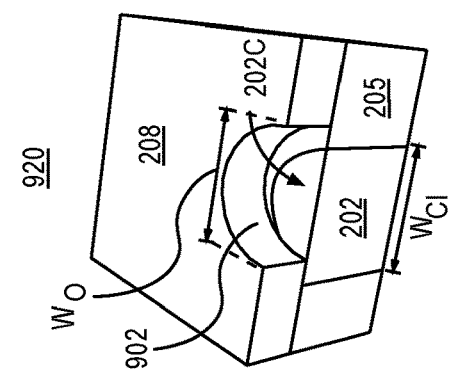
FIG. 9C is an isometric illustration of an opening in the etch stop layer, in accordance with an embodiment of the present disclosure.
Figure 9B:
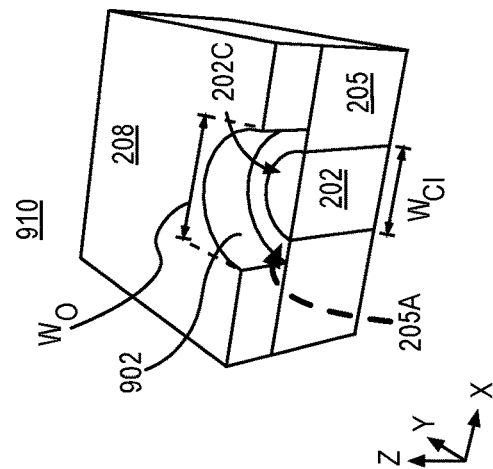
FIG. 9B is an isometric illustration of an opening in the etch stop layer, in accordance with an embodiment of the present disclosure.

Shape of openings 902 may be circular or rectangular and the conductive interconnects may be discrete islands or a line straddling the drain structure, depending on embodiments. FIGS. 9B-9C illustrate embodiments of structures 910 and 920 of the conductive interconnect 202 and opening 902 within portion 800 in FIG. 9A. Photoresist mask 903 is removed for clarity.

FIG. 9B is an isometric illustration of structure 910, in accordance with an embodiment of the present disclosure. A cross section through opening 902 is illustrated. In the illustrative embodiment, conductive interconnect 202 is cylindrical, where $W_{CI}$ is less than $W_O$ (for example diameter) of opening 902. As shown opening 902 is circular and $W_o$ may be, for example, a diameter of opening 902. In other embodiments, opening 902 can be rectangular. Dielectric 205 is exposed during formation of opening 902 when $W_{CI}$ is less than $W_O$, as shown. In the illustrative embodiment, uppermost surface 202C of conductive interconnect 202 is co-planar or substantially co-planar with uppermost surface 205A of dielectric 205.

In some embodiments, opening 902 may be offset relative to interconnect 202, as is illustrated in structure 920 in FIG. 9B. Such an offset may be a result of misalignment between photoresist mask and interconnect 202. The method adopted to fabricate an electrode structure within opening 902 is not impacted by misalignment as long as at least 50% of opening 902 exposes uppermost surface 202C of interconnect 202. Misalignment does not enable hydrogen to diffuse through to a memory device (to be fabricated in a downstream operation).

FIG. 10A-10B are cross-sectional illustrations depicting a method to fabricate an electrode structure having a conductive hydrogen barrier above a fill metal.

FIG. 10A is a cross-sectional illustration of the structure in FIG. 9A following the formation of conductive fill material within opening 902, in accordance with an embodiment of the present disclosure. In an embodiment, conductive fill material 211 is blanket deposited into opening 902, and on etch stop layer 208.

FIG. 10B is a cross-sectional illustration of the structure in FIG. 10A following the process to form conductive fill material 211 within a portion of opening 902 on etch stop layer 208. In an embodiment, portions of conductive fill material 211 on uppermost surface 208A of etch stop layer 208 are removed by a planarization process leaving conductive fill material 211 within opening 902. In an embodiment, a wet chemical process is utilized to recess conductive fill material 211 below uppermost surface 208A. In an embodiment, level of recess of conductive fill material 211 relative to uppermost surface 208A will depend on $T_L$ and on a desired thickness of the conductive hydrogen barrier to be formed. In some embodiments, conductive fill material 211 is recessed relative to uppermost surface 208A by up to half of $T_L$. In some embodiments, uppermost surface 211A of conductive fill material 211 is concaved due to wet chemical recess as indicated by dashed lines 1001.

FIG. 10C is a cross-sectional illustration of the structure in FIG. 10B following the process to form conductive hydrogen barrier 210 on conductive fill material 211. In an embodiment, a conductive hydrogen barrier layer is blanket deposited on conductive fill material 211 and on etch stop layer 208. A planarization process may be utilized to remove an excess conductive hydrogen barrier material layer from above etch stop layer 208. In an embodiment, the planarization process includes a chemical mechanical polish (CMP) process. The CMP process forms conductive hydrogen barrier 210 within opening 902.

In the illustrative embodiment, electrode structure 206 includes conductive hydrogen barrier 210 above conductive fill material 211, where conductive hydrogen barrier 210 prevents hydrogen from diffusing towards a memory device to be formed above. Depending on embodiments, electrode structure 206 has a width that can be greater than or less than a width of a memory device to be formed on electrode structure 206. In either embodiment, conductive hydrogen barrier 210 can effectively prevent hydrogen from diffusing towards the memory device.

FIG. 11A is a cross-sectional illustration of the structure in FIG. 9A following the process to deposit one or more electrode materials on conductive interconnect 202 and on etch stop layer 208. In an embodiment, layer of conductive hydrogen barrier material 1100 is deposited in opening 902, on sidewalls of etch stop layer 208 and on conductive interconnect 202. In the illustrative embodiment, conductive hydrogen barrier material 1100 is also deposited on exposed portions of dielectric 205.

FIG. 11B is a cross-sectional illustration of the structure in FIG. 11A following the deposition of a fill material in the remaining portions of opening 902 and on conductive hydrogen barrier material 1100. Conductive fill material 1102 is deposited on conductive hydrogen barrier material 1100. In embodiments conductive fill material 1102 includes tantalum, titanium, ruthenium, or tungsten and may be deposited by a PVD, PECVD, or an ALD process. In some embodiments, conductive fill material 1102 includes copper and may be deposited by an electroplating process.

FIG. 11C is a cross-sectional illustration of the structure in FIG. 11B following the process to planarize conductive fill material 1102 and conductive hydrogen barrier material 1100. In an embodiment, the planarization process includes a chemical mechanical planarization (CMP) process. The CMP process removes conductive fill material 1102 and conductive hydrogen barrier material 1100 from uppermost surface 208A of etch stop layer 208. The planarization process isolates conductive hydrogen barrier material 1100 and conductive fill material 1102 to form electrode structure 1104. In an exemplary embodiment, conductive hydrogen barrier material 1100 includes a material that is the same or substantially the same as the material of conductive hydrogen barrier 210. In an exemplary embodiment, conductive fill material 1102 includes a material that is the same or substantially the same as the material of conductive fill material 211.

Figure 12B:
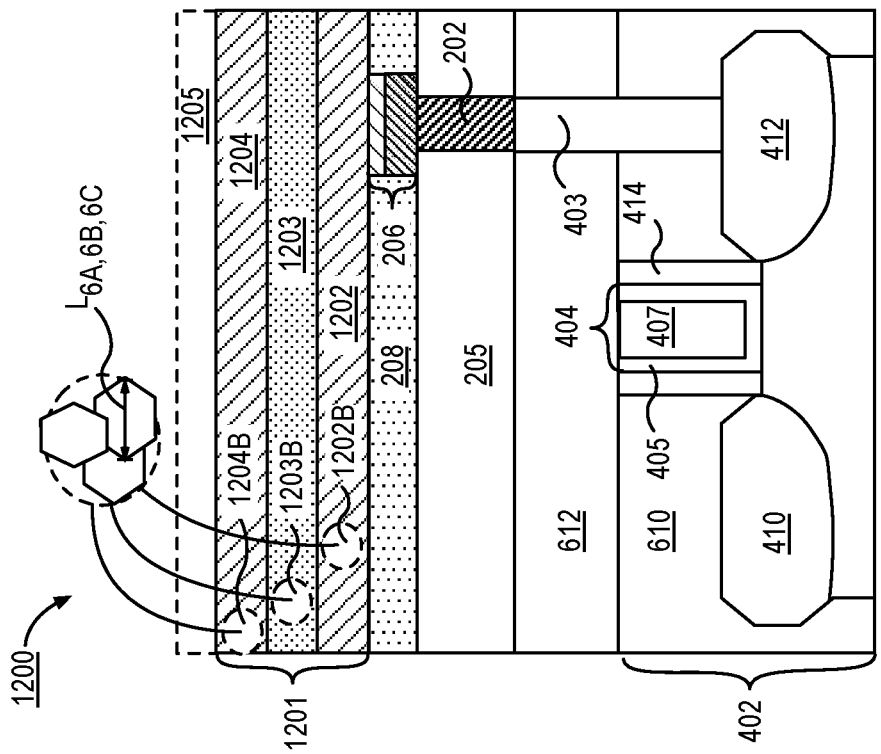
FIG. 12B is a cross-sectional illustration of a structure in FIG. 12A following a process to perform a post deposition anneal, in accordance with embodiments of the present disclosure.
Figure 12A:
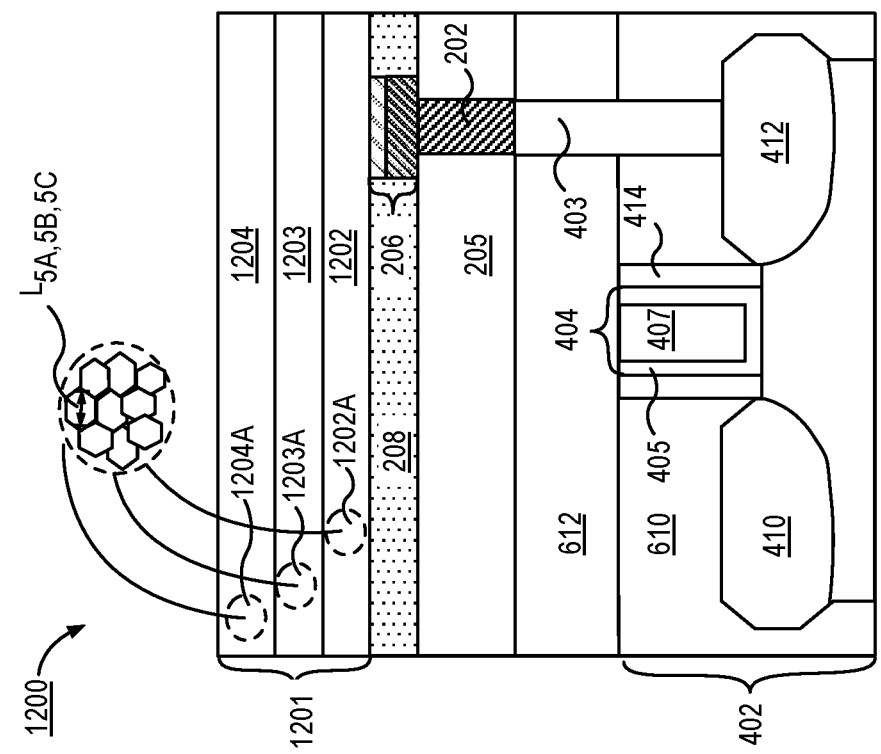
FIG. 12A is a cross-sectional illustration of the structure in FIG. 11C following the process to form a material layer stack on the electrode structure and on the etch stop layer.

FIG. 12A is a cross-sectional illustration of a structure 1200 following the process to form material layer stack 1201 on electrode structure 206 and on etch stop layer 208 of the structure in FIG. 11C.

The process to form material layer stack 1201 includes blanket deposition of at least three material layers, where the number further depends on a type of memory device to be fabricated. In some embodiments, material layer stack 1201 includes deposition of layers for a ferroelectric memory device. In other embodiments, material layer stack 1201 includes deposition of layers for a paraelectric memory device.

In an embodiment, individual layers of material layer stack 1201 (for a ferroelectric memory device) are deposited in situ, i.e., without breaking vacuum. Material layer stack 1201 may be deposited by an atomic layer deposition (ALD) process, a plasma enhanced chemical vapor deposition (PECVD), chemical vapor deposition (CVD), a physical vapor deposition (PVD) process, or a combination thereof. In embodiments, the ALD process may be performed at a process temperature between 160 degrees C. and 400 degrees C., the PVD process may be performed a process temperature between 23 degrees C. (room temperature) and 400 degrees C., and the CVD process may be performed at a process temperature between 160 degrees C. and 400 degrees C.

In some embodiments, conductive layer 1202 is blanket deposited on electrode structure 206 and on etch stop layer 208. In an embodiment, conductive layer 1202 includes a conductive ferroelectric oxide. The conductive ferroelectric oxide includes one of a non-Pb perovskite metal oxides, such as but not limited to, La—Sr—CoO$_3$, SrRuO$_3$, La—Sr—MnO$_3$, YBa$_2$Cu$_3$O$_7$, Bi$_2$Sr$_2$CaCu$_2$O$_8$, or LaNiO$_3$.

Conductive layer 1202 is deposited to thickness, T$_1$, that is suitable for minimizing electrical resistance and to minimize tapering of sidewalls during a patterning process that will be utilized to fabricate memory devices. In some embodiments, conductive layer 1202 has a thickness that is between 3 nm and 30 nm. A thickness of less than 30 nm is highly desirable to prevent significant tapering in sidewalls during the patterning process.

In an embodiment, the deposition process is continued by deposition of dielectric layer 1203 (for example, ferroelectric dielectric layer 1203 for a ferroelectric memory device). Dielectric layer 1203 may be blanket deposited on conductive layer 1202. Dielectric layer 1203 has thickness T$_2$, that is between 1 nm and 30 nm. In some embodiments, dielectric layer 1203 includes non-Pb Perovskite material in the form ABO$_3$, where A and B are two cations of different sizes and O is oxygen. A is generally larger than B in size. In some embodiments, non-Pb Perovskites can also be doped, e.g., by La or Lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti, and Ni.

In other embodiments, dielectric layer 1203 includes a low voltage ferroelectric material sandwiched between the conductive oxide layers (806A and 806C). Low voltage materials can be of the form AA'BB'O$_3$, where A' is a dopant for atomic site A and can be an element from the Lanthanides series and B' is a dopant for atomic site B and can be an element from the transition metal elements such as Sc, Ti, V, Cr, Mn, Fe, Co, Ni, Cu, and Zn. A' may have the same valency of site A, with a different ferroelectric polarizability. A voltage below 3 Volts is sufficiently low to be characterized as low voltage.

The deposition process is continued with a deposition of conductive layer 1204 on dielectric layer 1203. In an exemplary embodiment, conductive layer 1204 includes a material that is the same or substantially the same as the material of conductive layer 1202. When conductive layer 1202 and conductive layer 1204 include a same material, material layer stack 1201 is symmetric. In different embodiments, conductive layer 1204 can have a different thickness than conductive layer 1202. In embodiments, conductive layer 1204 is deposited to thickness $T_3$, between 3 nm and 30 nm. Conductive layer 1204 between 3 nm and 30 nm can facilitate the patterning process.

In various embodiments, the as deposited grain size of conductive layers 1202 and 1204 is less than 15 nm. Grain size refers to an average length of a longest dimension of a grain. In the illustrative embodiment, grain length $L_{5A}$ of grains 1202A in conductive layer 1202 is between 1 nm-14 nm. In some embodiments, $L_{5A}$ is between 1 nm and 5 nm. In other embodiments, $L_{5A}$ is between is above 5 nm but less than 15 nm as deposited. In various embodiments grain length $L_{5B}$ of grains 1203A of dielectric layer 1203 is less than 15 nm. In some embodiments, $L_{5B}$ is between 1 nm and 5 nm. In other embodiments, $L_{5B}$ is between is above 5 nm but less than 15 nm as deposited. In the illustrative embodiment, grain length $L_{5C}$ of grains 1204A in conductive layer 1204 is between 1 nm-14 nm. In some embodiments, $L_{5C}$ is between 1 nm and 5 nm. In other embodiments, $L_{5C}$ is between is above 5 nm but less than 15 nm as deposited.

In various embodiments, point defects in conductive layers 1202 and 1204, that are as deposited but not annealed, is greater than 1e22 atoms/cm$^3$.

In some embodiments, such as is indicated, the deposition process concludes with the formation of capping layer 1205 on conductive layer 1204. In some embodiments, capping layer 1205 is blanket deposited by a PECVD, CVD or PVD process. In an embodiment, capping layer 1205 includes a material that has a favorable etch selectivity compared to the ferroelectric materials in material layer stack 1201. In other embodiments, capping layer 1205 includes a conductive material that is different from the conductive material of the ferroelectric material. In a different embodiment, capping layer 1205 includes a bilayer where the bilayer includes a metallic layer and a dielectric on the metallic layer. In some such embodiments, the dielectric can be patterned with high fidelity and includes for example, $SiO_2$, $Si_3N_4$, DLC (Diamond Like Carbon) or $Al_2O_3$.

In an embodiment, dielectric layer 1203 includes paraelectric materials. Paraelectric materials may include SrTiO3, Ba(x)Sr(y)TiO3 (where x is −0.05, and y is 0.95), HfZrO2, Hf—Si—O, La-substituted PbTiO3, or a PMN-PT based relaxor ferroelectric. In some embodiments, material layer stack including paraelectric materials can range from 5 nm to 100 nm in total thickness. In various embodiments, point defects in dielectric layer 1203, that is as deposited but not annealed, is greater than 1e22 atoms/cm$^3$.

FIG. 12B is a cross-sectional illustration of structure 1200 in FIG. 12A following a process to perform a post deposition anneal. A post deposition anneal may be characterized by an anneal after the deposition process, or a post deposition anneal (PDA) is complete in contrast to an in-situ anneal which takes place during deposition. Depending on embodiments the anneal can take place after deposition of all the layers in material layer stack 1201 or at least after the dielectric layer has been deposited. In the illustrative embodiment, a PDA is performed after deposition of material layer stack 1201.

In various embodiments, the anneal temperatures can be as high as 1300 degrees C., where anneal durations are limited to less than or equal to 60 seconds. The specific temperature, time duration is dependent on the annealing technique utilized and a maximum thermal budget that is not impactful to transistor 402. Specifically annealing material layer stack 1201 is performed in a manner to suitably prevent metallurgical reaction between gate dielectric layer 405 and gate electrode 407.

It is to be appreciated that while materials of gate electrode 407 have been deposited at temperatures less than 400 degrees C., atomic diffusion in the vicinity of gate dielectric layer 405 and gate electrode 407 may not occur when PDA is carried out for short time durations. For temperatures of 700 degrees C. and less, a time duration of 60 seconds or less, for example, may be considered to be a short time duration.

In an embodiment, PDA anneal at temperatures less than or equal to 1300 degrees C. has an effect of increasing grain size due to coalescence of smaller grain sizes. The net growth in grain size can be a function of the as deposited thickness. In embodiments, when the deposited thickness of layers in material layer stack 1201 are less than 30 nm thick, PDA at temperatures less than 1300 degrees C., is found to increase grain size to a peak value of approximately 50 nm. It is to be appreciated that the grain size refers to an average length of a grain. PDA does not increase thickness of the as deposited layers.

In the illustrative embodiment, grain length $L_{6A}$ of grains 1202B, after PDA, in conductive layer 1202, is between 15 nm-50 nm. In the illustrative embodiment, grain length $L_{6B}$ of grains 1203B, after PDA, in dielectric layer 1203, is between 15 nm-50 nm. In the illustrative embodiment, grain length $L_{6C}$ of grains 1204B, after PDA, in conductive layer 1204, is between 15 nm-50 nm.

Post deposition rapid thermal annealing may be used to describe any and all thermal annealing treatments where a wafer is heated and cooled at rates faster than is typical in furnace annealing tools. Typically, heating/cooling rates can be in excess of 10 degrees C. per second. In the semiconductor industry, such rapid heating and cooling can be achieved by the use of a variety of technologies. The terms "RTP" or "RTA" are sometimes more narrowly defined to describe the original rapid thermal annealing technique, in which infra-red lamps may be implemented to heat the wafer. More modern techniques use Xenon-lamp based heating (also called "Flash" annealing), laser heating (Laser annealing), and microwave energy (Microwave annealing). Surface temperatures of substrate may be monitored by pyrometer and thermocouples. Such techniques can offer extremely fast heating & cooling rates, such as for example 1 million degrees per second. It is highly desirable for the cooling process to be controlled to prevent dislocations in the various layers.

In some embodiments, post deposition anneal can include one or more of the above techniques. RTP/RTA can be performed at temperatures above >1000 degrees C. However, since the duration is on the order of a minimum of a few seconds, it is preferable to use RTP/RTA for annealing to temperatures <800 degrees C. to avoid damage to underlying structures such as transistor 402.

In some embodiments PDA includes an RTP process is carried out in $O_2$, $N_2$ or Argon environment or in air. Processing pressures range from 1 Torr to 760 Torr while flowing in O2, N2 or Argon gases. In other embodiments, RTP process is carried out in vacuum at pressures less than 1 Torr. In embodiments, processing times range from 1 s-60 s. In various embodiments, processing temperatures range from 400-700 degrees C., where the heating and cooling rate is approximately 40-200 degrees C./s.

In some embodiments PDA includes a flash anneal process. Flash and Laser annealing offer extremely short durations, and thus can allow high temperatures >1000 degrees C. without damaging the underlying structures e.g., transistors, on the wafer. Flash and laser anneal can include spot heating or beam rastering for increased throughput. Processing pressures range from 1 Torr to 760 Torr while flowing in $O_2$, $N_2$, Argon gases, or in air. In other embodiments, flash anneal process is carried out in vacuum at pressures less than 1 Torr. In various embodiments, processing temperatures range from 500-1300 degrees C., where the heating and cooling rate is approximately $10^6$ degrees C. per second. In embodiments, processing times is 1 ms or less.

In some embodiments, PDA includes a laser anneal process. Flash and Laser annealing offer extremely short durations, and thus can allow high temperatures >1000 degrees C. without damaging the underlying structures e.g., transistors, on the wafer. Flash and laser anneal can include spot heating or beam rastering for increased throughput. Processing pressures range from 1 Torr to 760 Torr while flowing in $O_2$, $N_2$, Argon gases, or in air. In other embodiments, flash anneal process is carried out in vacuum at pressures less than 1 Torr. In various embodiments, processing temperatures range from 600-1300 degrees C., where the heating and cooling rate is approximately $10^6$ degrees C. per second. In embodiments, processing times is 100 microseconds or less.

In some embodiments, material layer stack 1201 may be deposited by a PVD process at 350 degrees C., annealed by PD-RTA process in an RTP tool with a 50 degree C. per second heating/cooling rate, in 02 atmosphere at 760 Torr pressure and at 600 degrees C. for 60 seconds.

In some embodiments, material layer stack 1201 may be deposited by an ALD process at 150 degrees C., annealed by PD-RTA process in an RTP tool with a 50 degree C. per second heating/cooling rate, in 02 atmosphere at 760 Torr pressure and at 600 degrees C. for 60 seconds.

In some embodiments, material layer stack 1201 may be deposited by a PVD process at 350 degrees C., annealed by PD-RTA process in a laser annealing tool with a $10^6$ degrees C. per second heating/cooling rate, in vacuum and at 1200 degrees C. for 10 microseconds.

In some embodiments, material layer stack 1201 may be deposited by an ALD process at 150 degrees C., annealed by PD-RTA process in a laser annealing tool with a $10^6$ degrees C. per second heating/cooling rate, in vacuum and at 1200 degrees C. for 10 microseconds.

Point defects such as Oxygen vacancies lead to increased electrical leakage in capacitor layers which is detrimental to FE polarization and switching voltage. Oxygen vacancies and other point defects can also lead to ferroelectric domain-wall pinning. Pinning can manifest in detrimental effects such as increase of the switching voltage, and lead to early endurance failure of FE capacitor devices. PDA techniques described above can lead to reduction in point defects in conductive layers 1202 and 1204, and in dielectric layer 1203 to less than 1e20 atoms/cm³.

When the purpose of PD-RTA is to reduce oxygen vacancies, then deposition of a capping layer such as capping layer 1205 can be performed after the PDA treatment. Capping layer can reduce diffusion of oxygen from an RTA chamber ambient into the perovskite layers.

FIG. 12C is a cross-sectional illustration of the structure in FIG. 12B following the process to etch material layer stack 1201 (and in some embodiments, capping layer 1205). In an embodiment, material layer stack 1201 is etched by a plasma etch process. The plasma etch process may include a discharge produced by a magnetic enhanced reactive ion etching mechanism, an electron cyclotron resonance discharge or an inductively coupled plasma discharge. The plasma parameters maybe characterized by a range of plasma densities such as between 1e9 and 1e12 ions/cm³, pressures in the range of 0.001-10 Torr, and electron temperatures in the range of 1-8 eV. Ions may be accelerated to the surface from a plasma sheath by means of electrostatic chuck with biasing capabilities that are independent of the power delivered to sustain various plasma configurations.

In an embodiment, the plasma etch process is utilized to etch conductive layer 1204 to form electrode 108. In the illustrative embodiment, electrode 108 has substantially vertical sidewalls 108B. In some embodiments, capping layer 1205 is etched into cap 1207 (dashed lines). When cap 1207 includes a dielectric material, cap 1207 may be removed during the plasma etch process as indicated by dashed lines. The etch process is continued to etch and form dielectric layer 104.

The plasma etch process is continued to etch and form electrode 102. In an embodiment, the process utilized to etch conductive layer to form electrode 102 may be substantially the same as the etch process utilized to form electrode 108. In the illustrative embodiment, sidewalls 1213 of the memory device 100B are substantially vertical with respect to a normal to lowermost surface 102C. The process of forming electrode 108, dielectric layer 104, and electrode 102 completes formation of memory device 100B.

FIG. 12D is a cross-sectional illustration of the structure in FIG. 12C following the process to form opening 1215 in dielectric 1210 formed above etch stop layer 208 and extended into encapsulation layer 212 formed on memory device 100B. The process utilized to deposit encapsulation layer 212 depends on the material utilized, and on height of memory device 100B. In embodiments that include a plurality of memory devices the deposition process can be dependent on the relative spacing between adjacent memory devices such as memory device 100B. In exemplary embodiments, the deposition process utilized to deposit encapsulation layer 212 does not include hydrogen or ammonia containing chemicals to prevent hydrogen exposure to layers within memory device 100B. In the illustrative embodiment, encapsulation layer 212 is blanket deposited.

In an embodiment, encapsulation layer 212 includes an insulator material. The insulator material includes a metal and oxygen, such as, but not limited to $Al_xO_y$, $HfO_x$, $AlSiO_x$, $ZrO_x$, or $TiO_x$. Materials such as $Al_xO_y$, $HfO_x$, $AlSiO_x$, $ZrO_x$, or $TiO_x$, can be deposited without a hydrogen or ammonia containing chemical precursor in an ALD deposition process. Encapsulation layer 212 may be deposited to a thickness in the range of 0.5 nm-10 nm. In some embodiments, encapsulation layer 212 may be deposited to a thickness of less than 5 nm. An ALD process can provide a substantially conformal thickness on sidewalls of memory device 100B, as shown. In some embodiments, a PVD deposition process does not conformally deposit encapsulation layer 212 with uniform thickness $T_{EC}$. In some such embodiments, portions of encapsulation layer 212 adjacent to uppermost surface of memory device 100B is wider (illustrated by dashed lines 1212) than portions adjacent to lowermost surface of memory device 100B.

In other embodiments a physical vapor deposition (PVD) process may be utilized. In some such embodiments, encapsulation layer 212 can include materials such as compounds of nitrogen and a transition metal such as, but not limited to AlN, ZrN, and HfN, or compounds of Si and O, and one or more of Al, Hf, or Ta, such as, but not limited to, AlSiOx, HfSiOx, and TaSiOx. A PVD process may not provide a substantially conformal deposition on sidewalls of memory device 100B. A thickness of approximately 2 nm may be sufficient to prevent hydrogen transport through encapsulation layer 212 that is deposited with a material density of at least 90%.

In the illustrative embodiment, the material of encapsulation layer 212 can be chosen based on the material of ferroelectric dielectric layer 104. Pairing encapsulation layer 212 with ferroelectric dielectric layer 104 can minimize lattice dislocations that can cause voids and potential pathways for hydrogen diffusion.

The following the process to deposit dielectric 1210 and following a process to planarize dielectric 1210. In an embodiment, dielectric 1210 can be deposited by an atomic layer deposition (ALD) process, a plasma enhanced chemical vapor deposition (PECVD), chemical vapor deposition (CVD), a physical vapor deposition (PVD) process, or a combination thereof.

It is to be appreciated that dielectric 1210 includes a material that is different from the material of encapsulation layer 212. In an embodiment, the dielectric includes a metal and oxygen, such as for example $Al_xO_y$, $HfO_x$, $ZrO_x$, $TaO_x$, $TiO_x$, $AlSiO_x$, $HfSiO_x$ or $TaSiO_x$. In other embodiments, dielectric 1210 includes a nitride of Al, Zr, or Hf, for example AlN, ZrN, or HfN. Some of the dielectric materials may be deposited by a process that utilizes hydrogen or ammonia containing precursor chemicals, while other materials may be deposited by a process that does not utilize hydrogen or be performed in an environment where hydrogen may be present. In some embodiments, deposition of dielectric 1210 is performed by a combination of processing operations. A first operation may utilize a physical vapor deposition process to deposit a material including a transition metal and oxygen, such as but not limited to $Al_xO_y$, $HfO_x$, $ZrO_x$, $TaO_x$, $TiO_x$, $AlSiO_x$, $HfSiO_x$, $TaSiO_x$, or a transition metal and nitrogen such as but not limited to AlN, ZrN, or HfN. A second operation may be subsequently performed where one or more of $Al_xO_y$, $HfO_x$, $ZrO_x$, $TaO_x$, $TiO_x$, AlSiOX, $HfSiO_x$, $TaSiO_x$, AlN, ZrN, or HfN may be deposited by a process that may or may not utilize a hydrogen precursor.

Some of dielectric 1210 materials can be deposited by a single ALD deposition process because they may be deposited by a hydrogen free precursor. In other embodiments, a first process may include ALD to deposit thin layer of dielectric, followed by a bulk dielectric deposition using a CVD or a PVD process. In other embodiments, the dielectric may include SiO2, SiON, or SiO2 doped with carbon or fluorine.

After deposition a CMP process may be utilized to planarize dielectric 1210.

After planarization, mask 1214 is formed by a lithographic process on dielectric 1210. Mask 1214 includes an opening above memory device 100B.

After forming mask 1214, the dielectric is etched to form opening 1215 to fabricate a via electrode on memory device 100B. Opening 1215 may be formed by a plasma etch process that etches dielectric 1210 but is selective to encapsulation layer 212. A selective etch process may be desirable when the width of opening 1215 is comparable or greater than a width of memory device 100B. Any potential issues arising from misalignment between the location of opening 1214A in mask 1214 and memory device 100B can be lessened when the plasma etch utilized to etch dielectric 1210 is selective to encapsulation layer 212. In some embodiments, opening 1215 can have a width between 20 nm-100 nm.

After etching dielectric 1210, the plasma etch process is continued to perform etching of a portion of the encapsulation layer 212 exposed by opening 1215. The etch process exposes electrode 106. Opening 1215 may have sidewalls that are substantially vertical or flared. In the illustrative embodiment, sidewalls of opening 1215 are substantially vertical.

FIG. 12E is a cross-sectional illustration of the structure in FIG. 12D following the process to deposit materials into opening 1215 to form contact electrode 214. In the illustrative embodiment, conductive hydrogen barrier material is blanket deposited into opening 1215, on memory device 100B, adjacent to encapsulation layer 212 and on sidewall of dielectric 1210. The conductive hydrogen barrier material includes a material that is compatible with dielectric 1210 so that interface 1220 between the conductive hydrogen barrier material and dielectric 1210 is not a source of dislocations.

In an embodiment, a liner layer material is blanket deposited in opening 1215, and on the conductive hydrogen barrier material. A layer of fill metal is deposited into the remaining portions of opening 1215 on the liner layer material.

In embodiments, the conductive hydrogen barrier material, the liner layer material, and layer of fill metal are deposited by an ALD, PVD, or sputter deposition process.

A planarization process is performed to remove the conductive hydrogen barrier material, the liner layer material and layer of fill material formed on or above dielectric 1210. The planarization process forms contact electrode 214 on memory device 100B.

In an embodiment, the planarization process includes a chemical mechanical planarization (CMP) process. The CMP process removes layer of fill material and liner layer material from above the conductive hydrogen barrier material on uppermost surface 1210A of dielectric 1210. The planarization process is continued until the conductive hydrogen barrier material is also removed from uppermost surface 1210A.

The planarization process forms conductive hydrogen barrier 210, liner layer 218 and conductive fill material 220 within opening 1215. The CMP process may also reduce the as deposited thickness of dielectric 1210.

Referring to FIG. 1A, electrode 106 has grains 106A that are different from grains 102A of electrode 102, even when electrodes 102 and 106 include a same or substantially same material. FIG. 13A is a cross-sectional illustration of a material layer stack 1300 formed above electrode structure 206 and etch stop layer 208, in accordance with an embodiment of the present disclosure. In the illustrative embodiment, material layer stack 1300 includes electrode layer 1302 and dielectric layer 1304 on electrode layer 1302. In exemplary embodiments, electrode layer 1302 includes a material that is the same or substantially the same as the material of conductive layer 1202 (FIG. 12B), following post deposition anneal. In exemplary embodiments, dielectric layer 1304 includes a material that is the same or substantially the same as the material of dielectric layer 1203 (FIG. 12B), following post deposition anneal. In the illustrative embodiment, grain length $L_{7A}$ of grains 1302A in electrode layer 1302 is between 15 nm-50 nm. In the illustrative embodiment, grain length $L_{7B}$ of grains 1304A in dielectric layer 1304 is between 15 nm-50 nm.

FIG. 13B is a cross-sectional illustration of the structure in FIG. 13A following the formation of electrode layer 1306 on material layer stack 1300 that is annealed, in accordance with an embodiment of the present disclosure. In an embodiment, electrode layer 1306 includes a material that is the same or substantially the same as the material of conductive layer 1204 that is as deposited and pre-annealed (FIG. 12A). In the illustrative embodiment, grain length $L_{7C}$ of grains 1306A in electrode layer 1306 is substantially smaller than grain length $L_{7A}$ of grains 1302A in electrode layer 1302. In exemplary embodiments, a partial stack deposition, followed by an anneal process, and then followed by deposition of an electrode layer such as electrode layer 1306 can form stack 1310 having identical electrode materials but with different grain sizes. Patterning of stack 1310 can form a memory device such as memory device 100A (FIG. 1A).

In other embodiments, the memory device coupled with a transistor can be a trench capacitor.

Figure 14:
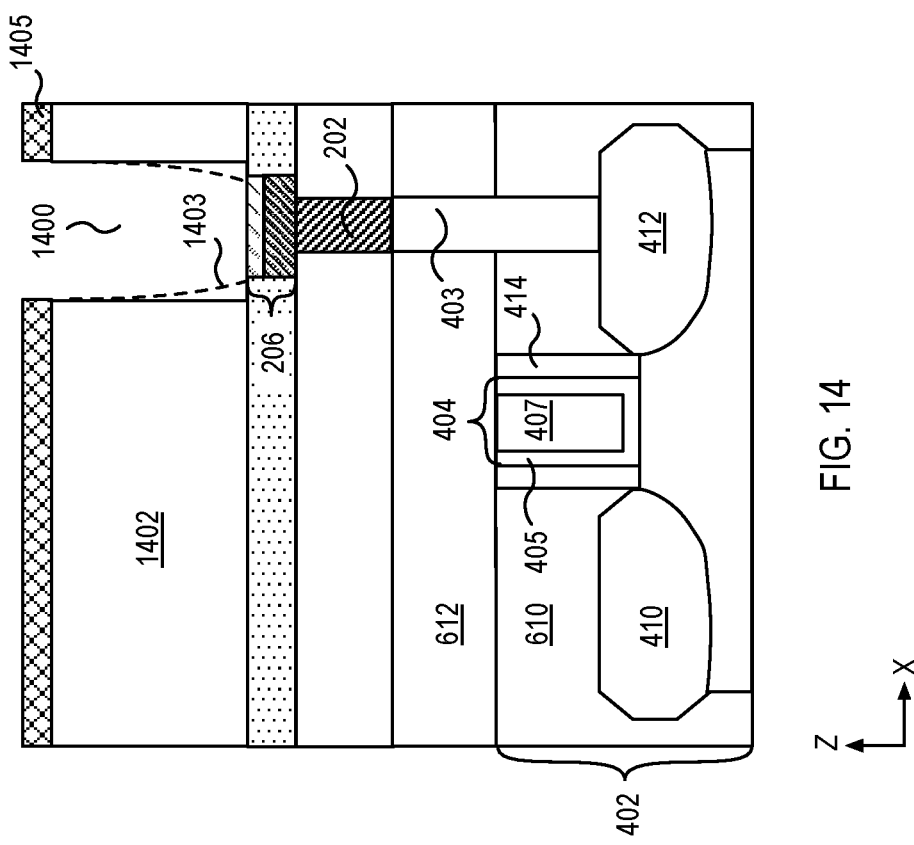
FIG. 14 is a cross-sectional illustration of an opening formed in a dielectric above transistor, in accordance with an embodiment of the present disclosure.

FIG. 14 is a cross-sectional illustration of opening 1400 formed in dielectric 1402 above transistor 402, in accordance with an embodiment of the present disclosure. In the illustrative embodiment, dielectric 1402 includes a material that is the same or substantially the same as the material of dielectric layer 1203, such as a material with high film density (a film density above 90% of theoretical material density or film density. In other embodiments, dielectric 1402 includes a material with low film density (a film density much below 90% of theoretical material density) for example low density $SiO_2$, carbon doped oxide (CDO), SiOC, SiCN, SiC, SiOxNy, or F-doped oxides.

Mask 1405 may be formed on dielectric 1402 by a lithographic technique and may include a photo-resist material. In an embodiment, a plasma etch process is utilized to etch dielectric 1402 to expose electrode structure 206. Opening 1400 may be wider than or narrower than electrode structure 206. In some embodiments, opening 1400 has sidewalls that are tapered as indicated by dashed lines 1403.

Figure 15:
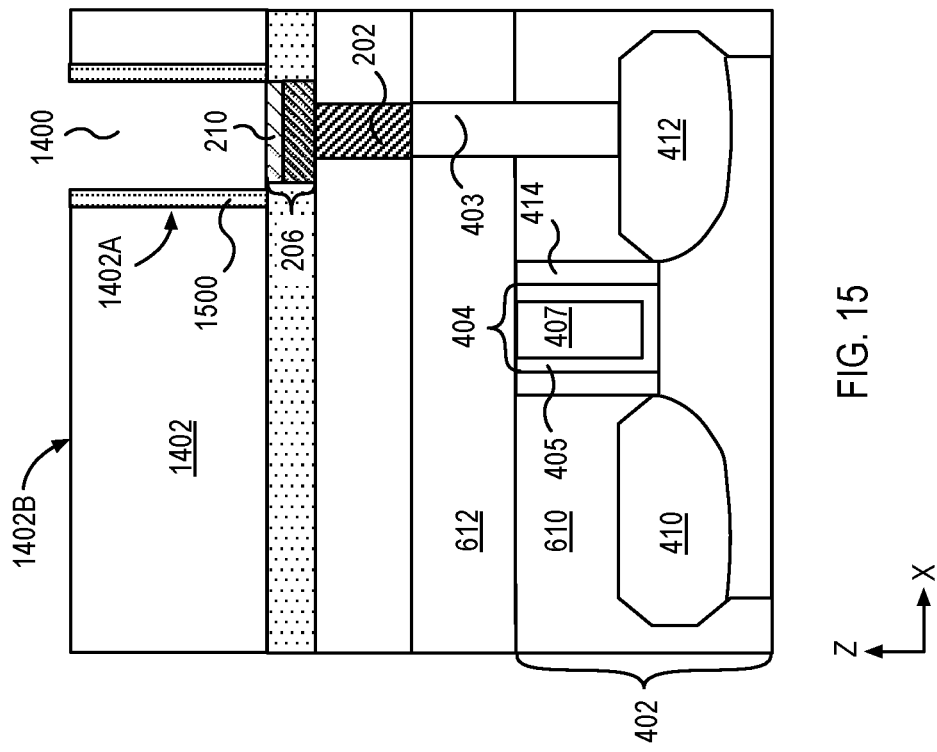
FIG. 15 is a cross-sectional illustration of the structure in FIG. 14 following the process to form a spacer on sidewall of the opening.

FIG. 15 is a cross-sectional illustration of the structure in FIG. 14 following the process to form spacer 1500 on sidewall 1402A of opening 1400. In an embodiment, a spacer material is deposited into opening 1400 and on uppermost surface 1402B of dielectric 1402 and on conductive hydrogen barrier 210. The spacer material is then etched off from surface of conductive hydrogen barrier 210 and uppermost surface 1402B to form spacer 1500.

Figures 16A, 16B:
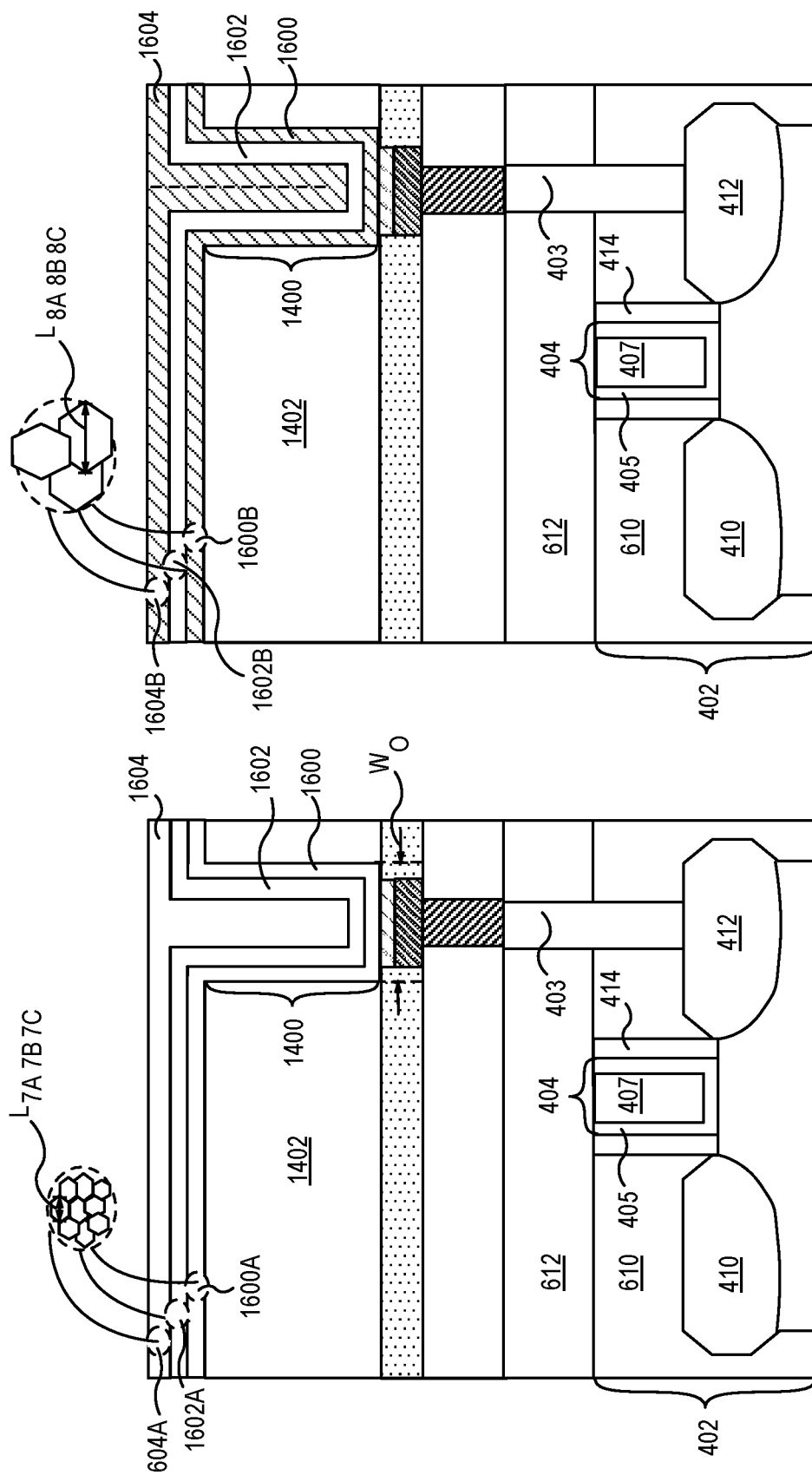
FIG. 16A is a cross-sectional illustration of the structure in FIG. 14 following the process to deposit various layers to form a trench capacitor.
FIG. 16B is a cross-sectional illustration of the structure in FIG. 16A following the process of performing a post deposition anneal process.

FIG. 16A is a cross-sectional illustration of the structure in FIG. 14 following the process to deposit various layers to form a trench capacitor. In some embodiments, electrode layer 1600 and electrode layer 1604 can be deposited into opening 1400 by a PVD, CVD, or an ALD process. Dielectric layer 1602 may be deposited by an ALD process due to uniformity in thickness from an ALD deposition technique. In other embodiments, an ALD process is utilized to sequentially deposit all layers within opening 1400. When opening 1400 has an aspect ratio that is greater than 1:1, an ALD deposition process is highly desirable due to the uniformity and coverage within opening 1400. An ALD deposition technique is further advantageous when width $W_o$ of the opening is less than 20 nm wide.

In the illustrative embodiment, grain length $L_{7A}$ of grains 1600A in electrode layer 1600 is between 1 nm-14 nm as deposited. In some embodiments, $L_{7A}$ is between 1 nm and 5 nm. In other embodiments, $L_{7A}$ is between 5 nm but less than 15 nm as deposited.

In the illustrative embodiment, grain length $L_{7A}$ of grains 1602A in dielectric layer 1602 is between 1 nm-14 nm as deposited. In some embodiments, $L_{7B}$ is between 1 nm and 5 nm. In other embodiments, $L_{7B}$ is between 5 nm but less than 15 nm as deposited.

In the illustrative embodiment, grain length Lac of grains 1604A in electrode layer 1604 is between 1 nm-14 nm as deposited. In some embodiments, Lac is between 1 nm and 5 nm. In other embodiments, Lac is between 5 nm but less than 15 nm as deposited.

In an embodiment, the ALD deposition process is performed at a temperature between 150 degrees Celsius and 400 degrees Celsius. The ALD deposition process may be utilized to sequentially deposit a single monolayer at a time. In an embodiment, the deposition process is carried out until dielectric layer 1602 including a ferroelectric or paraelectric nanocrystalline film having a requisite thickness between 1 nm and 30 nm is obtained.

In an embodiment, electrode layer 1600 includes a material that is the same or substantially the same as the material of electrode 304 (FIG. 3A). In an embodiment, dielectric layer 1602 includes a material that is the same or substantially the same as the material of dielectric layer 306 (FIG. 3A). In an embodiment, electrode layer 1604 includes a material that is the same or substantially the same as the material of electrode 308 (FIG. 3A).

In an embodiment, the deposition process may include a PAALD, or a PELD process.

FIG. 16B is a cross-sectional illustration of the structure in FIG. 16A following the process of performing a PDA. In an embodiment, the PDA process includes one or more processes that were described in association with FIG. 12B.

In various embodiments, grain lengths in the various layers in opening 1400 can depend on material choice and on the PDA process utilized. In the illustrative embodiment, grain length $L_{8A}$ of grains 1600B, after PDA, in electrode layer 1600 is between 15 nm-50 nm. In the illustrative embodiment, grain length $L_{8B}$ of grains 1602B, after PDA, in dielectric layer 1602 is between 15 nm-50 nm. In the illustrative embodiment, grain length $L_{8C}$ of grains 1604B, after PDA, in electrode layer 1604 is between 15 nm-50 nm.

Figure 16D:
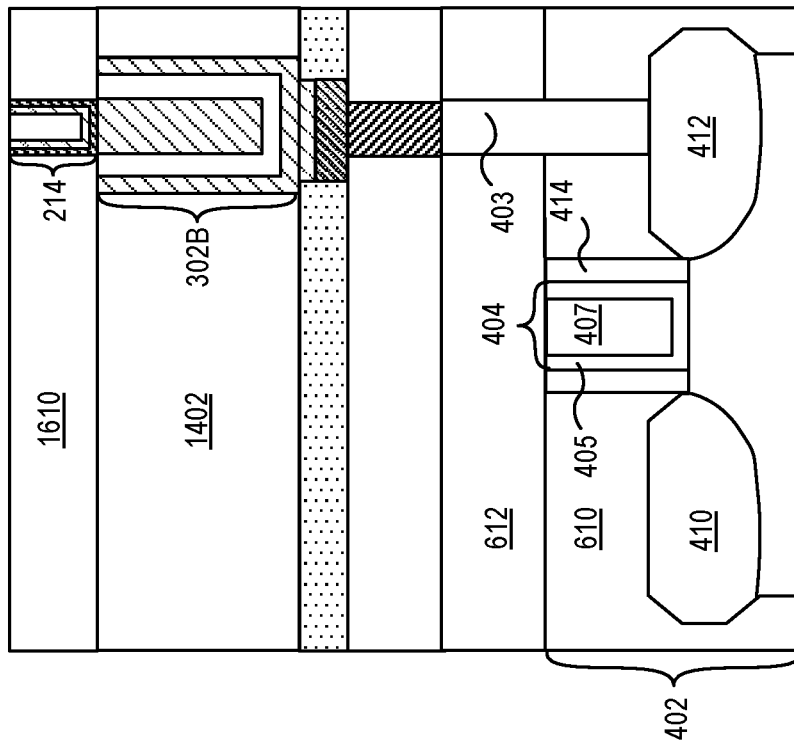
FIG. 16D is a cross-sectional illustration of the structure in FIG. 16C following the process to form contact electrode.
Figure 16C:
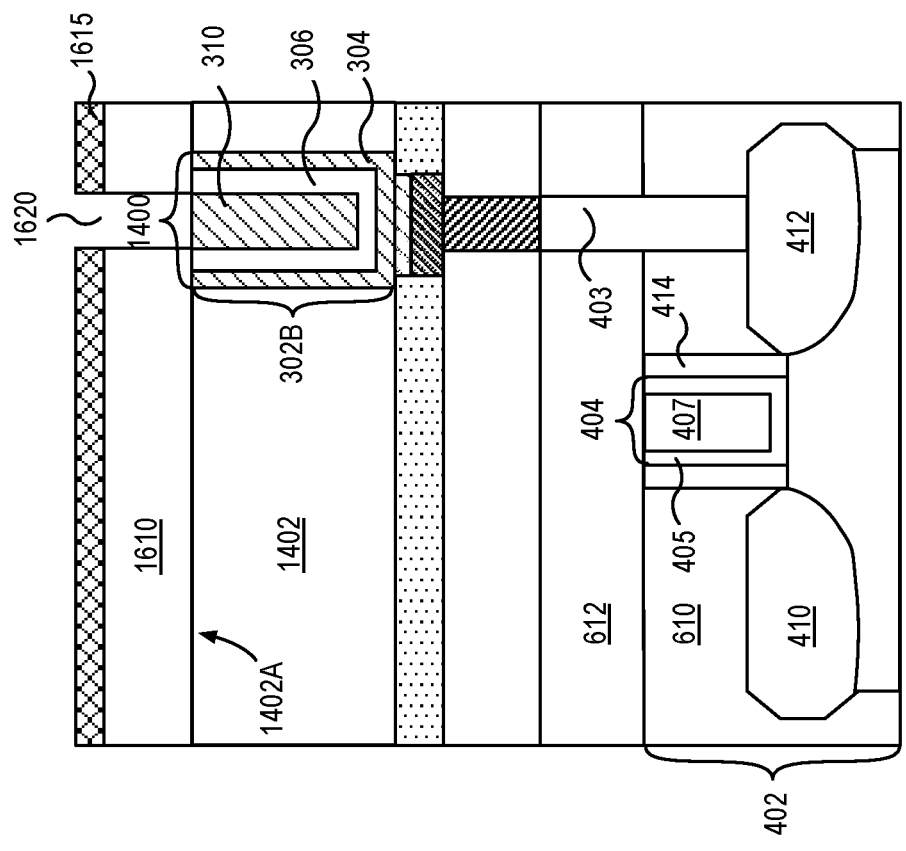
FIG. 16C is a cross-sectional illustration of the structure in FIG. 16B following a process to planarize and form a trench capacitor and following the process to form an opening in a dielectric deposited on the trench capacitor, in accordance with an embodiment of the present disclosure.

FIG. 16C is a cross-sectional illustration of the structure in FIG. 16B following a process to planarize and remove excess trench capacitor layers deposited on and above dielectric 1402. In an embodiment, a chemical mechanical polish (CMP) process is utilized. The CMP process removes the top electrode layer, the dielectric layer and bottom electrode layer from above the surface of dielectric 1402. The planarization process isolates electrode 310, dielectric layer 306 and electrode 304 within opening 1400 to form trench capacitor 302B.

A dielectric 1610 is deposited on dielectric 1402 and on trench capacitor 302B. In an embodiment, dielectric 1610 includes a material that is the same or substantially the same as the material of dielectric 1402. In an embodiment, dielectric 1610 includes an insulative material with a hydrogen barrier property. A hydrogen barrier is essential to prevent hydrogen from reaching an uppermost portion of dielectric layer 306. In other embodiments, dielectric 1610 includes silicon and nitrogen, or silicon, nitrogen and carbon. In other embodiments, dielectric 1610 is a bilayer stack where the first layer is a hydrogen barrier layer and the second layer is a low K ILD material. In some such embodiments, the first layer is directly in contact with dielectric 1402 and trench capacitor 302B.

An opening 1620 is formed in dielectric 1610. Opening 1620 may be formed by a process that is substantially the same as the process described in association with FIG. 12D. For example, mask 1615 may be formed on dielectric 1610, as illustrated, followed by an etch process to form opening 1620 to expose the electrode 310.

FIG. 16D is a cross-sectional illustration of the structure in FIG. 16C following the process to form contact electrode 214. In an embodiment, the method and materials utilized to fabricate contact electrode 214 are described in association with FIG. 12E.

In some embodiments, the top electrode of trench capacitor 302B may not have undergone PDA as described in association with FIG. 3A.

Figure 17B:
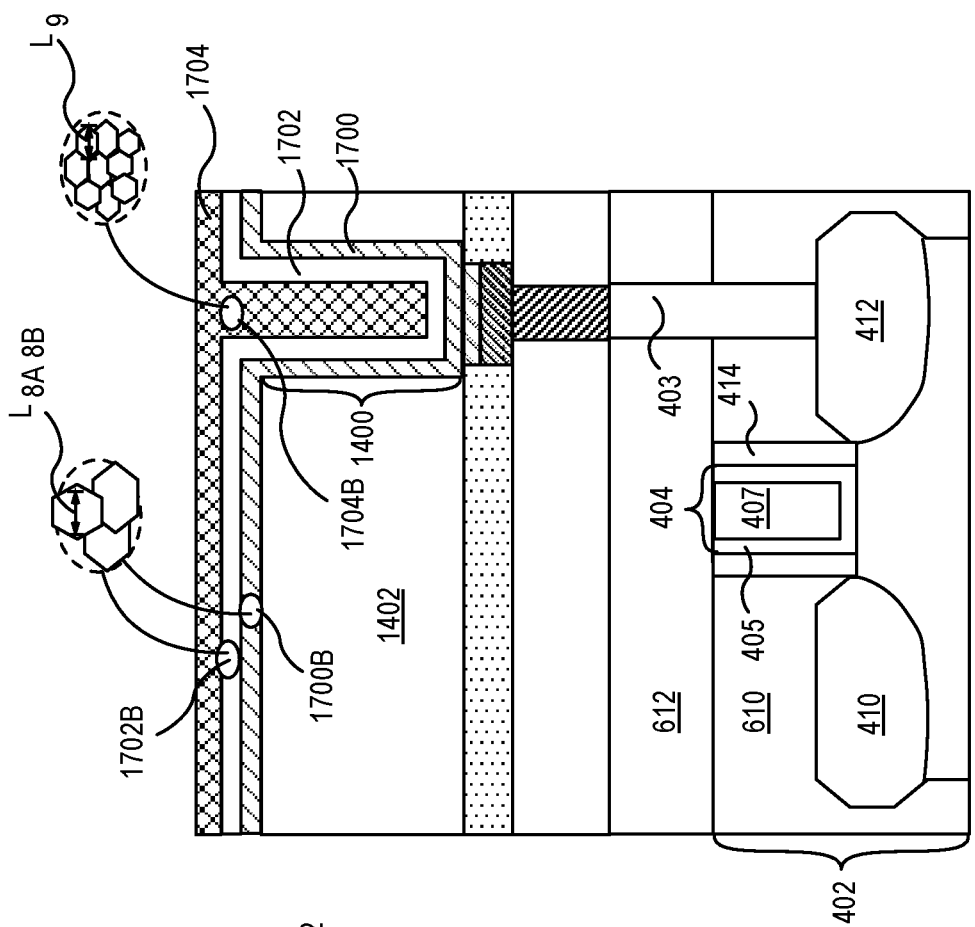
FIG. 17B is a cross-sectional illustration of the structure in FIG. 17A following the deposition of a top electrode layer on the dielectric layer.
Figure 17A:
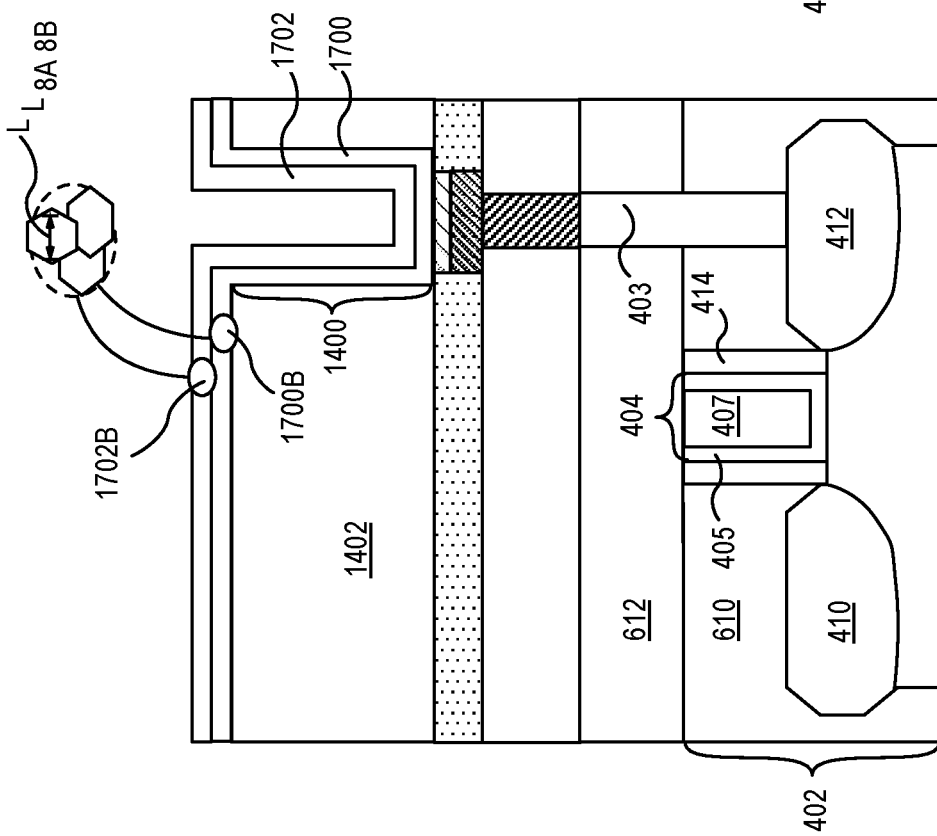
FIG. 17A is a cross-sectional illustration of the structure in FIG. 14 following a deposition and PDA of a bottom electrode layer and a dielectric layer in the opening.

FIG. 17A is a cross-sectional illustration of the structure in FIG. 14 following the deposition and PDA of electrode layer 1700 and dielectric layer 1702. The materials, deposition processes, and PDA processes are substantially the same as those utilized to form electrode layer 1600 and dielectric layer 1602 in FIG. 16A. After deposition of electrode layer 1700 and dielectric layer 1702, a PDA is performed. The PDA may include one or more processes described above in association with FIG. 12B and FIG. 16B.

In various embodiments, grain lengths in the various layers in opening 1400 can depend on material choice and on the PDA process utilized. In the illustrative embodiment, grain length $L_{8A}$ of grains 1700B, after PDA, in electrode layer 1700 is between 15 nm and 50 nm. In the illustrative embodiment, grain length $L_{8B}$ of grains 1702B, after PDA, in dielectric layer 1702 is between 15 nm and 50 nm. In the illustrative embodiment, grain length $L_{8C}$ of grains 1604B, after PDA, in electrode layer 1604 is between 15 nm and 50 nm.

FIG. 17B is a cross-sectional illustration of the structure in FIG. 17A following the deposition of electrode layer 1704 on dielectric layer 1702. In an embodiment, electrode layer 1704 is deposited using a material and method described above in association with FIG. 16A. In the illustrative embodiment, grain length $L_9$ of grains 1704B, in electrode layer 1704 is less than 15 nm. Electrode layer 1704 is not annealed.

Figure 18:
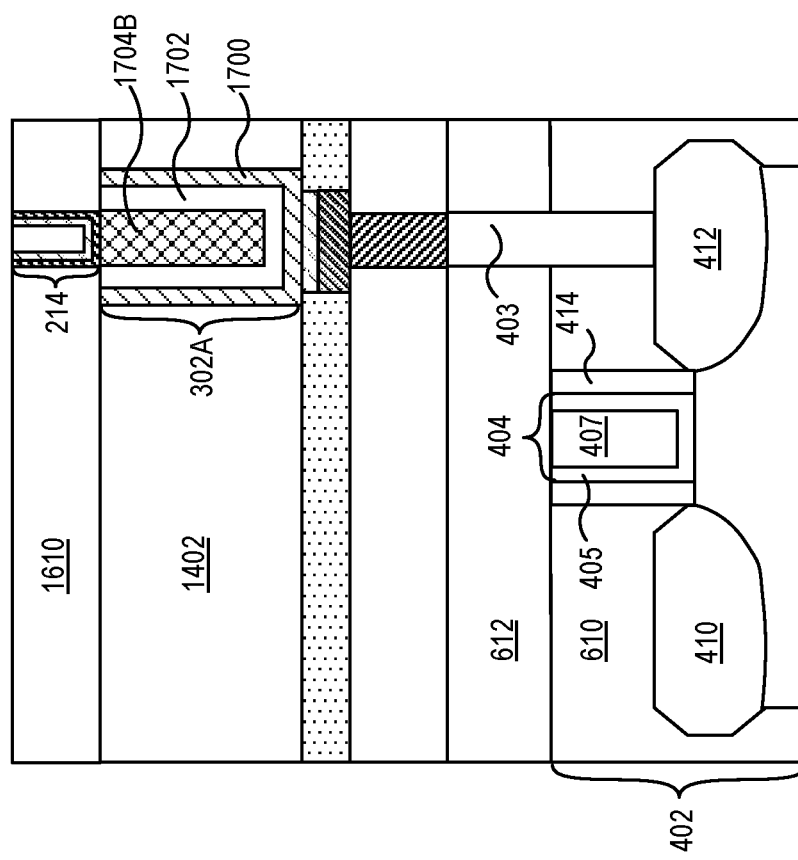
FIG. 18 is a cross-sectional illustration of the structure in FIG. 17A following the process of planarization to form a trench capacitor.

FIG. 18 is a cross-sectional illustration of the structure in FIG. 17A following the process of planarization to form a trench capacitor. In an embodiment, a CMP process is utilized to remove electrode layer 1704, dielectric layer 1702, and electrode layer 1700 from above dielectric 1402. Removal of electrode layer 1704, dielectric layer 1702, and electrode layer 1700 from above dielectric 1402 isolates these layers into opening 1400 to form trench capacitor 302A. Trench capacitor 302A includes electrode layer 1704 having a grain length that is shorter than grain length of electrode layer 1700.

Contact electrode 214 can be formed on trench capacitor 302A. In the illustrative embodiment, contact electrode 214 is formed in dielectric 1610 deposited on dielectric 1402 and on trench capacitor 302A. The method of forming contact electrode 214 is described in association with FIGS. 16C and 16D.

Figure 19:
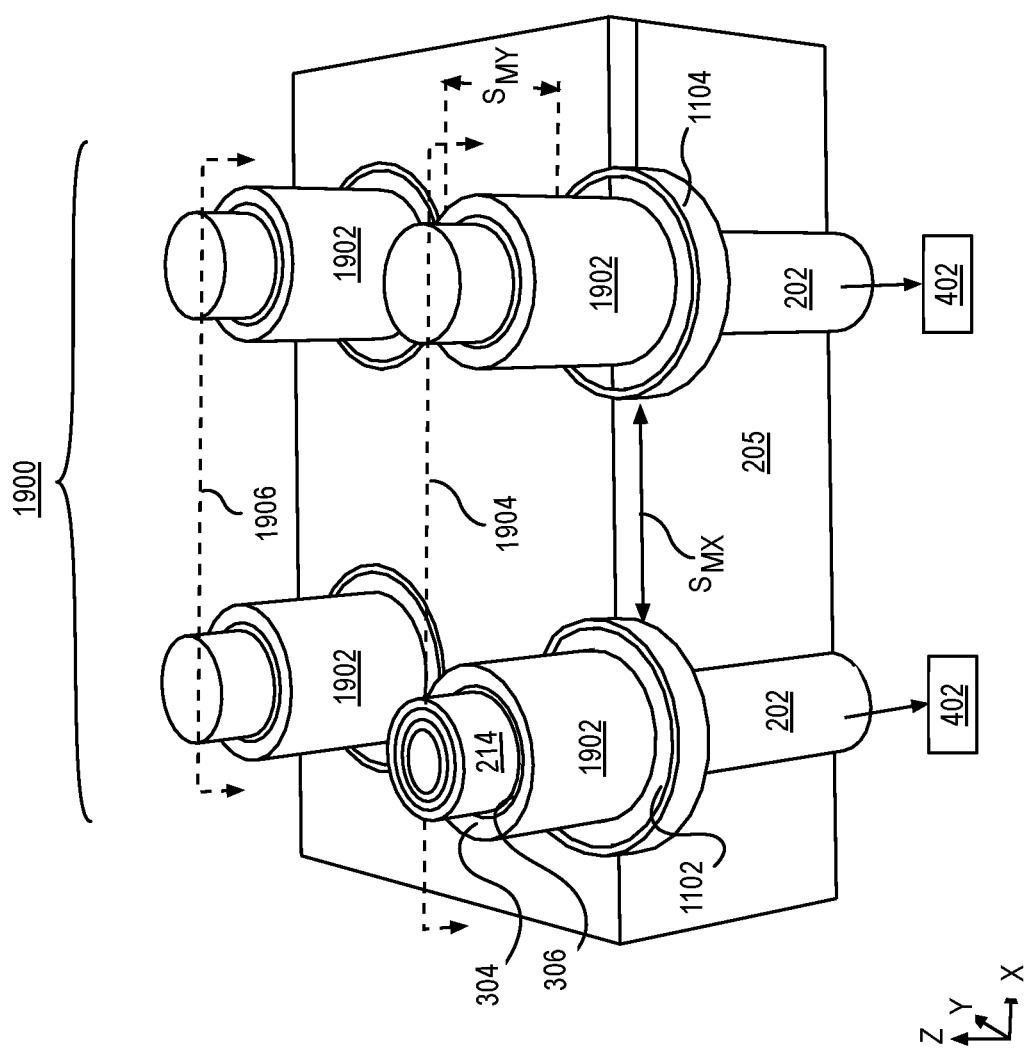
FIG. 19 is an isometric illustration including a plurality of capacitors, where each capacitor is coupled with a conductive interconnect.

FIG. 19 is an isometric illustration of device structure 1900, in accordance with an embodiment of the present disclosure. Device structure 1900 includes many of the features of device structure 200A, 200B, 300A, or 300B described in association with FIGS. 2A, 2B, 3C, and 3D. As shown, conductive interconnect 202 are discrete islands. Device structure 1900 further includes features not illustrated in FIG. 1A as well as some variations in features of certain structures. Dielectrics 222 and 309 are not illustrated for clarity.

Device structure 1900 includes plurality of memory devices 1902. Memory devices 1902 may be an example of a planar capacitor such as memory device 100A, 100B, 201A or 201B for example, or trench capacitor such as trench capacitor 302A, 302B, 320A or 320B for example, described above. In the illustrative embodiment, first pair of memory devices 1902 are on plane 1904 and second pair of memory devices 1902 are on second plane 1906 behind plane 1904. In the illustrative embodiment, device structure 1900 includes plurality of memory devices 1902, where individual ones of the plurality of memory devices 1902 are coupled with respective conductive interconnect 202 through respective electrode structure 206. Respective conductive interconnect 202 is further coupled to respective transistor 402 (indicated for simplicity by a box). In some embodiments, respective conductive interconnect 202 is coupled with a drain terminal of respective transistor 402 (such as is illustrated in FIG. 4A). In other embodiments, respective conductive interconnect 202 is coupled with a gate electrode of respective transistor 402 (such as is illustrated in FIG. 4C).

As shown, conductive interconnect 202 has a discrete island structure (i.e., a conductive interconnect surrounded by dielectric 205). Conductive interconnect 202 may include a variety of shapes. As illustrated, conductive interconnect 202 is discrete, cylindrical, and spaced apart from another conductive interconnect 202. In some such embodiments, lateral thickness or width $W_{CI}$ is also a diameter.

In the illustrative embodiment, respective memory device 1902 and conductive interconnect 202 have cylindrical shape. In some such embodiments, lateral thickness or width $W_{MD}$ is a diameter of memory device 1902. In other embodiments, memory device 1902 can have a tapered cylindrical shape (for example a cross section of a tapered cylindrical trench is shown in FIG. 14).

In the illustrative embodiment, electrode structure 206 also has a cylindrical shape. In some such embodiments $W_{ES}$, is a diameter of electrode structure 206. However, it is to be appreciated that the shape of electrode structure 206 can be independent of the shape of memory device 1902, or a shape of conductive interconnect 202. As shown a portion of conductive hydrogen barrier 210 is an annular shaped ring around conductive fill material 211. In other embodiments, electrode structure 206 has a structure as depicted in FIG. 2A.

Referring again to FIG. 19, electrode structure 206 is spaced apart from an adjacent electrode structure 206 by distance SM along the x-direction and along the y-direction. In embodiments, SM along the x-direction and along the y-direction may be the same or different.

Figure 20:
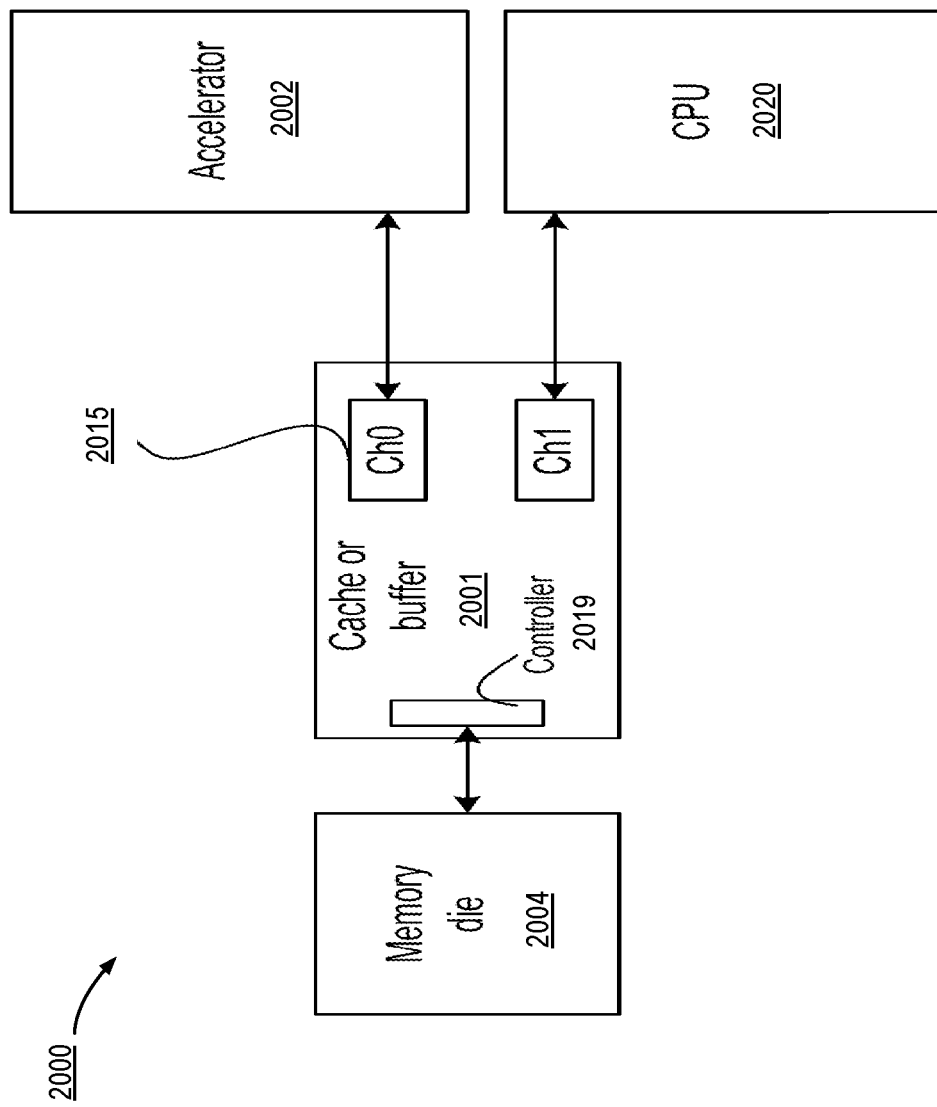
FIG. 20 illustrates a computing architecture with a coherent cache or memory-side buffer chiplet that includes a memory controller, wherein the coherent cache or memory-side buffer chiplet is coupled to an accelerator, a processor, and a memory, in accordance with some embodiments.

FIG. 20 illustrates computing architecture 2000 with a coherent cache or memory-side buffer chiplet that includes a memory controller, wherein the coherent cache or memory-side buffer chiplet is coupled to an accelerator, a processor, and a memory, in accordance with some embodiments. Computing architecture 2000 comprises coherent cache or memory-side buffer chiplet 2001, accelerator 2002 (e.g., inference chip), processor (e.g., central processing unit CPU 2020), and memory die 2004. In some embodiments, coherent cache or memory-side buffer chiplet 2001 comprises at least two channels 2015 which are configured to connect with accelerator 2002 and CPU 2020. In some embodiments, coherent cache or memory-side buffer chiplet 2001 comprises I/O and controller 2019 to manage data traffic with memory die 2404. By moving controller 2019 from CPU 2020 to coherent cache or memory-side buffer chiplet 2001, cost in terms of power and die area for CPU 2020 is reduced. In some embodiments, coherent cache or memory-side buffer chiplet 2001 is a cache memory that comprises ferroelectric memory cells. For example, coherent cache or memory-side buffer chiplet 2001 comprises one or more of FE-SRAM, FE-DRAM, SRAM, MRAM, resistance RAM (Re-RAM), embedded DRAM (e.g., 1T-1C based memory), or a combination of them. Using FE- SRAM, MRAM, or Re-RAM allows for low power and high-speed memory operation.

Figure 21:
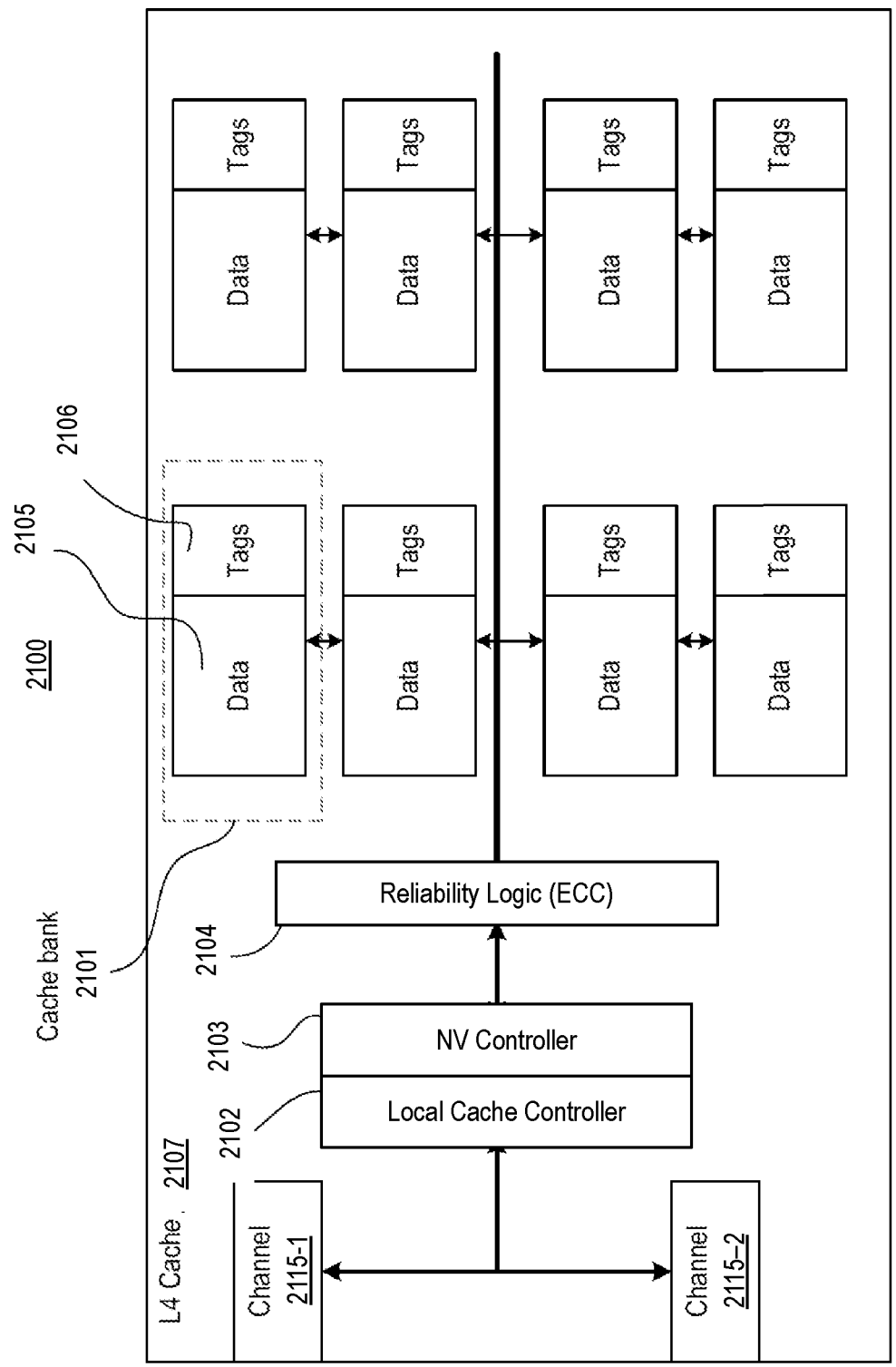
FIG. 21 illustrates an architecture of the coherent cache or memory-side buffer chiplet with multiple controllers and multiple cache banks, in accordance with some embodiments.

FIG. 21 illustrates architecture 2100 of the coherent cache or memory-side buffer chiplet (e.g., 2107) with multiple controllers and multiple cache banks, in accordance with some embodiments. In some embodiments, architecture 2100 comprises channels (e.g., ch0 2115-1 and ch1 2115-2), cache banks 2101, cache controller 2102, non-volatile (NV) controller 2103, and reliability logic 2104. Coherent cache or memory-side buffer chiplet 2107 may function as a cache or memory buffer. In some embodiments, cache lookups can map a large physical memory into a small physical cache using indirection via tags. Here, indirection refers to the use of tags to specify which address maps to which physical location. If multiple addresses can map to a single physical location, a tag is used to figure out which address is currently mapped.

In some embodiments, each cache bank 2101 includes data bank 2105 (e.g., comprising memory cells), and associated tags 2106. In some embodiments, data bank 2105 comprises ferroelectric memory cells. In some embodiments, data bank 2105 comprises one or more of FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 2105 includes ferroelectric memory, it uses NV controller 2103 and a stronger reliability logic (e.g., error correction code) for security compared to non-ferroelectric memory for data bank 2105.

When data bank 2105 is used to implement a cache, tags may be used to identify which addresses map to which physical locations in the bank. The cache may be set associative in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, tag 2106 may be coupled with each physical line. Tag 2106 may comprise some address bits, sufficient to uniquely identify which address currently occupies the physical line coupled with the tag.

In some embodiments, cache controller 2102 could be used to control state transitions required for cache look ups such as comparing requested addresses with tags stored in tags 2106 and identifying a candidate for replacement (replacement algorithm) when a cache miss occurs. In addition, the cache controller could be tasked with initializing the cache when the cache powers on. When FE memory of data bank 2105, which retains state across power cycles, is used, cache controller 2102 could write 0 s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 2102 would skip locations marked thus when initializing memory.

In some embodiments, reliability logic 2104 performs error correction to the data. Any suitable error correction scheme (e.g., with error correction code (ECC)) may be used by reliability logic 2104. In some embodiments, NV controller 2103 is provided to explicitly clear the cache when using a non-volatile memory, such as FM memory for data bank 2105. NV controller 2103 may include an NV bit which indicates cache lines that should not be cleared but are expected to retain their contents across power cycles. The functions of NV controller 2103 can be combined in cache controller 2102, or vice versa.

Figure 22:
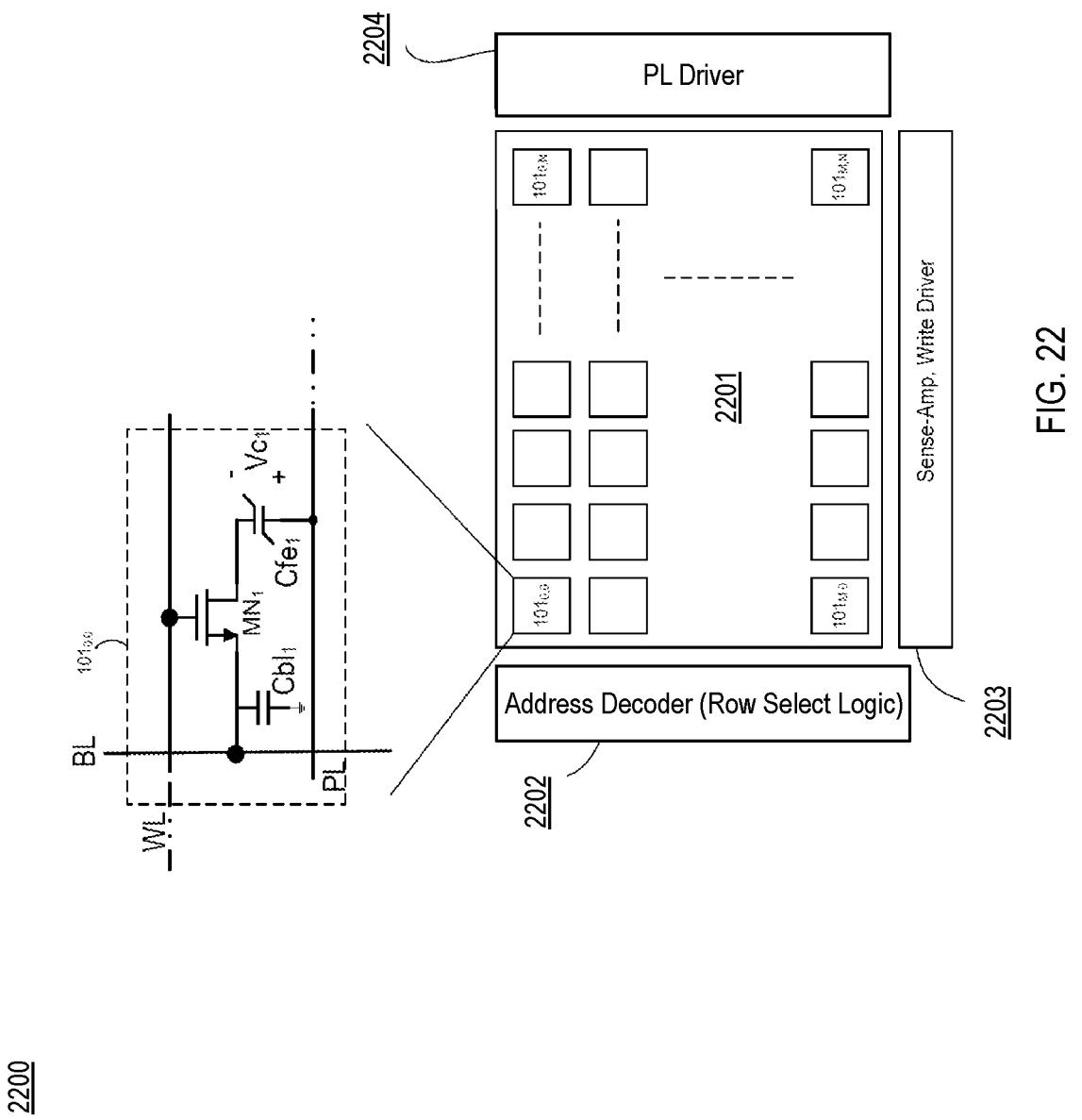
FIG. 22 illustrates an apparatus comprising memory and corresponding logic, wherein the memory comprises ferroelectric (FE) memory bit-cells, in accordance with some embodiments.

FIG. 22 illustrates apparatus 2200 comprising memory and corresponding logic, wherein the memory comprises ferroelectric (FE) memory bit-cells, in accordance with some embodiments. Apparatus 2200 comprises M×N memory array 2201 of bit-cells, logic circuitry 2202 for address decoding, sense amplifier and write drivers 2203, and plate-line (PL) driver 2204. Logic circuitry 2202 comprises address decoders for selecting a row of bit-cells and/or a particular bit-cell from M×N memory array 2201, where M and N are integers of same or different values. Logic circuitry 2202 comprises sense-amplifiers for reading the values from the selected bit-cell, while write drivers are used to write a particular value to a selected bit-cell. Here, a schematic of FE bit-cell $2201_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell $2201_{0,0}$ comprises a word-line (WL), a plate-line (PL), a bit-line (BL), a complementary bit-line (BLB), and two half bit-cells $2201_{0,0\_A}$ and $2201_{0,0\_B}$. In some embodiments, bit-cell $2201_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, BL capacitor $CBl_1$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 23:
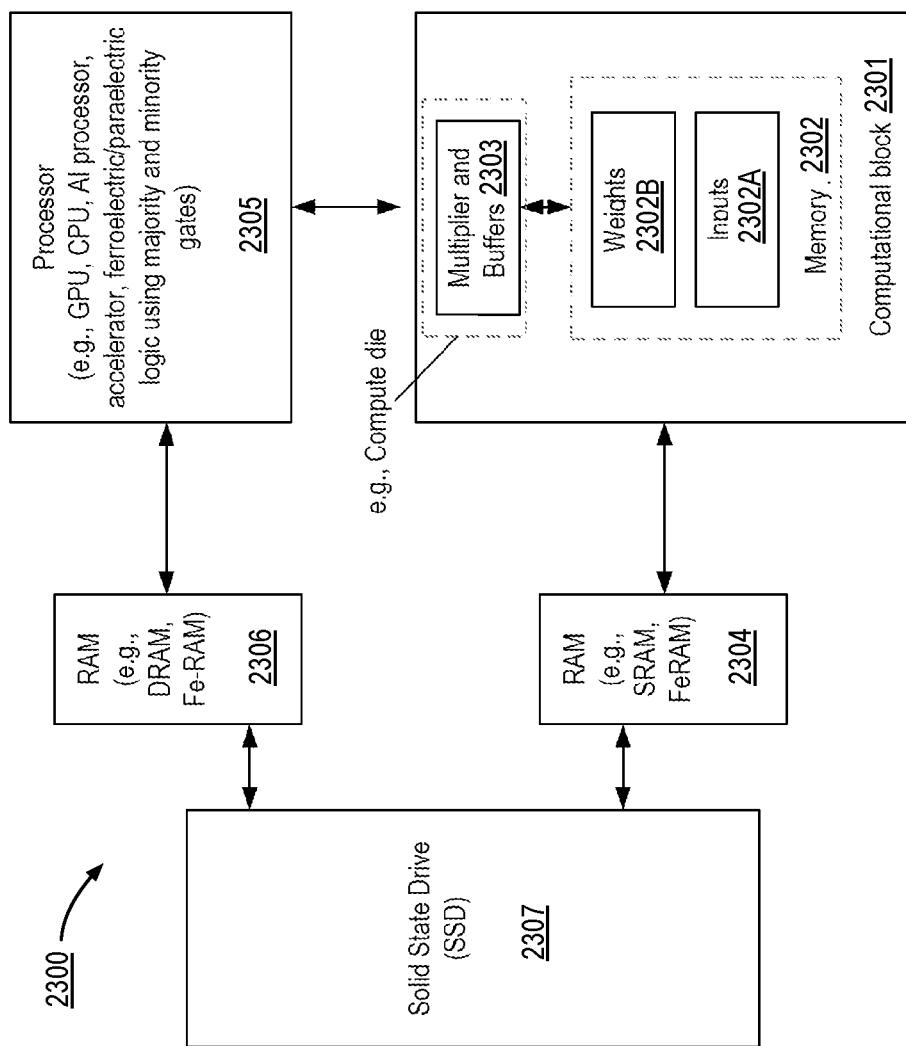
FIG. 23 illustrates a high-level architecture of an artificial intelligence (AI) machine comprising a compute die positioned on top of a memory die, in accordance with some embodiments.

FIG. 23 illustrates a high-level architecture of artificial intelligence (AI) machine 2300 comprising a compute die positioned on top of a memory die, in accordance with some embodiments. AI machine 2300 comprises computational block 2301 or processor having memory 2302 such as random-access memory (RAM) 2302 and compute die 2303; first random-access memory 2304 (e.g., static RAM (SRAM), ferroelectric or paraelectric RAM (FeRAM), ferroelectric or paraelectric static random-access memory (FeSRAM)), main processor 2305, second random-access memory 2306 (dynamic RAM (DRAM), FeRAM), and solid-state memory or drive (SSD) 2307. In some embodiments, some or all components of AI machine 2300 are packaged in a single package forming a system-on-chip (SoC). The SoC can be configured as a logic-on-logic configuration, which can be in a 3D configuration or a 2.5D configuration.

In some embodiments, computational block 2301 is packaged in a single package and then coupled to main processor 2305 and memories 2304, 2306, and 2307 on a printed circuit board (PCB). In some embodiments, computational block 2301 is configured as a logic-on-logic configuration, which can be in a 3D configuration or a 2.5D configuration. In some embodiments, computational block 2301 comprises a special purpose compute die 2303 or microprocessor. For example, compute die 2303 is a compute chiplet that performs a function of an accelerator or inference. In some embodiments, RAM 2302 is DRAM which forms a special memory/cache for the special purpose compute die 2303. The DRAM can be embedded DRAM (eDRAM) such as 1T-1C (one transistor and one capacitor) based memories. In some embodiments, RAM 2302 is ferroelectric or paraelectric RAM (FeRAM).

In some embodiments, compute die 2303 is specialized for applications such as Artificial Intelligence, graph processing, and algorithms for data processing. In some embodiments, compute die 2303 further has logic computational blocks, for example, for multipliers and buffers, a special data memory block (e.g., buffers) comprising DRAM, FeRAM, or a combination of them. In some embodiments, RAM 2302 has weights and inputs stored in-order to improve the computational efficiency. The interconnects between main processor 2305 (also referred to as special purpose processor), first RAM 2304 and compute die 2303 are optimized for high bandwidth and low latency. The architecture of FIG. 23 allows efficient packaging to lower the energy, power, or cost and provides for ultra-high bandwidth between RAM 2302 and compute die 2303 of computational block 2301.

In some embodiments, RAM 2302 is partitioned to store input data (or data to be processed) 2302A and weights 2302B. In some embodiments, input data 2302A is stored in a separate memory (e.g., a separate memory die) and weights 2302B are stored in a separate memory (e.g., separate memory die).

In some embodiments, computational logic or compute die 2303 comprises matrix multiplier, adder, concatenation logic, buffers, and combinational logic. In various embodiments, compute die 2303 performs multiplication operation on input data 2302A and weight 2302B. In some embodiments, weights 2302B are fixed weights. For example, main processor 2305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2302. In various embodiments, input data 2302A, that is to be analyzed using a trained model, is processed by computational block 2301 with computed weights 2302B to generate an output (e.g., a classification result).

In some embodiments, first RAM 2304 is ferroelectric or paraelectric based SRAM. For example, a six transistor (6T) SRAM bit-cells having ferroelectric or paraelectric transistors are used to implement a non-volatile FeSRAM. In some embodiments, SSD 2307 comprises NAND flash cells. In some embodiments, SSD 2307 comprises NOR flash cells. In some embodiments, SSD 2307 comprises multi-threshold NAND flash cells.

In various embodiments, the non-volatility of FeRAM is used to introduce new features such as security, functional safety, and faster reboot time of AI machine 2300. The non-volatile FeRAM is a low power RAM that provides fast access to data and weights. First RAM 2304 can also serve as a fast storage for inference die (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 2300 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched $SrRuO_3$ bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by Lanthanides). In various embodiments, when the FE material is a perovskite, the conductive oxides are of the type AA'BB' $O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element, namely cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of YMnO3, or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of La, Sr, Co, Sr, Ru, Y, Ba, Cu, Bi, Ca, and Ni. For example, metallic perovskites such as (La,Sr)CoO$_3$, SrRuO$_3$, (La,Sr)MnO$_3$, YBa$_2$Cu$_3$O$_7$, Bi$_2$Sr$_2$CaCu$_2$O$_8$, LaNiO$_3$, etc. may be used for FE material. Perovskites can be suitably doped to achieve a spontaneous distortion in a range of 0.3 to 2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when the FE material is a perovskite, the conductive oxides are of the type AA'BB' O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, and Zn. A' may have the same valency of site A, with a different ferroelectric polarizability. In various embodiments, when metallic perovskite is used for the FE material, the conductive oxides can include one or more of IrO$_2$, RuO$_2$, PdO$_2$, OsO$_2$, or ReO$_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include SrTiO3, Ba(x)Sr(y)TiO3 (where x is −0.05, and y is 0.95), HfZrO2, and Hf—Si—O.

In some embodiments, the FE material comprises one or more of Hafnium (Hf), Zirconium (Zr), Aluminum (Al), Silicon (Si), and their oxides or their alloyed oxides. In some embodiments, the FE material includes one or more of Al(1-x)Sc(x)N, Ga(1-x)Sc(x)N, Al(1-x)Y(x)N or Al(1-x-y)Mg(x)Nb(y)N, y doped HfO2, where x includes one of Al, Ca, Ce, Dy, Er, Gd, Ge, La, Sc, Si, Sr, Sn, or Y, wherein 'x' is a fraction. In some embodiments, the FE material includes one or more of Bismuth ferrite (BFO), or BFO with doping material.

In some embodiments, the FE material includes Bismuth ferrite (BFO), BFO with a doping material wherein the doping material is one of Lanthanum, or any element from the lanthanide series of the periodic table. In some embodiments, the FE material includes a relaxor ferro-electric, which includes one of Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf1-x Ex Oy where E can be Al, Ca, Ce, Dy, Er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type h-RMnO3, where R is a rare earth element namely, or such as cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials SnTiO3 (STO), respectively, and LaAlO3 (LAO) and STO, respectively. For example, a super lattice of [PTO/STO]n or [LAO/STO]n, where 'n' is between 1 to 2300. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is −0.5, and y is 0.95), HfZrO2, Hf—Si—O.

Figure 24:
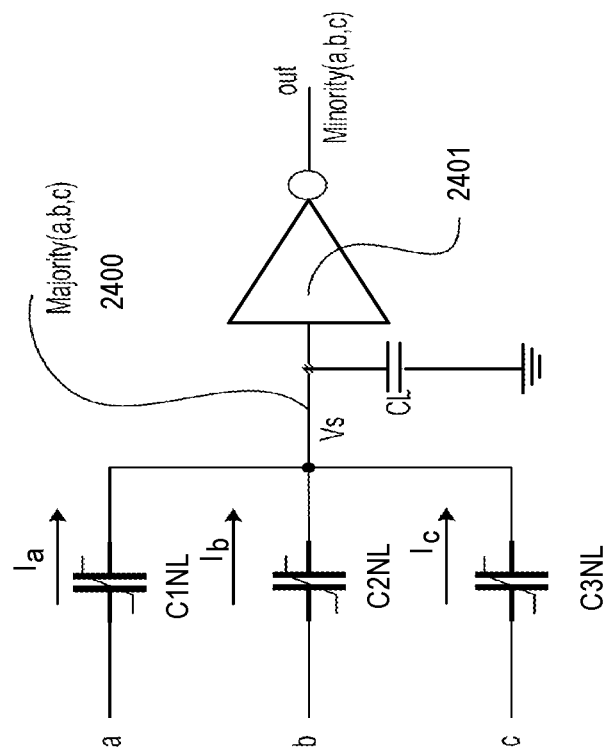
FIG. 24 illustrates a 3-input majority gate using non-linear input capacitors, in accordance with some embodiments.

FIG. 24 illustrates 3-input majority gate 2400 using non-linear input capacitors, in accordance with some embodiments. In some embodiments, 3-input majority gate 2400 comprises non-linear input capacitors C1n1, C2n1, and C3n1 that receive digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In some embodiments, 3-input majority gate 2400 comprises driver circuitry 2401. In this example, driver circuitry 2401 is an inverter. In other embodiments, other types of driver circuitries can be used such as NAND gate, NOR gate, multiplexer, buffer, and other logic gates. The majority function is performed at summing node Vs as Majority(a,b,c). In this example, since driver circuitry 2401 is an inverter, minority function is performed at output "out" as Minority(a,b,c).

In some embodiments, in addition to the gate capacitance of driver circuitry 2401, an additional linear capacitor CL is coupled to summing node Vs and ground as shown. In some embodiments, this linear capacitor CL is a non-ferroelectric capacitor. In some embodiments, the non-ferroelectric capacitor includes one of dielectric capacitor, paraelectric capacitor, or non-linear dielectric capacitor. A dielectric capacitor comprises first and second metal plates with a dielectric between them. Examples of such dielectrics are HfOX, ABO3 perovskites, nitrides, oxy-fluorides, oxides, etc. A paraelectric capacitor comprises first and second metal plates with a paraelectric material between them. In some embodiments, f-orbital materials (e.g., lanthanides) are doped to the ferroelectric materials to make paraelectric material. Examples of room temperature paraelectric material include SrTiO3, Ba(x)Sr(y)TiO3 (where x is −0.5, and y is 0.95), HfZrO2, Hf—Si—O, La-substituted PbTiO3, and PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In some embodiments, the non-linear input capacitors C1n1, C2n1, and C3n1 comprise non-linear polar material. In some embodiments, the non-linear polar material includes one of ferroelectric (FE) material, paraelectric material, relaxor ferroelectric, or non-linear dielectric. In various embodiments, paraelectric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as paraelectric materials, relaxors, and dipolar glasses.

In some embodiments, f-orbital materials (e.g., lanthanides) are doped to the ferroelectric material to make paraelectric material. Examples of room temperature paraelectric material include SrTiO3, Ba(x)Sr(y)TiO3 (where x is −0.5, and y is 0.95), HfZrO2, and Hf—Si—O.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by Lanthanides). Perovskites can be suitably doped to achieve a spontaneous distortion in a range of 0.3 to 2%. For example, for chemically substituted lead titanate such as Zr in Ti site, La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In some embodiments, perovskite includes one of BaTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by La—Sr—CoO3, SrRuO3, La—Sr-MnO3, YBa2Cu3O7, Bi2Sr2CaCu2O24, LaNiO3, and ReO3.

In some embodiments, the FE material comprises a stack of layers including low voltage FE material between (or sandwiched between) conductive oxides. In various embodiments, when FE material is a perovskite, the conductive oxides are of the type AA'BB' $O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, or Zn. A' may have the same valency of site A, with a different ferroelectric polarizability.

In some embodiments, the FE material comprises hexagonal ferroelectrics of the type h-RMnO3, where R is a rare earth element such as cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of YMnO3, or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of Hafnium (Hf), Zirconium (Zr), Aluminum (Al), Silicon (Si), and their oxides or their alloyed oxides. In some embodiments, FE material includes one of Al(1-x)Sc(x)N, Ga(1-x)Sc(x)N, Al(1-x)Y(x)N or Al(1-x-y)Mg(x)Nb(y)N, y doped HfO2, where x includes one of Al, Ca, Ce, Dy, Er, Gd, Ge, La, Sc, Si, Sr, Sn, or Y, wherein 'x' is a fraction. In some embodiments, the FE material includes Bismuth ferrite (BFO) or BFO with doping material.

In some embodiments, the FE material includes Bismuth ferrite (BFO), BFO with a doping material where in the doping material is one of Lanthanum, or any element from the lanthanide series of the periodic table. In some embodiments, the FE material includes a relaxor ferroelectric including one of Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf1-x Ex Oy where E can be Al, Ca, Ce, Dy, Er, Gd, Ge, La, Sc, Si, Sr, Sn, or Y. In some embodiments, FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The charge developed on node Vs produces a voltage and current that is the output of the majority gate 2400. Any suitable driver circuitry 2401 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc. The majority function is performed at the summing node Vs, and the resulting voltage is projected on to capacitance of driver circuitry 2401. For example, the majority function of the currents ($I_a$, $I_b$, and $I_c$) on node Vs results in a resultant current that charges capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 0 | 1 | 1 |
| 1 | 1 | 1 | 1 |

The charge developed on node Vs produces a voltage and current that is the output of the majority gate 2400. Any suitable driver circuitry 2401 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 24 illustrates a 3-input majority gate, the same concept can be extended to more than 3 inputs to make an N-input majority gate, where N is greater than 2. In various embodiments, 'N' is an odd number. For example, a 5-input majority gate is like an input majority gate 2400 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configure the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 2401 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:
$f(x_1, x_2, \ldots x_n) = \vee_{C_1, C_2, \ldots C_n} f(x_1, x_2, \ldots x_n) \wedge x_1^{C_1} \wedge x_2^{C_2} \wedge x_3^{C_3} \ldots \wedge x_n^{C_n}$ where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2^n$ AND gates ($\Delta$), one for each of the $2^n$ possible combinations of 0 and 1 for $C_1$, $C_2$, ... $C_n$. The second level of logic is represented by a single OR gate ($\vee$). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 25:
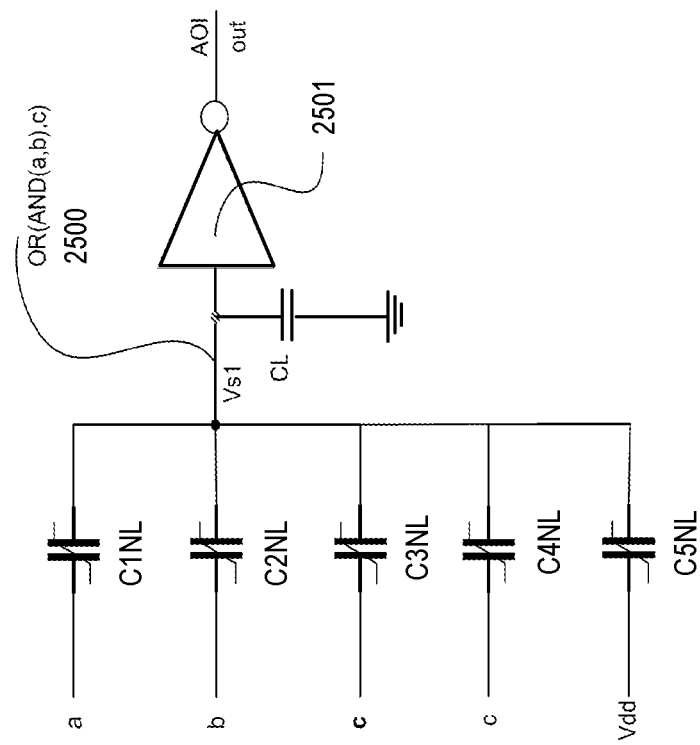
FIG. 25 illustrates a complex logic gate implemented using a 5-input majority gate, in accordance with some embodiments.

FIG. 25 illustrates complex logic gate 2500 implemented using a 5-input majority gate, in accordance with some embodiments. In some embodiments, an AOI (and-or-invert) logic comprises a 5-input majority gate. The 5-input majority gate includes non-linear capacitors C1n1, C2n1, C3n1, C4n1, and C5n1 and driving circuitry 2501 coupled as shown. In various embodiments, two of the non-linear capacitors receives the same input. Here, capacitors C3n1 and C4n1 receive input 'c'. In various embodiments, C5n1 is coupled to Vdd to produce an OR function at node Vs, where the OR function is OR(AND(a,b),c). In some embodiments, other logic gates can be realized by changing Vdd to ground for capacitor C5n1, and/or changing other inputs.

The method of forming the structures described herein are applicable to various logic embodiments. For example, the FeRAM devices or capacitive structures formed herein can be used to form other ferroelectric/paraelectric circuits. These circuits can be implemented majority gate, minority gate and/or threshold gate.

Following examples are provided that illustrate the various embodiments. The examples can be combined with other examples. As such, various embodiments can be combined with other embodiments without changing the scope of the invention.

Example 1: A memory device comprising: a first electrode comprising a first conductive nonlinear polar material, the first conductive nonlinear polar material comprising a first grain length; a dielectric layer comprising a perovskite material on the first electrode, the perovskite material comprising a second grain length; and a second electrode comprising a second conductive nonlinear polar material, on the dielectric layer, the second conductive nonlinear polar material comprising a third grain length less than or equal to the first grain length or the second grain length.

Example 2: The memory device of example 1, wherein the first conductive nonlinear polar material comprises one of La—Sr—CoO$_3$, SrRuO$_3$, La—Sr—MnO$_3$, YBa$_2$Cu$_3$O$_7$, Bi$_2$Sr$_2$CaCu$_2$O$_8$, LaNiO$_3$, or DyScO3 and the second conductive nonlinear polar material comprises one of La—Sr—CoO$_3$, SrRuO$_3$, La—Sr—MnO$_3$, YBa$_2$Cu$_3$O$_7$, Bi$_2$Sr$_2$CaCu$_2$O$_8$, LaNiO$_3$, or DyScO3.

Example 3: The memory device of example 1, wherein the perovskite material comprises: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO] n, where 'n' is between 1 to 100; or a paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 4: The memory device of example 1, wherein the first grain length is between 15 nm and 50 nm, the second grain length is between 15 nm and 50 nm and the third grain length is between 1 nm-14 nm, wherein a ratio between the first grain length and the third grain length is between 3:1 to 50:1.

Example 5: The memory device of example 1, wherein the first grain length is between 15 nm and 50 nm, the second grain length is between 15 nm and 50 nm and the third grain length is between 15 nm-50 nm.

Example 6: The memory device of example 1, wherein the Perovskite material comprises oxygen and one or more of La, Sr, Co, Cr, K, Nb, Na, Sr, Ru, Y, Fe, Ba, Hf, Zr, Cu, Ta, Bi, Ca, Ti or Ni.

Example 7: The memory device of example 1, wherein the first electrode and the dielectric layer have defect density that are less than 1e20 atoms/cm$^3$, and wherein the second electrode has a defect density at least 3 times greater than 1e20 atoms/cm$^3$.

Example 8: The memory device of example 1, wherein the first electrode, the second electrode and the dielectric layer have defect densities that are less than 1e20 atoms/cm$^3$.

Example 9: The memory device of example 3, wherein the first electrode and the second electrode comprise thicknesses between 1 nm and 30 nm.

Example 10: The memory device of example 1, wherein the dielectric layer comprises a thickness between 1 nm and 30 nm.

Example 11: The memory device of example 1, wherein the memory device further comprises an encapsulation layer comprising a hydrogen barrier material on at least sidewalls of the memory device, the hydrogen barrier material comprising silicon nitride, carbon doped silicon nitride, Al$_x$O$_y$, HfO$_x$, ZrO$_x$, TaO$_x$, TiO$_x$, AlSiO$_x$, HfSiO$_x$, or TaSiO$_x$.

Example 12: The memory device of example 11, wherein the memory device further comprises: a first barrier electrode comprising a hydrogen or an oxygen diffusion barrier material directly below and in contact with at least a portion of the first electrode; and a second barrier electrode comprising the hydrogen or an oxygen diffusion barrier material on at least a portion of the second electrode.

Example 13: The memory device of example 12, wherein the second barrier electrode extends at least partially on the second electrode and wherein the encapsulation layer further extends on and covers a remaining portion of the second electrode.

Example 14: The memory device of example 12, wherein the first barrier electrode and the second barrier electrode comprise TiAlN, with greater than 30 atomic percent AlN, TaN with greater than 30 atomic percent N$_2$, TiSiN with greater than 20 atomic percent SiN, TaC, TiC, WC, WN, carbonitrides of Ta, Ti or W, TiO, Ti$_2$O, WO$_3$, SnO$_2$, ITO, IGZO, ZO or METGLAS series of alloys.

Example 15: A memory device comprising: a first conductive interconnect within a first dielectric in a first level; and a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; a memory device on the electrode structure, the memory device comprising: a first electrode comprising a first conductive nonlinear polar material comprising a first grain length; a dielectric layer comprising a ferroelectric material on the first electrode, the dielectric layer comprising a second grain length; and a second electrode comprising a second conductive nonlinear polar material, on the dielectric layer, the second electrode comprising a third grain length that is less than or equal to the first grain length; an insulative hydrogen or an oxygen barrier material encapsulating at least a sidewall of the memory device, the insulative hydrogen or an oxygen barrier material; and a via electrode on at least a portion of the memory device, the via electrode comprising: a second conductive hydrogen barrier layer comprising a lateral portion in contact with the memory device and substantially vertical portions connected to two ends of the lateral portion; and a second conductive fill material on the lateral portion and between the substantially vertical portions.

Example 16: The memory device of example 15, wherein the first grain length is between 15 nm and 50 nm, the second grain length is between 15 nm and 50 nm and the third grain length is between 1 nm-14 nm, wherein a ratio between the first grain length and the third grain length is between 3:1 to 50:1.

Example 17: The memory device of example 15, wherein the first conductive hydrogen barrier layer comprises TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO or METGLAS series of alloys and the second conductive hydrogen barrier layer comprises TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO or METGLAS series of alloys.

Example 18: A system comprising: a processor comprising a transistor; a communication interface communicatively coupled to the processor; and a memory coupled to the transistor, wherein the memory comprises: bit-cells, wherein one of the bit-cells comprises: a first conductive interconnect within a first dielectric in a first level; and a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; a memory device on the electrode structure, the memory device comprising: a first electrode comprising a first conductive nonlinear polar material comprising a first grain length; a dielectric layer comprising a ferroelectric material on the first electrode, the dielectric layer comprising a second grain length; and a second electrode comprising a second conductive nonlinear polar material, on the dielectric layer, the second electrode comprising a third grain length that is less than or equal to the first grain length; an insulative hydrogen or an oxygen barrier material encapsulating at least a sidewall of the memory device, the insulative hydrogen or an oxygen barrier material; and a via electrode on at least a portion of the memory device, the via electrode comprising: a second conductive hydrogen barrier layer comprising a lateral portion in contact with the memory device and substantially vertical portions connected to two ends of the lateral portion; and a second conductive fill material on the lateral portion and between the substantially vertical portions.

Example 19: The system of example 18, wherein the first grain length is between 15 nm and 50 nm, the second grain length is between 15 nm and 50 nm and the third grain length is between 1 nm-14 nm, wherein a ratio between the first grain length and the third grain length is between 3:1 to 50:1.

Example 20: The system of example 18, wherein the first conductive hydrogen barrier layer comprises TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO or METGLAS series of alloys and the second conductive hydrogen barrier layer comprises TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO or METGLAS series of alloys.

Example 2a: A device structure comprising: a conductive interconnect within a first dielectric in a first level; and a second level above the first level, the second level comprising: an electrode structure on the conductive interconnect, the electrode structure comprising: a first conductive fill material; a first conductive hydrogen barrier layer on the first conductive fill material; and an etch stop layer comprising an insulator, the etch stop layer laterally surrounding the electrode structure; a second dielectric on the etch stop layer; a trench within the second dielectric, the trench on the electrode structure; a memory device within the trench, the memory device comprising: a first electrode along a base and a sidewall of the trench, the first electrode comprising a first conductive nonlinear polar material, the first conductive nonlinear polar material comprising a first grain length and wherein the first electrode is in contact with the electrode structure; a dielectric layer comprising a perovskite material on the first electrode and substantially conformal to the first electrode, the perovskite material comprising a second grain length; and a second electrode in contact with the dielectric layer, the second electrode comprising a second conductive nonlinear polar material on the dielectric layer, the second conductive nonlinear polar material comprising a third grain length, the third grain length less than or equal to the first grain length or the second grain length; a via electrode on the second electrode, the via electrode comprising: a second conductive hydrogen barrier layer comprising a lateral portion in contact with the second electrode and substantially vertical portions connected to the lateral portion; and a second conductive fill material adjacent to the second conductive hydrogen barrier layer.

Example 2b: The device structure of example 2a, wherein the first conductive nonlinear polar material comprises one of La—Sr—$CoO_3$, $SrRuO_3$, La—Sr-$MnO_3$, $YBa_2Cu_3O_7$, $Bi_2Sr_2CaCu_2O_8$, $LaNiO_3$, or DyScO3 and the second conductive nonlinear polar material comprises one of La—Sr—$CoO_3$, $SrRuO_3$, La—Sr-$MnO_3$, $YBa_2Cu_3O_7$, $Bi_2Sr_2CaCu_2O_8$, $LaNiO_3$, or DyScO3.

Example 2c: The device structure of example 2a, wherein the perovskite material comprises: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100; or a paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 2d: The device structure of example 2a, wherein the first grain length is between 15 nm and 50 nm, the second grain length is between 15 nm and 50 nm and the third grain length is between 1 nm-14 nm, wherein a ratio between the first grain length and the third grain length is between 3:1 to 50:1.

Example 2e: The device structure of example 2a, wherein the first grain length is between 15 nm and 50 nm, the second grain length is between 15 nm and 50 nm and the third grain length is between 15 nm-50 nm.

Example 2f: The device structure of example 2a, wherein the first electrode and the dielectric layer have defect density that are less than 1e20 atoms/cm³, and wherein the second electrode has a defect density at least 3 times greater than 1e20 atoms/cm³.

Example 2g: The device structure of example 2a, wherein the first electrode, the second electrode and the dielectric layer have defect densities that are less than 1e20 atoms/cm³.

Example 2h: The device structure of example 3, wherein the first electrode and the second electrode comprise thicknesses between 1 nm and 30 nm.

Example 2i: The device structure of example 2a, wherein the dielectric layer comprises a thickness between 1 nm and 30 nm.

Example 2j: The device structure of example 2a, wherein the first conductive hydrogen barrier layer and the second conductive hydrogen barrier layer comprise TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, ZO or METGLAS series of alloys.

Example 2k: The device structure of example 2a, wherein the second dielectric comprises an amorphous, greater than 90% film density hydrogen barrier material such as but not limited to $Al_xO_y$, $HfO_x$, $AlSiO_x$, $ZrO_x$, $TiO_x$, $AlSiO_x$, $HfSiO_x$, $TaSiO_x$, AlN, ZrN, or HfN.

Example 2l: The device structure of example 2a, wherein the second dielectric comprises a less than 90% film density material, such as but not limited to SiO2, SiOC, SiC or SiO2 doped with F, and wherein the memory device further comprises a dielectric spacer comprising a hydrogen and an oxygen barrier material between the second dielectric and the first electrode, wherein the dielectric spacer comprises $Al_xO_y$, $HfO_x$, $AlSiO_x$, $ZrO_x$, $TiO_x$, $AlSiO_x$, $HfSiO_x$, $TaSiO_x$, AlN, ZrN, or HfN.

Example 2m: The device structure of example 2a, wherein the electrode structure comprises a first lateral thickness, and the trench comprises a second lateral thickness, wherein the first lateral thickness is greater than the second lateral thickness.

Example 2n: A device structure comprising: a conductive interconnect within a first dielectric in a first level; and a second level above the first level, the second level comprising: an electrode structure on the conductive interconnect; an etch stop layer comprising an insulator, the etch stop layer laterally surrounding the electrode structure; a second dielectric on the etch stop layer; a trench within the second dielectric, the trench on the electrode structure; and a memory device within the trench, the memory device comprising: a conductive barrier layer along a base and a sidewall of the trench and in contact with the electrode structure; a first electrode adjacent to the conductive barrier layer, the first electrode comprising a first conductive non-linear polar material, wherein the first conductive nonlinear polar material comprises a first grain length; a dielectric layer comprising a perovskite material on the first electrode and substantially conformal to the first electrode, the perovskite material comprising a second grain length; and a second electrode in contact with the dielectric layer, the second electrode comprising a second conductive nonlinear polar material on the dielectric layer, the second conductive nonlinear polar material comprising a third grain length less than or equal to the first grain length or the second grain length; a via electrode on the second electrode, the via electrode comprising: a conductive hydrogen barrier electrode comprising a lateral portion in contact with the second electrode, and substantially vertical portions connected to the lateral portion; and a second conductive fill material adjacent to the conductive hydrogen barrier electrode.

Example 2o: The device structure of example 2n, wherein the conductive barrier layer comprises a conductive oxygen barrier material and the electrode structure further comprises a conductive hydrogen barrier material on a fill metal, wherein the conductive hydrogen barrier material is in contact with the conductive oxygen barrier material.

Example 2p: The device structure of example 2o, wherein the first grain length is between 15 nm and 50 nm, the second grain length is between 15 nm and 50 nm and the third grain length is between 1 nm-14 nm, wherein a ratio between the first grain length and the third grain length is between 3:1 to 50:1.

Example 2q: The device structure of example 2n further comprising an etch stop layer laterally surrounding the electrode structure, wherein the etch stop layer comprises a dielectric material.

Example 2r: The device structure of example 2o, wherein the conductive hydrogen barrier material comprises TiAlN, with greater than 30 atomic percent AlN, TaN with greater than 30 atomic percent N$_2$, TiSiN with greater than 20 atomic percent SiN, TaC, TiC, WC, WN, carbonitrides of Ta, Ti or W, TiO, Ti$_2$O, WO$_3$, SnO$_2$, ITO, IGZO, ZO or METGLAS series of alloys and wherein the conductive hydrogen barrier electrode comprises TiAlN, with greater than 30 atomic percent AlN, TaN with greater than 30 atomic percent N$_2$, TiSiN with greater than 20 atomic percent SiN, TaC, TiC, WC, WN, carbonitrides of Ta, Ti or W, TiO, Ti$_2$O, WO$_3$, SnO$_2$, ITO, IGZO, ZO or METGLAS series of alloys.

Example 2s: A system comprising: a processor comprising a transistor; a communication interface communicatively coupled to the processor; and a memory coupled to the transistor, wherein the memory comprises: bit-cells, wherein one of the bit-cells comprises: a conductive interconnect within a first dielectric in a first level; and a second level above the first level, the second level comprising: an electrode structure on the conductive interconnect, the electrode structure comprising: a first conductive fill material; a first conductive hydrogen barrier electrode on the first conductive fill material; and an etch stop layer comprising an insulator, the etch stop layer laterally surrounding the electrode structure; a second dielectric on the etch stop layer; a trench within the second dielectric, the trench on the electrode structure; a memory device within the trench, the memory device comprising: a first electrode along a base and a sidewall of the trench, the first electrode comprising a first conductive nonlinear polar material, the first conductive nonlinear polar material comprising a first grain length and wherein the first electrode is in contact with the electrode structure; a dielectric layer comprising a perovskite material on the first electrode and substantially conformal to the first electrode, the perovskite material comprising a second grain length; and a second electrode in contact with the dielectric layer, the second electrode comprising a second conductive nonlinear polar material on the dielectric layer, the second conductive nonlinear polar material comprising a third grain length less than or equal to the first grain length or the second grain length; a via electrode on the second electrode, the via electrode comprising: a second conductive hydrogen barrier electrode comprising a lateral portion in contact with the second electrode and substantially vertical portions connected to the lateral portion; and a second conductive fill material adjacent to the second conductive hydrogen barrier electrode.

Example 2t: The system of example 2s, wherein the first grain length is between 15 nm and 50 nm, the second grain length is between 15 nm and 50 nm and the third grain length is between 1 nm-14 nm, wherein a ratio between the first grain length and the third grain length is between 3:1 to 50:1.

Example 2u: The system of example 2s, wherein the first conductive hydrogen barrier electrode comprises TiAlN, with greater than 30 atomic percent AlN, TaN with greater than 30 atomic percent N$_2$, TiSiN with greater than 20 atomic percent SiN, TaC, TiC, WC, WN, carbonitrides of Ta, Ti or W, TiO, Ti$_2$O, WO$_3$, SnO$_2$, ITO, IGZO, ZO or METGLAS series of alloys and the second conductive hydrogen barrier electrode comprises TiAlN, with greater than 30 atomic percent AlN, TaN with greater than 30 atomic percent N$_2$, TiSiN with greater than 20 atomic percent SiN, TaC, TiC, WC, WN, carbonitrides of Ta, Ti or W, TiO, Ti$_2$O, WO$_3$, SnO$_2$, ITO, IGZO, ZO or METGLAS series of alloys.

Example 2v: The ferroelectric device of example 2s, further comprising conductive oxygen diffusion barrier layer between the first electrode and the electrode structure, wherein the conductive oxygen diffusion barrier layer comprises one of: metal boride; metal carbide; metal nitride; intermetallic; or amorphous metal oxide.

Examples 3a: A method of fabricating a material layer stack for a memory device, the method comprising: depositing a first electrode layer above a substrate, wherein the first electrode layer comprises a first conductive nonlinear polar material, the first conductive nonlinear polar material comprising a first grain length; depositing a dielectric layer comprising a perovskite material on the first electrode layer the perovskite material comprising a second grain length; depositing a second electrode layer on the dielectric layer, wherein the second electrode layer comprises a second conductive nonlinear polar material, the second conductive nonlinear polar material comprising a third grain length that is substantially equal to the first grain length; and annealing the material layer stack for a duration of less than 60 seconds at temperatures below 1300 degree Celsius, wherein the annealing modifies the first conductive nonlinear polar material to have a first new grain length which is a factor of 3 larger than the first grain length, wherein the annealing modifies the perovskite material to have a second new grain length which is a factor of 3 larger than the second grain length, and wherein the annealing modifies the second conductive nonlinear polar material to have a third new grain length which is a factor of 3 larger than the third grain length.

Example 3b: The method of example 1, wherein depositing the first electrode layer comprising the first conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3 and the second conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3.

Example 3c: The method of example 3b, wherein depositing the perovskite material comprises, depositing one of: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100; or a paraelectric material comprising SrTiO3, Ba(x)Sr (y)TiO3 (where x is −0.05, and y is 0.95), HfZrO2, Hf—Si—O, La-substituted PbTiO3, or a PMN-PT based relaxor ferroelectrics.

Example 3d: The method of example 3a, wherein depositing the first electrode layer, the second electrode layer and the dielectric layer comprises utilizing one or more of an atomic layer deposition process performed at a first process temperature between 160-400 degrees Celsius, a physical vapor deposition process performed at a second process temperature between 23 degrees C.-400 degrees C., or a chemical vapor deposition process performed at a third process temperature between 160 degrees C.-400 degrees C.

Example 3e: The method of example 3d, wherein annealing the material layer stack comprises utilizing a rapid thermal annealing (RTA) process, where the RTA process comprises heating the material layer stack to a first temperature of less than 700 degrees C., for a time duration between 1 s-60 s, at a first pressure between vacuum and 760 Torr, wherein the RTA process further comprises flowing $O_2$, $N_2$ or Argon gas while operating at the first pressure between 1 Torr and 760 Torr.

Example 3f: The method of example 3d, wherein annealing the material layer stack comprises utilizing a flash anneal process, wherein the flash anneal process comprises heating the material layer stack to a second temperature between 500-1300 degrees C., for a second time duration of less than 1 millisecond, and at a second pressure between vacuum and 760 Torr, wherein the flash anneal process further comprises flowing $O_2$, $N_2$ or Argon gas while operating at the second pressure between 1 Torr and 760 Torr.

Example 3g: The method of example 3d, wherein annealing the material layer stack comprises utilizing a laser anneal process, wherein the laser anneal process comprises heating the material layer stack to a third temperature of up to 1300 degrees C., for a third time duration of less than 100 microseconds, and at a third pressure between vacuum and 760 Torr, wherein the laser anneal process further comprises flowing $O_2$, $N_2$ or Argon gas while operating at the third pressure between 1 Torr and 760 Torr.

Example 3h: The method of example 3a, wherein annealing to increase the first grain length, the second grain length and the third grain length comprises coalescing two or more grains to form a grain that has an average grain length between 15 nm and 50 nm.

Example 3i: The method of example 3a, wherein annealing reduces point defects in the first electrode layer, the second electrode layer and the dielectric layer from greater than 1e22 atoms/cm$^3$ to less than 1e20 atoms/cm$^3$.

Example 3j: The method of example 4 further comprises depositing the first electrode layer to a thickness between 1 nm and 30 nm, the second electrode layer to a thickness between 1 nm and 30 nm and the dielectric layer to a thickness between 1 nm and 30 nm.

Example 3k: A method of fabricating a device structure, the method comprising: fabricating a transistor, the method comprising: forming a fin structure in a substrate by patterning the substrate; forming an isolation adjacent to the fin structure; forming an epitaxial source structure, an epitaxial drain structure and a channel in the fin structure; performing an activation anneal; forming a gate on the channel; and forming a first contact on the epitaxial drain structure and a second contact on the gate; forming a conductive interconnect structure on the first contact or on the second contact; forming an electrode structure in a memory region by a first process comprising: etching a first opening in an etch stop layer; depositing a first conductive material on the conductive interconnect structure; and depositing a first conductive hydrogen barrier layer in the first conductive material; and forming a planar capacitor on the electrode structure, the method comprising: forming a material layer stack, the forming comprising: depositing a first electrode layer, wherein the first electrode layer comprises a first conductive nonlinear polar material, the first conductive nonlinear polar material comprising a first grain length; depositing a dielectric layer comprising a perovskite material on the first electrode layer the perovskite material comprising a second grain length; and depositing a second electrode layer on the dielectric layer, wherein the second electrode layer comprises a second conductive nonlinear polar material, the second conductive nonlinear polar material comprising a third grain length that is substantially equal to the first grain length; annealing the material layer stack for a duration of less than 60 seconds at temperatures below 1300 degree Celsius, wherein the annealing modifies the first conductive nonlinear polar material to have a first new grain length which is a factor of 3 larger than the first grain length, wherein the annealing modifies the perovskite material to have a second new grain length which is a factor of 3 larger than the second grain length, and wherein the annealing modifies the second conductive nonlinear polar material to have a third new grain length which is a factor of 3 larger than the third grain length; and etching the material layer stack to form a capacitor; and forming a via electrode on the capacitor by a second process comprising: depositing a second conductive hydrogen barrier layer on the second electrode layer; and depositing a second conductive material on the second conductive hydrogen barrier layer.

Example 3l: The method of example 3k further comprises: depositing an encapsulation layer on the planar capacitor prior to forming the via electrode, depositing a dielectric on the encapsulation layer; and etching the dielectric and the encapsulation layer to form an opening, and wherein depositing the second conductive hydrogen barrier layer further comprises depositing in the opening on a portion of a top surface of the capacitor.

Example 3m: The method of example 3k, wherein the activation anneal is performed at a temperature of at least 600 degrees prior to formation of the gate.

Example 3n: The method of example 3k, wherein forming the gate further comprises depositing a gate dielectric layer on the fin structure; and depositing a gate electrode on the gate dielectric layer, wherein annealing the material layer stack does not cause metallurgical reaction between gate dielectric layer and the gate electrode.

Example 3o: The method of example 3k, wherein depositing the first electrode layer comprising the first conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3 and the second conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3, and wherein depositing the perovskite material comprises, depositing one of: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100; or a paraelectric material comprising SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 3p: The method of example 3k, wherein depositing the first electrode layer, the second electrode layer and the dielectric layer comprises utilizing one or more of an atomic layer deposition process performed at a first process temperature between 160-400 degrees Celsius, a physical vapor deposition process performed at a second process temperature between 23 degrees C.-400 degrees C., or a chemical vapor deposition process performed at a third process temperature between 160 degrees C.-400 degrees C., and wherein annealing the material layer stack comprises one of: utilizing a rapid thermal annealing (RTA) process, where the RTA process comprises heating the material layer stack to a first temperature of less than 700 degrees C., for a first time duration between 1 s-60 s, at a first pressure between vacuum and 760 Torr, wherein the RTA process further comprises flowing $O_2$, $N_2$ or Argon gas while operating at the first pressure between 1 Torr and 760 Torr; or utilizing a flash anneal process, wherein the flash anneal process comprises heating the material layer stack to a second temperature between 500-1300 degrees C., for a second time duration of less than 1 millisecond, and at a second pressure between vacuum and 760 Torr, wherein the flash anneal process further comprises flowing $O_2$, $N_2$ or Argon gas while operating at the second pressure between 1 Torr and 760 Torr; comprises utilizing a laser anneal process, wherein the laser anneal process comprises heating the material layer stack to a third temperature of up to 1300 degrees C., for a third time duration of less than 100 microseconds, and at third pressure between vacuum and 760 Torr, wherein the laser anneal process further comprises flowing $O_2$, $N_2$ or Argon gas while operating at the third pressure between 1 Torr and 760 Torr.

Example 3q: The method of example 3k, wherein annealing to increase the first grain length, the second grain length and the third grain length comprises coalescing two or more grains to form a grain that has an average grain length between 15 nm and 50 nm.

Example 3r: A method of fabricating a device structure, the method comprising: fabricating a transistor, the method comprising: forming a fin structure in a substrate by patterning the substrate; forming an isolation adjacent to the fin structure; forming an epitaxial source structure, an epitaxial drain structure and a channel in the fin structure; performing an anneal at a temperature of at least 600 degrees; forming a gate on the channel; and forming a first contact on the epitaxial drain structure and a second contact on the gate; forming a conductive interconnect structure on the first contact or on the second contact; forming an electrode structure in a memory region by a first process comprising: etching a first opening in an etch stop layer; depositing a first conductive material on the conductive interconnect structure; and depositing a first conductive hydrogen barrier layer in the first conductive material; and forming a planar capacitor on the electrode structure, the method comprising: forming a material layer stack, the forming comprising: depositing a first electrode layer above a substrate, wherein the first electrode layer comprises a first conductive nonlinear polar material, the first conductive nonlinear polar material comprising a first grain length; depositing a dielectric layer comprising a perovskite material on the first electrode layer the perovskite material comprising a second grain length; annealing the material layer stack for a duration of less than 60 seconds at temperatures below 1300 degree Celsius, wherein the annealing modifies the first conductive nonlinear polar material to have a first new grain length which is a factor of 3 larger than the first grain length, wherein the annealing modifies the perovskite material to have a second new grain length which is a factor of 3 larger than the second grain length; depositing a second electrode layer on the dielectric layer, wherein the second electrode layer comprises a second conductive nonlinear polar material, the second conductive nonlinear polar material comprising a third grain length that is less than the first new grain length; patterning and etching the material layer stack to form a capacitor; and forming a via electrode on the capacitor by a second process comprising: depositing a second conductive hydrogen barrier layer on the second electrode layer; and depositing a second conductive material on the second conductive hydrogen barrier layer.

Example 3s: The method of example 3r, wherein depositing the first electrode layer comprising the first conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3 and the second conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3, and wherein depositing the perovskite material comprises, depositing one of: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100, or a paraelectric material that comprises SrTiO3, Ba(x)Sr (y)TiO3 (where x is −0.05, and y is 0.95), HfZrO2, Hf—Si—O, La-substituted PbTiO3, or a PMN-PT based relaxor ferroelectrics.

Example 3t: The method of example 3r, wherein depositing the first electrode layer, the second electrode layer and the dielectric layer comprises utilizing one or more of an atomic layer deposition process performed at a first process temperature between 160-400 degrees Celsius, a physical vapor deposition process performed at a second process temperature between 23 degrees C.-400 degrees C., or a chemical vapor deposition process performed at a third process temperature between 160 degrees C.-400 degrees C., and wherein annealing the material layer stack comprises one of: utilizing a rapid thermal annealing (RTA) process, where the RTA process comprises heating the material layer stack to a first temperature of less than 700 degrees C., for a first time duration between 1 s-60 s, at a first pressure between vacuum and 760 Torr, wherein the RTA process further comprises flowing $O_2$, $N_2$ or Argon gas while operating at the first pressure between 1 Torr and 760 Torr; or utilizing a flash anneal process, wherein the flash anneal process comprises heating the material layer stack to a second temperature between 500-1300 degrees C., for a second time duration of less than 1 millisecond, and at a second pressure between vacuum and 760 Torr, wherein the flash anneal process further comprises flowing $O_2$, $N_2$ or Argon gas while operating at the second pressure between 1 Torr and 760 Torr; comprises utilizing a laser anneal process, wherein the laser anneal process comprises heating the material layer stack to a third temperature of up to 1300 degrees C., for a third time duration of less than 100 microseconds, and at third pressure between vacuum and 760 Torr, wherein the laser anneal process further comprises flowing $O_2$, $N_2$ or Argon gas while operating at the third pressure between 1 Torr and 760 Torr.

Example 4a: A method of fabricating a device structure, the method comprising: forming an electrode structure in a memory region by a first process comprising: etching a first opening in an etch stop layer and exposing a conductive interconnect below the etch stop layer; depositing a first conductive material on the conductive interconnect; and depositing a first conductive hydrogen barrier layer in the first conductive material; and depositing a dielectric on the etch stop layer; forming a trench capacitor by a second process comprising: forming a trench in the dielectric, the trench exposing at least a portion of the electrode structure; depositing a first electrode layer on a base and on sidewalls of the trench, wherein the first electrode layer comprises a first conductive nonlinear polar material, the first conductive nonlinear polar material comprising a first grain length; depositing a dielectric layer comprising a perovskite material on the first electrode layer, the perovskite material comprising a second grain length; depositing a second electrode layer on the dielectric layer, wherein the second electrode layer comprises a second conductive nonlinear polar material, the second conductive nonlinear polar material comprising a third grain length that is substantially equal to the first grain length; and performing a post deposition anneal (PDA) for a duration of less than 60 seconds at temperatures below 1300 degree Celsius, wherein the PDA modifies the first conductive nonlinear polar material to have a first new grain length which is a factor of 3 larger than the first grain length, wherein the PDA modifies the perovskite material to have a second new grain length which is a factor of 3 larger than the second grain length, and wherein the PDA modifies the second conductive nonlinear polar material to have a third new grain length which is a factor of 3 larger than the third grain length; and forming a via electrode on the trench capacitor by a third process comprising: depositing a second conductive hydrogen barrier layer on the second electrode layer; and depositing a second conductive material on the second conductive hydrogen barrier layer.

Example 4b: The method of example 4a, wherein depositing the first electrode layer comprising the first conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3 and the second conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3.

Example 4c: The method of example 4b, wherein depositing the perovskite material comprises, depositing one of: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100; or a paraelectric material comprising SrTiO3, Ba(x)Sr (y)TiO3 (where x is −0.05, and y is 0.95), HfZrO2, Hf—Si—O, La-substituted PbTiO3, or a PMN-PT based relaxor ferroelectrics.

Example 4d: The method of example 4a, wherein depositing the first electrode layer, the second electrode layer and the dielectric layer comprises utilizing one or more of an atomic layer deposition process performed at a first process temperature between 160-400 degrees Celsius, a physical vapor deposition process performed at a second process temperature between 23 degrees C.-400 degrees C., or a chemical vapor deposition process performed at a third process temperature between 160 degrees C.-400 degrees C.

Example 4e: The method of example 4d, wherein performing the PDA comprises utilizing a rapid thermal annealing (RTA) process, where the RTA process comprises heating to a first temperature of less than 700 degrees C., for a time duration between 1 s-60 s, at a first pressure between vacuum and 760 Torr, wherein the RTA process further comprises flowing $O_2$, $N_2$ or Argon gas while operating at the first pressure between 1 Torr and 760 Torr.

Example 4f: The method of example 4d, wherein performing the PDA comprises utilizing a flash anneal process, wherein the flash anneal process comprises heating to a second temperature between 500-1300 degrees C., for a second time duration of less than 1 millisecond, and at a second pressure between vacuum and 760 Torr, wherein the flash anneal process further comprises flowing $O_2$, $N_2$ or Argon gas while operating at the second pressure between 1 Torr and 760 Torr.

Example 4g: The method of example 4d, wherein performing the PDA comprises utilizing a laser anneal process, wherein the laser anneal process comprises heating to a third temperature of up to 1300 degrees C., for a third time duration of less than 100 microseconds, and at a third pressure between vacuum and 760 Torr, wherein the laser anneal process further comprises flowing $O_2$, $N_2$ or Argon gas while operating at the third pressure between 1 Torr and 760 Torr.

Example 4h: The method of example 4a, wherein annealing forms the first new grain length between 15 nm and 50 nm, the second new grain length between 15 nm and 50 nm and the third new grain length between 15 nm and 50 nm.

Example 4i: The method of example 4a, wherein annealing reduces point defects in the first electrode layer, the second electrode layer and the dielectric layer from greater than $1e22$ atoms/cm$^3$ to less than $1e20$ atoms/cm$^3$.

Example 4j: The method of example 4d further comprises depositing the first electrode layer to a thickness between 1 nm and 30 nm, the second electrode layer to a thickness between 1 nm and 30 nm and the dielectric layer to a thickness between 1 nm and 30 nm.

Example 4k: The method of example 4a, wherein depositing the dielectric comprises forming an amorphous, greater than 90% film density hydrogen barrier material on the electrode structure.

Example 4l: The method of example 4a, wherein depositing the dielectric comprises forming a less than 90% film density insulator material on the electrode structure, and wherein the method further comprises forming a spacer comprising a nonconductive hydrogen barrier material on sidewalls of the trench prior to depositing the first electrode layer.

Example 4m: The method of example 4a, wherein prior to forming the via electrode, a planarization process is performed to remove the first electrode layer deposited on a top surface of the dielectric and form a substantially U-shaped first electrode and dielectric layer, and a columnar second electrode.

Example 4n: A method of fabricating a device structure, the method comprising: fabricating a transistor, the method comprising: forming a fin structure in a substrate by patterning the substrate; forming an isolation adjacent to the fin structure; forming epitaxial source structure, epitaxial drain structure and a channel in the fin structure; performing an activation anneal at a temperature of at least 600 degrees; forming a gate on the channel; and forming a first contact on the epitaxial drain structure and a second contact on the gate; forming a conductive interconnect on the first contact or on the second contact; forming an electrode structure by a first process comprising: etching a first opening in an etch stop layer and exposing at least a portion of the conductive interconnect; depositing a first conductive hydrogen barrier layer in the first opening; depositing a first conductive material on the first conductive hydrogen barrier layer; and depositing a dielectric on the etch stop layer; forming a trench capacitor by a second process comprising: forming a trench in the dielectric, the trench exposing at least a portion of the electrode structure; depositing a first electrode layer on a base and on sidewalls of the trench, wherein the first electrode layer comprises a first conductive nonlinear polar material, the first conductive nonlinear polar material comprising a first grain length; depositing a dielectric layer comprising a perovskite material on the first electrode layer, the perovskite material comprising a second grain length; depositing a second electrode layer on the dielectric layer, wherein the second electrode layer comprises a second conductive nonlinear polar material, the second conductive nonlinear polar material comprising a third grain length that is substantially equal to the first grain length; and performing a post deposition anneal (PDA) for a duration of less than 60 seconds at temperatures below 1300 degree Celsius, wherein the PDA modifies the first conductive nonlinear polar material to have a first new grain length which is a factor of 3 larger than the first grain length, wherein the PDA modifies the perovskite material to have a second new grain length which is a factor of 3 larger than the second grain length, and wherein the PDA modifies the second conductive nonlinear polar material to have a third new grain length which is a factor of 3 larger than the third grain length; and forming a via electrode on the trench capacitor by a third process comprising: depositing a second conductive hydrogen barrier layer on the second electrode layer; and depositing a second conductive material on the second conductive hydrogen barrier layer.

Example 4o: The method of example 4n, wherein the activation anneal is performed at a temperature of at least 600 degrees prior to formation of the gate.

Example 4p: The method of example 4n, wherein forming the gate further comprises: depositing a gate dielectric layer on the fin structure; and depositing a gate electrode on the gate dielectric layer, wherein performing the PDA does not cause metallurgical reaction between gate dielectric layer and the gate electrode.

Example 4q: The method of example 4n, wherein depositing the first electrode layer comprising the first conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3 and the second conductive nonlinear polar material comprises depositing one of La—Sr—CoO$_3$, SrRuO$_3$, La—Sr-MnO$_3$, YBa$_2$Cu$_3$O$_7$, Bi$_2$Sr$_2$CaCu$_2$O$_8$, LaNiO$_3$, or DyScO3, and wherein depositing the perovskite material comprises, depositing one of: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100, or a paraelectric material that comprises SrTiO3, Ba(x)Sr(y)TiO3 (where x is −0.05, and y is 0.95), HfZrO2, Hf—Si—O, La-substituted PbTiO3, or a PMN-PT based relaxor ferroelectrics.

Example 4r: The method of example 4n, wherein depositing the first electrode layer, the second electrode layer and the dielectric layer comprises utilizing one or more of an atomic layer deposition process performed at a first process temperature between 160-400 degrees Celsius, a physical vapor deposition process performed at a second process temperature between 23 degrees C.-400 degrees C., or a chemical vapor deposition process performed at a third process temperature between 160 degrees C.-400 degrees C., and wherein performing the PDA comprises one of: utilizing a rapid thermal annealing (RTA) process, where the RTA process comprises heating to a first temperature of less than 700 degrees C., for a first time duration between 1 s-60 s, at a first pressure between vacuum and 760 Torr, wherein the RTA process further comprises flowing $O_2$, $N_2$ or Argon gas while operating at the first pressure between 1 Torr and 760 Torr; or utilizing a flash anneal process, wherein the flash anneal process comprises heating to a second temperature between 500-1300 degrees C., for a second time duration of less than 1 millisecond, and at a second pressure between vacuum and 760 Torr, wherein the flash anneal process further comprises flowing $O_2$, $N_2$ or Argon gas while operating at the second pressure between 1 Torr and 760 Torr; comprises utilizing a laser anneal process, wherein the laser anneal process comprises heating to a third temperature of up to 1300 degrees C., for a third time duration of less than 100 microseconds, and at a third pressure between vacuum and 760 Torr, wherein the laser anneal process further comprises flowing $O_2$, $N_2$ or Argon gas while operating at the third pressure between 1 Torr and 760 Torr.

Example 4s: A method of fabricating a device structure, the method comprising: fabricating a transistor, the method comprising: forming a fin structure in a substrate by patterning the substrate; forming an isolation adjacent to the fin structure; forming an epitaxial source structure, an epitaxial drain structure and a channel in the fin structure; performing an activation anneal at a temperature of at least 600 degrees; forming a gate on the channel; and forming a first contact on the epitaxial drain structure and a second contact on the gate; forming a conductive interconnect on the first contact or on the second contact; forming an electrode structure by a first process comprising: etching a first opening in an etch stop layer and exposing at least a portion of the conductive interconnect; depositing a first conductive hydrogen barrier layer in the first opening; depositing a first conductive material on the first conductive hydrogen barrier layer; and depositing a dielectric on the etch stop layer; forming a trench capacitor by a second process comprising: forming a trench in the dielectric, the trench exposing at least a portion of the electrode structure; depositing a first electrode layer on a base and on sidewalls of the trench, wherein the first electrode layer comprises a first conductive nonlinear polar material, the first conductive nonlinear polar material comprising a first grain length; depositing a dielectric layer comprising a perovskite material on the first electrode layer, the perovskite material comprising a second grain length; performing a post deposition anneal (PDA) for a duration of less than 60 seconds at temperatures below 1300 degree Celsius, wherein the PDA modifies the first conductive nonlinear polar material to have a first new grain length which is a factor of 3 larger than the first grain length, wherein the PDA modifies the perovskite material to have a second new grain length which is a factor of 3 larger than the second grain length; depositing a second electrode layer on the dielectric layer, wherein the second electrode layer comprises a second conductive nonlinear polar material, the second conductive nonlinear polar material comprising a third grain length that is less the first grain length; and forming a via electrode on the trench capacitor by a third process comprising: depositing a second conductive hydrogen barrier layer on the second electrode layer; and depositing a second conductive material on the second conductive hydrogen barrier layer.

Example 4t: The method of example 4s, wherein performing the PDA forms the first new grain length between 15 nm and 50 nm, the second new grain length between 15 nm and 50 nm, and wherein the third grain length is less than 15 nm.

What is claimed is:
1. A device structure comprising:
a conductive interconnect within a first dielectric in a first level; and
a second level above the first level, the second level comprising:
an electrode structure on the conductive interconnect, the electrode structure comprising:
a first conductive fill material;
a first conductive hydrogen barrier layer on the first conductive fill material; and
an etch stop layer comprising an insulator, the etch stop layer laterally surrounding the electrode structure;
a second dielectric on the etch stop layer;
a trench within the second dielectric, the trench on the electrode structure;
a memory device within the trench, the memory device comprising:
a first electrode along a base and a sidewall of the trench, the first electrode comprising a first conductive nonlinear polar material, the first conductive nonlinear polar material comprising a first grain length and wherein the first electrode is in contact with the electrode structure;
a dielectric layer comprising a perovskite material on the first electrode and substantially conformal to the first electrode, the perovskite material comprising a second grain length; and
a second electrode in contact with the dielectric layer, the second electrode comprising a second conductive nonlinear polar material on the dielectric layer, the second conductive nonlinear polar material compris- ing a third grain length, the third grain length less than or equal to the first grain length or the second grain length;

a via electrode on the second electrode, the via electrode comprising:
  a second conductive hydrogen barrier layer comprising a lateral portion in contact with the second electrode and substantially vertical portions connected to the lateral portion; and
  a second conductive fill material adjacent to the second conductive hydrogen barrier layer.

2. The device structure of claim 1, wherein the first conductive nonlinear polar material comprises one of La—Sr—CoO$_3$, SrRuO$_3$, La—Sr—MnO$_3$, YBa$_2$Cu$_3$O$_7$, Bi$_2$Sr$_2$CaCu$_2$O$_8$, LaNiO$_3$, or DyScO3 and the second conductive nonlinear polar material comprises one of La—Sr—CoO$_3$, SrRuO$_3$, La—Sr—MnO$_3$, YBa$_2$Cu$_3$O$_7$, Bi$_2$Sr$_2$CaCu$_2$O$_8$, LaNiO$_3$, or DyScO3.

3. The device structure of claim 1, wherein the perovskite material comprises:
  bismuth ferrite (BFO), BFO with a first doping material, wherein the first doping material is one of lanthanum or elements from lanthanide series of periodic table;
  lead zirconium titanate (PZT) or PZT with a second doping material, wherein the second doping material is one of La or Nb;
  a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST);
  a perovskite material which includes one of: BaTiO3, PbTiO3, KNbO3, or NaTaO3; a hexagonal ferroelectric which includes one of: YMnO3 or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
  hafnium (Hf), zirconium (Zr), aluminum (Al), silicon (Si), their oxides or their alloyed oxides; Hafnium oxides as Hf1-x Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where 'y' includes one of: Al, Ca, Ce, Dy, Er, Gd, Ge, La, Sc, Si, Sr, Sn, or Y, wherein 'y' is a fraction; or
  niobate type compounds LiNbO3, LiTaO3, lithium iron tantalum oxy fluoride, barium strontium niobate, sodium barium niobate, or potassium strontium niobate; or
  an improper ferroelectric material which includes one of: [PTO/STO]n or [LAO/STO]n, where 'n' is between 1 to 100; or
  a paraelectric material comprising SrTiO3, Ba(x)Sr(y)TiO3, HfZrO2, Hf—Si—O, La-substituted PbTiO3, or a PMN-PT based relaxor ferroelectrics.

4. The device structure of claim 1, wherein the first grain length is between 15 nm and 50 nm, wherein the second grain length is between 15 nm and 50 nm, and wherein the third grain length is between 1 nm-14 nm, and wherein a ratio between the first grain length and the third grain length is between 3:1 to 50:1.

5. The device structure of claim 1, wherein the first grain length is between 15 nm and 50 nm, wherein the second grain length is between 15 nm and 50 nm, and wherein the third grain length is between 15 nm-50 nm.

6. The device structure of claim 1, wherein the first electrode and the dielectric layer have defect density that are less than 1e20 atoms/cm$^3$, and wherein the second electrode has a defect density at least 3 times greater than 1e20 atoms/cm$^3$.

7. The device structure of claim 1, wherein the first electrode, the second electrode, and the dielectric layer have defect densities that are less than 1e20 atoms/cm$^3$.

8. The device structure of claim 3, wherein the first electrode and the second electrode comprise thicknesses between 1 nm and 30 nm.

9. The device structure of claim 1, wherein the dielectric layer comprises a thickness between 1 nm and 30 nm.

10. The device structure of claim 1, wherein the first conductive hydrogen barrier layer and the second conductive hydrogen barrier layer comprise: TiAlN, with greater than 30 atomic percent AlN, TaN with greater than 30 atomic percent N$_2$, TiSiN with greater than 20 atomic percent SiN, TaC, TiC, WC, WN, carbonitrides of Ta, Ti, or W, and TiO, Ti$_2$O, WO$_3$, SnO$_2$, ITO, IGZO, ZO, or METGLAS series of alloys.

11. The device structure of claim 1, wherein the second dielectric comprises an amorphous, greater than 90% film density hydrogen barrier material such as but not limited to Al$_x$O$_y$, HfO$_x$, AlSiO$_x$, HfSiO$_X$, TaSiO$_X$, AlN, ZrN, or HfN.

12. The device structure of claim 1, wherein the second dielectric comprises a less than 90% film density material, such as but not limited to SiO$_2$, SiOC, SiC or SiO$_2$ doped with F, wherein the memory device further comprises a dielectric spacer comprising a hydrogen and an oxygen barrier material between the second dielectric and the first electrode, and wherein the dielectric spacer comprises Al$_x$O$_y$, HfO$_x$, AlSiO$_x$, ZrO$_x$, TiO$_x$, AlSiO$_X$, HfSiO$_X$, TaSiO$_X$, AlN, ZrN, or HfN.

13. The device structure of claim 1, wherein the electrode structure comprises a first lateral thickness, and the trench comprises a second lateral thickness, and wherein the first lateral thickness is greater than the second lateral thickness.

14. A device structure comprising:
  a conductive interconnect within a first dielectric in a first level; and
  a second level above the first level, the second level comprising:
    an electrode structure on the conductive interconnect;
    an etch stop layer comprising an insulator, the etch stop layer laterally surrounding the electrode structure;
    a second dielectric on the etch stop layer;
    a trench within the second dielectric, the trench on the electrode structure; and
    a memory device within the trench, the memory device comprising:
      a conductive barrier layer along a base and a sidewall of the trench and in contact with the electrode structure;
      a first electrode adjacent to the conductive barrier layer, the first electrode comprising a first conductive nonlinear polar material, wherein the first conductive nonlinear polar material comprises a first grain length;
      a dielectric layer comprising a perovskite material on the first electrode and substantially conformal to the first electrode, the perovskite material comprising a second grain length; and a second electrode in contact with the dielectric layer, the second electrode comprising a second conductive nonlinear polar material on the dielectric layer, the second conductive nonlinear polar material comprising a third grain length less than or equal to the first grain length or the second grain length;

a via electrode on the second electrode, the via electrode comprising:

a conductive hydrogen barrier electrode comprising a lateral portion in contact with the second electrode, and substantially vertical portions connected to the lateral portion; and a second conductive fill material adjacent to the conductive hydrogen barrier electrode.

15. The device structure of claim 14, wherein the conductive barrier layer comprises a conductive oxygen barrier material and the electrode structure further comprises a conductive hydrogen barrier material on a fill metal, and wherein the conductive hydrogen barrier material is in contact with the conductive oxygen barrier material.

16. The device structure of claim 15, wherein the first grain length is between 15 nm and 50 nm, wherein the second grain length is between 15 nm and 50 nm, wherein the third grain length is between 1 nm-14 nm, and wherein a ratio between the first grain length and the third grain length is between 3:1 to 50:1.

17. The device structure of claim 14 further comprising an etch stop layer laterally surrounding the electrode structure, wherein the etch stop layer comprises a dielectric material.

18. The device structure of claim 15, wherein the conductive hydrogen barrier material comprises: TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti, or W, or TiO, $Ti_2O$, $WO_3$, $SnO_2$, ITO, IGZO, ZO, or METGLAS series of alloys, and wherein the conductive hydrogen barrier electrode comprises: TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti, or W, or TiO, $Ti_2O$, $WO_3$, $SnO_2$, ITO, IGZO, ZO, or METGLAS series of alloys.

19. A system comprising:

a processor comprising a transistor;

a communication interface communicatively coupled to the processor; and a memory coupled to the transistor, wherein the memory comprises: bit-cells, wherein one of the bit-cells comprises:

a conductive interconnect within a first dielectric in a first level; and a second level above the first level, the second level comprising:

an electrode structure on the conductive interconnect, the electrode structure comprising:

a first conductive fill material;

a first conductive hydrogen barrier electrode on the first conductive fill material; and an etch stop layer comprising an insulator, the etch stop layer laterally surrounding the electrode structure;

a second dielectric on the etch stop layer;

a trench within the second dielectric, the trench on the electrode structure;

a memory device within the trench, the memory device comprising:

a first electrode along a base and a sidewall of the trench, the first electrode comprising a first conductive nonlinear polar material, the first conductive nonlinear polar material comprising a first grain length and wherein the first electrode is in contact with the electrode structure;

a dielectric layer comprising a perovskite material on the first electrode and substantially conformal to the first electrode, the perovskite material comprising a second grain length; and a second electrode in contact with the dielectric layer, the second electrode comprising a second conductive nonlinear polar material on the dielectric layer, the second conductive nonlinear polar material comprising a third grain length less than or equal to the first grain length or the second grain length;

a via electrode on the second electrode, the via electrode comprising:

a second conductive hydrogen barrier electrode comprising a lateral portion in contact with the second electrode and substantially vertical portions connected to the lateral portion; and a second conductive fill material adjacent to the second conductive hydrogen barrier electrode.

20. The system of claim 19, wherein the first grain length is between 15 nm and 50 nm, wherein the second grain length is between 15 nm and 50 nm, wherein the third grain length is between 1 nm-14 nm, wherein a ratio between the first grain length, and wherein the third grain length is between 3:1 to 50:1.

21. The system of claim 19, wherein the first conductive hydrogen barrier electrode comprises: TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti, or W, or TiO, $Ti_2O$, $WO_3$, $SnO_2$, ITO, IGZO, ZO, or METGLAS series of alloys, wherein the second conductive hydrogen barrier electrode comprises: TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti, or W, or TiO, $Ti_2O$, $WO_3$, $SnO_2$, ITO, IGZO, ZO, or METGLAS series of alloys.

* * * * *